(12) United States Patent
Cardwell et al.

(10) Patent No.: US 12,091,771 B2
(45) Date of Patent: Sep. 17, 2024

(54) LARGE AREA GROUP III NITRIDE CRYSTALS AND SUBSTRATES, METHODS OF MAKING, AND METHODS OF USE

(71) Applicant: SLT Technologies, Inc, Los Angeles, CA (US)

(72) Inventors: Drew W. Cardwell, Camas, WA (US); Mark P. D'Evelyn, Vancouver, WA (US)

(73) Assignee: SLT Technologies, Inc., Los Angeles, CA (US)

( * ) Notice: Subject to any disclaimer, the term of this patent is extended or adjusted under 35 U.S.C. 154(b) by 287 days.

(21) Appl. No.: 17/173,170

(22) Filed: Feb. 10, 2021

(65) Prior Publication Data

US 2021/0246571 A1    Aug. 12, 2021

Related U.S. Application Data

(63) Continuation-in-part of application No. 16/882,219, filed on May 22, 2020.

(Continued)

(51) Int. Cl.
  *C30B 29/40*    (2006.01)
  *C01B 21/06*    (2006.01)
  (Continued)

(52) U.S. Cl.
  CPC .......... *C30B 25/18* (2013.01); *C01B 21/0632* (2013.01); *C30B 25/04* (2013.01); *C30B 29/406* (2013.01)

(58) Field of Classification Search
  CPC ..... C30B 29/406; C30B 29/403; C30B 29/40; C30B 7/005; H01L 21/0254;
  (Continued)

(56) References Cited

U.S. PATENT DOCUMENTS

| | | |
|---|---|---|
| 3,303,053 A | 2/1967 | Strong et al. |
| 4,030,966 A | 6/1977 | Hornig et al. |

(Continued)

FOREIGN PATENT DOCUMENTS

| | | |
|---|---|---|
| CN | 101061570 A | 10/2007 |
| EP | 0996173 A2 * | 4/2000 |

(Continued)

OTHER PUBLICATIONS

Office Action dated Oct. 7, 2021 for U.S. Appl. No. 16/550,947.

(Continued)

*Primary Examiner* — Sheng H Davis
*Assistant Examiner* — Ritu S Shirali
(74) *Attorney, Agent, or Firm* — Patterson + Sheridan, LLP

(57) ABSTRACT

Embodiments of the present disclosure include techniques related to techniques for processing materials for manufacture of group-III metal nitride and gallium based substrates. More specifically, embodiments of the disclosure include techniques for growing large area substrates using a combination of processing techniques. Merely by way of example, the disclosure can be applied to growing crystals of GaN, AlN, InN, InGaN, AlGaN, and AlInGaN, and others for manufacture of bulk or patterned substrates. Such bulk or patterned substrates can be used for a variety of applications including optoelectronic and electronic devices, lasers, light emitting diodes, solar cells, photo electrochemical water splitting and hydrogen generation, photodetectors, integrated circuits, and transistors, and others.

18 Claims, 32 Drawing Sheets

Related U.S. Application Data

(60) Provisional application No. 63/006,700, filed on Apr. 7, 2020, provisional application No. 62/975,078, filed on Feb. 11, 2020.

(51) Int. Cl.
*C30B 25/04* (2006.01)
*C30B 25/18* (2006.01)

(58) Field of Classification Search
CPC ......... H01L 21/02609; H01L 21/02647; H01L 29/2003; H01L 33/007; H01L 33/32; H01L 21/02389
USPC ........................................................ 117/20
See application file for complete search history.

(56) References Cited

U.S. PATENT DOCUMENTS

| | | | |
|---|---|---|---|
| 4,066,868 A | 1/1978 | Witkin et al. |
| 4,350,560 A | 9/1982 | Helgeland et al. |
| 4,870,045 A | 9/1989 | Gasper et al. |
| 5,098,673 A | 3/1992 | Engel et al. |
| 5,127,983 A | 7/1992 | Imai et al. |
| 5,169,486 A | 12/1992 | Young et al. |
| 5,474,021 A | 12/1995 | Tsuno et al. |
| 6,129,900 A | 10/2000 | Satoh et al. |
| 6,163,557 A | 12/2000 | Dunnrowicz et al. |
| 6,273,948 B1 | 8/2001 | Porowski et al. |
| 6,398,867 B1 | 6/2002 | D'Evelyn et al. |
| 6,406,540 B1 | 6/2002 | Harris et al. |
| 6,500,257 B1 | 12/2002 | Wang et al. |
| 6,528,427 B2 | 3/2003 | Chebi et al. |
| 6,562,127 B1 | 5/2003 | Kud |
| 6,596,079 B1 | 7/2003 | Vaudo et al. |
| 6,599,362 B2 | 7/2003 | Ashby et al. |
| 6,656,615 B2 | 12/2003 | Dwilinski et al. |
| 6,686,608 B1 | 2/2004 | Takahira |
| 6,748,345 B2 | 6/2004 | Chou et al. |
| 6,756,246 B2 | 6/2004 | Hiramatsu et al. |
| 6,764,297 B2 | 7/2004 | Godwin et al. |
| 6,765,240 B2 | 7/2004 | Tischler et al. |
| 6,784,463 B2 | 8/2004 | Camras et al. |
| 6,787,814 B2 | 9/2004 | Udagawa |
| 6,805,745 B2 | 10/2004 | Snyder |
| 6,806,508 B2 | 10/2004 | D'Evelyn et al. |
| 6,818,529 B2 | 11/2004 | Bachrach et al. |
| 6,861,130 B2 | 3/2005 | D'Evelyn et al. |
| 6,887,144 B2 | 5/2005 | D'Evelyn et al. |
| 7,001,577 B2 | 2/2006 | Zimmerman et al. |
| 7,026,756 B2 | 4/2006 | Shimizu et al. |
| 7,053,413 B2 | 5/2006 | D'Evelyn et al. |
| 7,063,741 B2 | 6/2006 | D'Evelyn et al. |
| 7,078,731 B2 | 7/2006 | D'Evelyn et al. |
| 7,098,487 B2 | 8/2006 | D'Evelyn et al. |
| 7,101,433 B2 | 9/2006 | D'Evelyn et al. |
| 7,112,829 B2 | 9/2006 | Picard et al. |
| 7,119,372 B2 | 10/2006 | Stokes et al. |
| 7,125,453 B2 | 10/2006 | D'Evelyn et al. |
| 7,160,531 B1 | 1/2007 | Jacques et al. |
| 7,170,095 B2 | 1/2007 | Vaudo et al. |
| 7,175,704 B2 | 2/2007 | D'Evelyn et al. |
| 7,198,671 B2 | 4/2007 | Ueda |
| 7,220,658 B2 | 5/2007 | Haskell et al. |
| 7,252,712 B2 | 8/2007 | Dwilinski et al. |
| 7,279,040 B1 | 10/2007 | Wang |
| 7,316,746 B2 | 1/2008 | D'Evelyn et al. |
| 7,335,262 B2 | 2/2008 | Dwilinski et al. |
| 7,361,576 B2 | 4/2008 | Imer et al. |
| 7,368,015 B2 | 5/2008 | D'Evelyn et al. |
| 7,381,391 B2 | 6/2008 | Spencer et al. |
| 7,420,261 B2 | 9/2008 | Dwili ski et al. |
| 7,470,938 B2 | 12/2008 | Lee et al. |
| 7,569,206 B2 | 8/2009 | Spencer et al. |
| 7,625,446 B2 | 12/2009 | D'Evelyn et al. |
| 7,642,122 B2 | 1/2010 | Tysoe et al. |
| 7,704,324 B2 | 4/2010 | D'Evelyn et al. |
| 7,705,276 B2 | 4/2010 | Giddings et al. |
| 7,759,710 B1 | 7/2010 | Chiu et al. |
| 7,932,382 B2 | 4/2011 | Wang et al. |
| 7,935,382 B2 | 5/2011 | Park et al. |
| 7,976,630 B2 | 7/2011 | Poblenz et al. |
| 8,021,481 B2 | 9/2011 | D'Evelyn |
| 8,039,412 B2 | 10/2011 | Park et al. |
| 8,048,225 B2 | 11/2011 | Poblenz et al. |
| 8,097,081 B2 | 1/2012 | D'Evelyn |
| 8,148,180 B2 | 4/2012 | Felker et al. |
| 8,148,801 B2 | 4/2012 | D'Evelyn |
| 8,278,656 B2 | 10/2012 | Mattmann et al. |
| 8,303,710 B2 | 11/2012 | D'Evelyn |
| 8,306,081 B1 | 11/2012 | Schmidt et al. |
| 8,313,964 B2 | 11/2012 | Sharma et al. |
| 8,323,405 B2 | 12/2012 | D'Evelyn |
| 8,329,511 B2 | 12/2012 | D'Evelyn |
| 8,354,679 B1 | 1/2013 | D'Evelyn et al. |
| 8,430,958 B2 | 4/2013 | D'Evelyn |
| 8,435,347 B2 | 5/2013 | D'Evelyn et al. |
| 8,444,765 B2 | 5/2013 | D'Evelyn |
| 8,461,071 B2 | 6/2013 | D'Evelyn |
| 8,465,588 B2 | 6/2013 | Poblenz et al. |
| 8,482,104 B2 | 7/2013 | D'Evelyn et al. |
| 8,492,185 B1 | 7/2013 | D'Evelyn et al. |
| 9,012,306 B2 | 4/2015 | Beaumont et al. |
| 9,209,596 B1 | 12/2015 | McLaurin et al. |
| 9,589,792 B2 | 3/2017 | Jiang et al. |
| 9,650,723 B1 | 5/2017 | D'Evelyn et al. |
| 9,834,859 B2 | 12/2017 | Mori et al. |
| 10,094,017 B2 | 10/2018 | Pocius et al. |
| RE47,114 E | 11/2018 | D'Evelyn et al. |
| 10,400,352 B2 | 9/2019 | D'Evelyn et al. |
| 10,619,239 B2 | 4/2020 | Pocius et al. |
| 2001/0011935 A1 | 8/2001 | Lee et al. |
| 2002/0155691 A1 | 10/2002 | Lee et al. |
| 2002/0189532 A1 | 12/2002 | Motoki et al. |
| 2003/0012334 A1 | 1/2003 | Kurtz et al. |
| 2003/0027014 A1 | 2/2003 | Johnson et al. |
| 2003/0056718 A1 | 3/2003 | Kawahara et al. |
| 2003/0082466 A1 | 5/2003 | del Puerto et al. |
| 2003/0127041 A1 | 7/2003 | Xu et al. |
| 2003/0128041 A1 | 7/2003 | Byrd |
| 2003/0138732 A1 | 7/2003 | Nagase |
| 2003/0140845 A1 | 7/2003 | D'Evelyn et al. |
| 2003/0145784 A1 | 8/2003 | Thompson et al. |
| 2003/0183155 A1 | 10/2003 | D'Evelyn et al. |
| 2003/0209191 A1 | 11/2003 | Purdy |
| 2003/0232512 A1 | 12/2003 | Dickinson et al. |
| 2004/0000266 A1 | 1/2004 | D'Evelyn et al. |
| 2004/0007763 A1 | 1/2004 | Cunningham |
| 2004/0023427 A1 | 2/2004 | Chua et al. |
| 2004/0124435 A1 | 7/2004 | D'Evelyn et al. |
| 2004/0245535 A1 | 12/2004 | D'Evelyn et al. |
| 2005/0087753 A1 | 4/2005 | D'Evelyn et al. |
| 2005/0093003 A1 | 5/2005 | Shibata |
| 2005/0098095 A1 | 5/2005 | D'Evelyn et al. |
| 2005/0118349 A1 | 6/2005 | Whitehead et al. |
| 2005/0128469 A1 | 6/2005 | Hall et al. |
| 2005/0152820 A1 | 7/2005 | D'Evelyn et al. |
| 2005/0170611 A1 | 8/2005 | Ghyselen et al. |
| 2005/0205215 A1 | 9/2005 | Giddings et al. |
| 2006/0032428 A1 | 2/2006 | Dwilinski et al. |
| 2006/0037529 A1 | 2/2006 | D'Evelyn et al. |
| 2006/0037530 A1 | 2/2006 | Dwilinski et al. |
| 2006/0048699 A1 | 3/2006 | D'Evelyn et al. |
| 2006/0084245 A1 | 4/2006 | Kohda |
| 2006/0096521 A1 | 5/2006 | D'Evelyn et al. |
| 2006/0124051 A1 | 6/2006 | Yoshioka et al. |
| 2006/0177362 A1 | 8/2006 | D'Evelyn et al. |
| 2006/0207497 A1 | 9/2006 | D'Evelyn et al. |
| 2006/0213429 A1 | 9/2006 | Motoki et al. |
| 2006/0228870 A1 | 10/2006 | Oshima |
| 2006/0228901 A1 | 10/2006 | Yoon et al. |
| 2006/0255341 A1 | 11/2006 | Pinnington et al. |
| 2006/0288927 A1 | 12/2006 | Chodelka et al. |
| 2007/0012943 A1 | 1/2007 | Okahisa et al. |

(56) References Cited

U.S. PATENT DOCUMENTS

| | | |
|---|---|---|
| 2007/0057337 A1 | 3/2007 | Kano et al. |
| 2007/0105351 A1 | 5/2007 | Motoki et al. |
| 2007/0131967 A1 | 6/2007 | Kawaguchi et al. |
| 2007/0138505 A1 | 6/2007 | Preble et al. |
| 2007/0141819 A1 | 6/2007 | Park et al. |
| 2007/0142204 A1 | 6/2007 | Park et al. |
| 2007/0151509 A1 | 7/2007 | Park et al. |
| 2007/0158785 A1 | 7/2007 | D'Evelyn et al. |
| 2007/0178039 A1 | 8/2007 | D'Evelyn et al. |
| 2007/0181056 A1 | 8/2007 | D'Evelyn et al. |
| 2007/0197004 A1 | 8/2007 | Dadgar et al. |
| 2007/0210074 A1 | 9/2007 | Maurer et al. |
| 2007/0215033 A1 | 9/2007 | Imaeda et al. |
| 2007/0215887 A1 | 9/2007 | D'Evelyn et al. |
| 2007/0218703 A1 | 9/2007 | Kaeding et al. |
| 2007/0231978 A1 | 10/2007 | Kanamoto et al. |
| 2007/0234946 A1 | 10/2007 | Hashimoto et al. |
| 2007/0252164 A1 | 11/2007 | Zhong et al. |
| 2007/0264733 A1 | 11/2007 | Choi et al. |
| 2007/0274359 A1 | 11/2007 | Takeuchi et al. |
| 2008/0006831 A1 | 1/2008 | Ng |
| 2008/0025360 A1 | 1/2008 | Eichler et al. |
| 2008/0056984 A1 | 3/2008 | Yoshioka et al. |
| 2008/0083741 A1 | 4/2008 | Giddings et al. |
| 2008/0083970 A1 | 4/2008 | Kamber et al. |
| 2008/0087919 A1 | 4/2008 | Tysoe et al. |
| 2008/0096470 A1 | 4/2008 | Hou et al. |
| 2008/0156254 A1 | 7/2008 | Dwilinski et al. |
| 2008/0193363 A1 | 8/2008 | Tsuji |
| 2008/0272462 A1 | 11/2008 | Shimamoto et al. |
| 2009/0092536 A1 | 4/2009 | Kawabata et al. |
| 2009/0140287 A1 | 6/2009 | Fujiwara et al. |
| 2009/0170286 A1 | 7/2009 | Tsukamoto et al. |
| 2009/0218593 A1 | 9/2009 | Kamikawa et al. |
| 2009/0236694 A1 | 9/2009 | Mizuhara et al. |
| 2009/0250686 A1 | 10/2009 | Sato et al. |
| 2009/0298265 A1 | 12/2009 | Fujiwara |
| 2009/0301387 A1 | 12/2009 | D'Evelyn |
| 2009/0301388 A1 | 12/2009 | D'Evelyn |
| 2009/0309105 A1 | 12/2009 | Letts et al. |
| 2009/0309110 A1 | 12/2009 | Raring et al. |
| 2009/0320744 A1 | 12/2009 | D'Evelyn |
| 2009/0320745 A1 | 12/2009 | D'Evelyn et al. |
| 2010/0001300 A1 | 1/2010 | Raring et al. |
| 2010/0003492 A1 | 1/2010 | D'Evelyn |
| 2010/0003942 A1 | 1/2010 | Ikeda et al. |
| 2010/0025656 A1 | 2/2010 | Raring et al. |
| 2010/0031872 A1 | 2/2010 | D'Evelyn |
| 2010/0031873 A1 | 2/2010 | D'Evelyn |
| 2010/0031874 A1 | 2/2010 | D'Evelyn |
| 2010/0031875 A1 | 2/2010 | D'Evelyn |
| 2010/0031876 A1 | 2/2010 | D'Evelyn |
| 2010/0065854 A1 | 3/2010 | Kamber et al. |
| 2010/0075175 A1 | 3/2010 | Poblenz et al. |
| 2010/0104495 A1 | 4/2010 | Kawabata et al. |
| 2010/0108985 A1 | 5/2010 | Chung et al. |
| 2010/0109126 A1 | 5/2010 | Arena |
| 2010/0147210 A1 | 6/2010 | D'Evelyn |
| 2010/0151194 A1 | 6/2010 | D'Evelyn |
| 2010/0187568 A1 | 7/2010 | Arena |
| 2010/0189981 A1 | 7/2010 | Poblenz et al. |
| 2010/0219505 A1 | 9/2010 | D'Evelyn |
| 2010/0243988 A1 | 9/2010 | Kamikawa et al. |
| 2011/0062415 A1 | 3/2011 | Ohta et al. |
| 2011/0064103 A1 | 3/2011 | Ohta et al. |
| 2011/0068347 A1 | 3/2011 | Strittmatter |
| 2011/0100291 A1 | 5/2011 | D'Evelyn |
| 2011/0101400 A1 | 5/2011 | Chu et al. |
| 2011/0101414 A1 | 5/2011 | Thompson et al. |
| 2011/0124139 A1 | 5/2011 | Chang |
| 2011/0158275 A1 | 6/2011 | Yoshizumi et al. |
| 2011/0175200 A1 | 7/2011 | Yoshida |
| 2011/0183498 A1 | 7/2011 | D'Evelyn |
| 2011/0186860 A1 | 8/2011 | Enya et al. |
| 2011/0220912 A1 | 9/2011 | D'Evelyn |
| 2011/0256693 A1 | 10/2011 | D'Evelyn et al. |
| 2011/0260189 A1 | 10/2011 | Kim |
| 2011/0309373 A1 | 12/2011 | Sharma et al. |
| 2012/0000415 A1 | 1/2012 | D'Evelyn et al. |
| 2012/0091465 A1 | 4/2012 | Krames et al. |
| 2012/0104359 A1 | 5/2012 | Felker et al. |
| 2012/0104412 A1 | 5/2012 | Zhong et al. |
| 2012/0112320 A1 | 5/2012 | Kubo et al. |
| 2012/0118223 A1 | 5/2012 | D'Evelyn |
| 2012/0119218 A1 | 5/2012 | Su |
| 2012/0137966 A1 | 6/2012 | D'Evelyn et al. |
| 2012/0187412 A1 | 7/2012 | D'Evelyn et al. |
| 2013/0112987 A1 | 5/2013 | Fu et al. |
| 2013/0119401 A1 | 5/2013 | D'Evelyn et al. |
| 2013/0126902 A1 | 5/2013 | Isozaki et al. |
| 2013/0251615 A1 | 9/2013 | D'Evelyn et al. |
| 2013/0323490 A1 | 12/2013 | D'Evelyn et al. |
| 2014/0050244 A1 | 2/2014 | Ohno et al. |
| 2014/0065360 A1 | 3/2014 | D'Evelyn et al. |
| 2014/0147650 A1 | 5/2014 | Jiang et al. |
| 2014/0217553 A1 | 8/2014 | Arena et al. |
| 2017/0073840 A1 | 3/2017 | Mori et al. |
| 2017/0263815 A1 | 9/2017 | Iwai et al. |
| 2017/0362739 A1 | 12/2017 | Kajimoto et al. |
| 2018/0087185 A1 | 3/2018 | Yoshida |
| 2018/0202067 A1 | 7/2018 | Hirao et al. |
| 2019/0189439 A1 | 6/2019 | Mikawa et al. |
| 2020/0087813 A1 | 3/2020 | D'Evelyn et al. |
| 2020/0224331 A1 | 7/2020 | D'Evelyn et al. |

FOREIGN PATENT DOCUMENTS

| | | |
|---|---|---|
| JP | 2005-289797 A | 10/2005 |
| JP | 2005-298269 A | 10/2005 |
| JP | 2006045036 A | 2/2006 |
| JP | 2006-315947 A | 11/2006 |
| JP | 2007-039321 A | 2/2007 |
| JP | 20121432 A | 1/2012 |
| JP | 2014111527 A | 6/2014 |
| JP | 2016037426 A | 3/2016 |
| JP | 2016088756 | 5/2016 |
| WO | 2004/061923 A1 | 7/2004 |
| WO | 2005121415 A1 | 12/2005 |
| WO | 2006/038467 A1 | 4/2006 |
| WO | 2006/057463 A1 | 6/2006 |
| WO | 2007/004495 A1 | 1/2007 |
| WO | 2010/068916 A1 | 6/2010 |
| WO | 2011/044554 A1 | 4/2011 |
| WO | 2012/016033 A1 | 2/2012 |
| WO | 2015133443 A1 | 9/2015 |

OTHER PUBLICATIONS

Office Action dated Jan. 27, 2022 for U.S. Appl. No. 16/550,947.
Chakraborty et al., 'Defect Reduction in Nonpolar a-Plane GaN Films Using in situ SiNx Nanomask', Applied Physics Letters, vol. 89, 2006, pp. 041903-1-041903-3.
Darakchieva et al., "Lattice parameters of bulk GaN fabricated by halide vapor phase epitaxy," Journal of Crystal Growth, 2008, vol. 310, pp. 959-965.
Davidsson et al., 'Effect of AlN Nucleation Layer on the Structural Properties of Bulk GaN Grown on Sapphire by Molecular-Beam Epitaxy', Journal of Applied Physics, vol. 98, No. 1, 2005, pp. 016109-1-016109-3.
Dwilinski et al., 'Ammono Method of Bn, AlN and GaN Synthesis and Crystal Growth', MRS Internet Journal Nitride Semiconductor Research, vol. 3, No. 25, 1998, pp. 1-5.
Dwilinski et al., "Excellent crystallinity of truly bulk ammonothermal GaN", "Journal of Crystal Growth", vol. 310 (2008), pp. 3911-3916.
"Semiconductor Wafer Bonding" by Q.-Y. Tong and U. Gosele.
Hashimoto et al., 'A GaN bulk crystal with improved structural quality grown by the ammonothermal method', Nature Materials, vol. 6, 2007, pp. 568-671.
Hashimoto et al., 'Ammonothermal Growth of Bulk GaN', Journal of Crystal Growth, vol. 310, 2008, pp. 3907-3910.

(56) References Cited

OTHER PUBLICATIONS

S. K. Mathis et al., "Modeling of threading dislocation reduction in growing GaN layers," Journal of Crystal Growth, 2001, vol. 231, pp. 371-390.
Katona et al., 'Observation of Crystallographic Wing Tilt in Cantilever Epitaxy of GaN on Silicon Carbide and Silicon (111) Substrates', Applied Physics Letters, vol. 79, No. 18, 2001, pp. 2907-2909.
Nakamura et al., 'GaN Growth Using GaN Buffer Layer', Japanese Journal of Applied Physics, vol. 30, No. 10A, 1991, pp. L1705-L1707.
Sumiya et al., 'Growth Mode and Surface Morphology of a GaN Film Deposited Along The N-Face Polar Direction on c-Plane Sapphire Substrate', Journal of Applied Physics, vol. 88, No. 2, 2000, pp. 1158-1165.
Sumiya et al., 'High-pressure synthesis of high-purity diamond crystal', Diamond and Related Materials, 1996, vol. 5, pp. 1359-1365.
International Search Report dated May 6, 2021 for Application No. PCT/US2021/017514.
Kolis et al., 'Materials Chemistry and Bulk Crystal Growth of Group III Nitrides in Supercritical Ammonia', Material Resources Society Symposium Proceedings, vol. 495, 1998, pp. 367-372.
Kolis et al., 'Crystal Growth of Gallium Nitride in Supercritical Ammonia', Journal of Crystal Growth, vol. 222, 2001, pp. 431-434.
Motoki et al., 'Growth and Characterization of Freestanding GaN Substrates', Journal of Crystal Growth, vol. 237-239, 2002, pp. 912-921.
International Search Report dated Nov. 2, 2020 for Application No. PCT/US2020/034405).
Linthicum et al. Applied Physics Letters, 75, 196, (1999).
Chen et al. Applied Physics Letters 75, 2062 (1999).
Chen et al. Japanese Journal of Applied Physics 42, L818 (2003).
Cao et al., Microelectronics Reliability, 2003, 43(12), 1987-1991.
Schubert et al., Applied Physics Letters, 2007, 91(23), 231114.
Tomiya et al., IEEE Journal of Selected Topics in Quantum Electronics, 2004, 10(6), 1277-1286.
Orita et al., IEEE International Reliability Physics Symposium Proceedings, 2009, 736-740.
Kaun et al., Applied Physics Express, 2011, 4(2), 024101.
Tapajna et al., Applied Physics Letters, 2011, 99(22), 223501-223503.
Sharma et al., Vertically oriented GaN-based air-gap distributed Bragg reflector structure fabricated using band-gap-selective photoelectrochemical etching, Applied Physics Letters 87, 051107 (2005), 3 pages.
Dorsaz et al., Selective oxidation of AlInN layers for current confinement in III-nitride devices, Applied Physics Letters 87, 072102 (2005), 3 pages.
Pattison et al., Gallium nitride based microcavity light emitting diodes with 2_ effective cavity thickness, Applied Physics Letters 90, 031111 (2007), 3 pages.
Choi et al., 2.5 _ microcavity InGaN light-emitting diodes fabricated by a selective dry-etch thinning process, Applied Physics Letters 91, 061120 (2007), 3 pages.
Altoukhov et al., High reflectivity airgap distributed Bragg reflectors realized by wet etching of AlInN sacrificial layers Applied Physics Letters 95, 1191102 (2009), 3 pages.

Tyagi et al., Partial strain relaxation via misfit dislocation generation at heterointerfaces in (Al,In)GaN epitaxial layers grown on semipolar (1122) GaN free standing substrates, Applied Physics Letters 95, 1191102 (2009), 3 pages.
Porowski et al., High resistivity GaN single crystalline substrates, APPA Vo. 92 (1997), 5 pages.
Oshima et al., Thermal and optical properties of bulk GaN crystals fabricated through hydride vapor phase epitaxy with void-assisted separation, Applied Physics Letters 98, 103509 (2005), 4 pages.
Wang et al., Ammonothermal growth of GaN crystals in alkaline solutions, Journal of Crystal Growth 287 (2006) pp. 376-380, 5 pages.
D'Evelyn et al., Bulk GaN crystal growth by the high-pressure ammonothermal method, Journal of Crystal Growth 300 (2007) pp. 11-16, 6 pages.
Fukuda et al., Prospects for the ammonothermal growth of large GaN crystal, Journal of Crystal Growth 305 (2007) pp. 304-310, 7 pages.
Gladkov et al., Effect of Fe doping on optical properties of free-standing semi-insulating HVPE GaN:Fe, Journal of Crystal Growth 312 (2010) pp. 1205-1209, 5 pages.
Moutanabbir et al., Bulk GaN Ion Cleaving, Journal of Electronic Materials, vol. 39, No. 5, (2010) pp. 482-488, 7 pages.
Grzegory, I., High pressure growth of bulk GaN from solutions in gallium, Journal of Physics: Condensed Matter, 13 (2001) pp. 6875-6892, 18 pages.
Fujito et al., Development of Bulk GaN Crystals and Nonpolar/Semipolar Substrates by HVPE, MRS Bulletin, vol. 34, May 2009, pp. 313-317, 5 pages.
Callahan et al., Synthesis and Growth of Gallium Nitride by the Chemical Vapor Reaction Process (CVRP), MRS Internet J. Nitride Semicond. Res. 4, 10 (1999), pp. 1-6, 6 pages.
Porowski, S., Near defect free GaN substrates, Published online by Cambridge University Press, Jun. 13, 2014, 11 pages.
Ehrentraut et al., The Ammonothermal Crystal Growth of Gallium NitrideVA Technique on the Up Rise, Proceedings of the IEEE, vol. 0, No. 0, 2009, pp. 1-8, 8 pages.
Weisbuch et al., Recent results and latest views on microcavity LEDs, Proc. of SPIE, vol. 5366, 2009, pp. 1-19, 19 pages.
Fang et al., Deep centers in semi-insulating Fe-doped native GaN substrates grown by hydride vapour phase epitaxy, phys. stat. sol. (c) 5, No. 6, pp. 1508-1511 (2008), 4 pages.
Office Action dated Aug. 30, 2021 for U.S. Appl. No. 16/736,274.
Final Office Action dated Nov. 30, 2021 for U.S. Appl. No. 16/736,274.
Non-Final Office Action for U.S. Appl. No. 16/736,274 dated Apr. 5, 2022.
Mark P. D'Evelyn, Large Area Gallium Nitride Crystal and Method for Making, U.S. Appl. No. 12/635,645.
Japanese Patent Application No. 2022-548644, Notice of Reasons for Refusal dated Nov. 1, 2023, 8 pages.
Wikipedia, Texture (chemistry), https://en.wikipedia.org/wiki/Texture_(chemistry), 7 pages. Printed Jan. 3, 2024.
Mark D. Vaudin, Crystallographic Texture in Ceramics and Metals, J. Res. Natl. Inst. Stand. Technol., vol. 106, 2001, pp. 1063-1069.
Japanese Application No. 2022-548644, Office Action dated May 10, 2024, 7 pages.

* cited by examiner

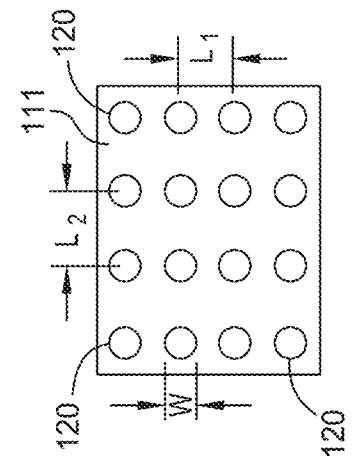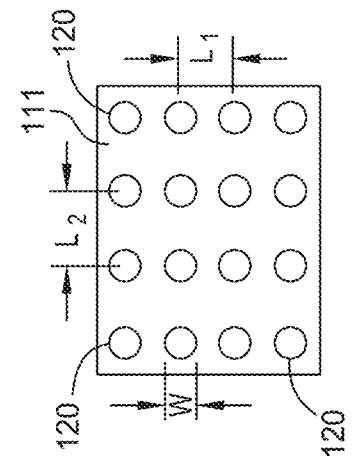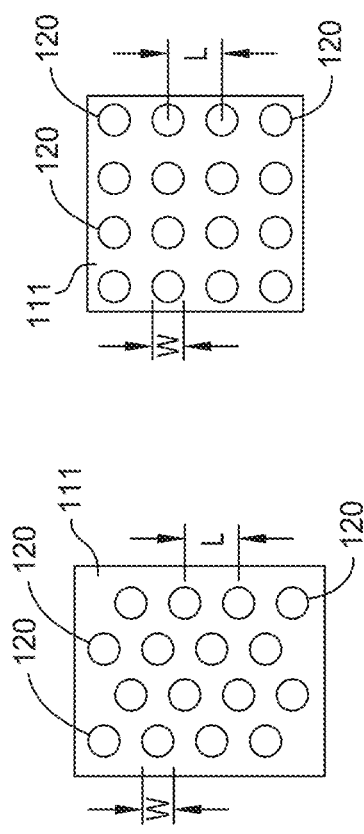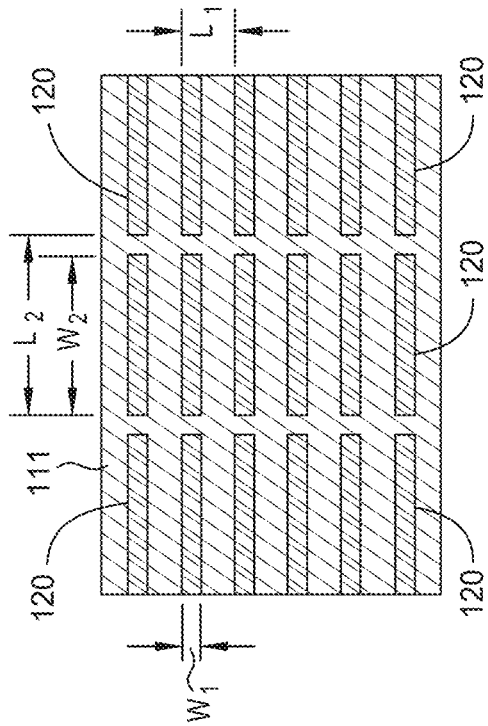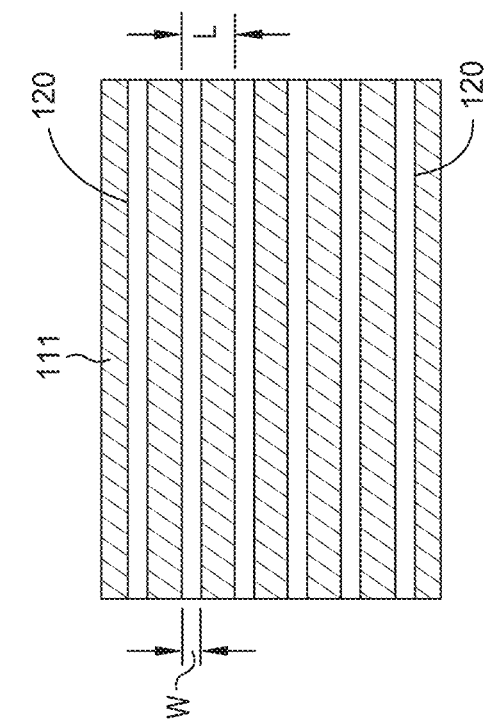

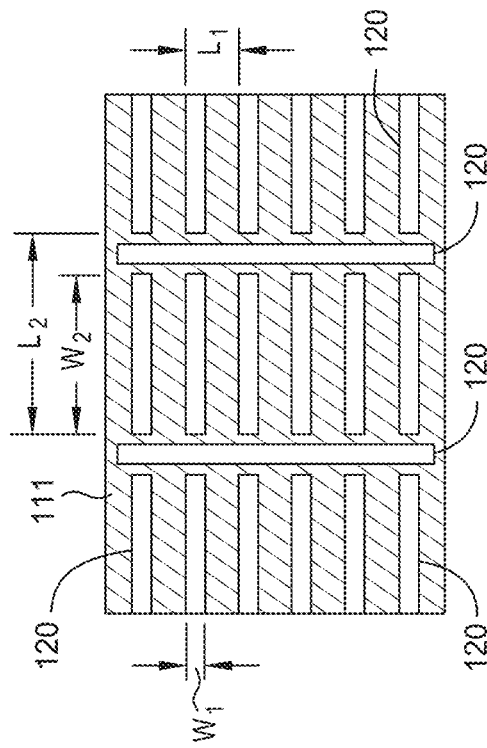
FIG. 1K
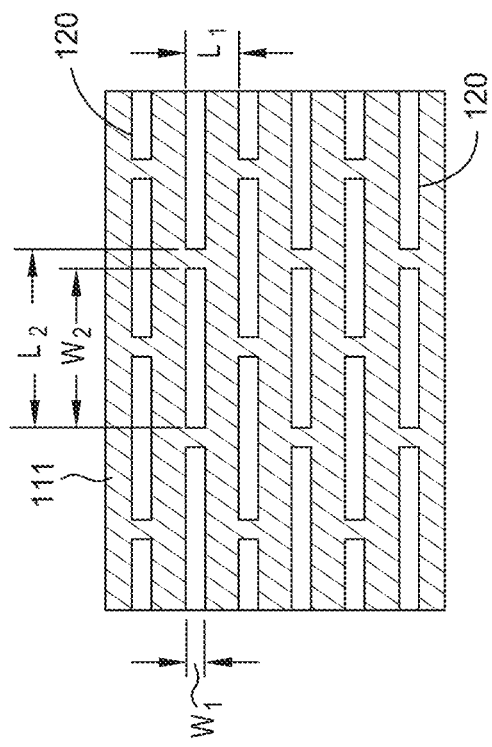
FIG. 1L
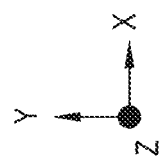

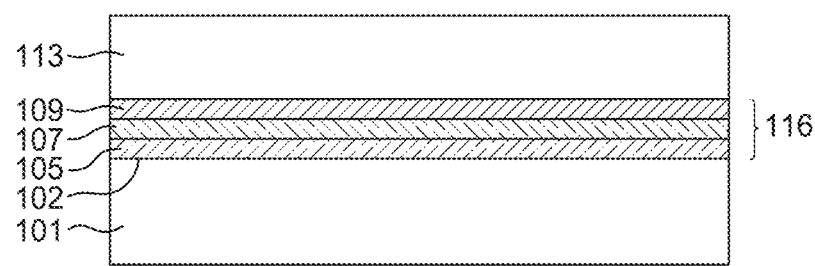
FIG. 1M
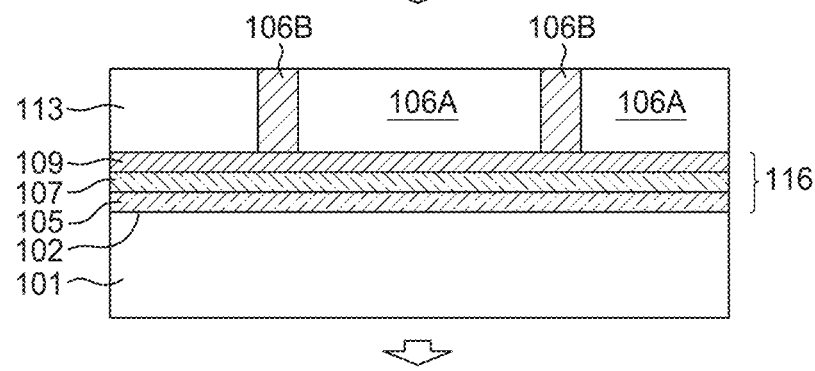
FIG. 1N
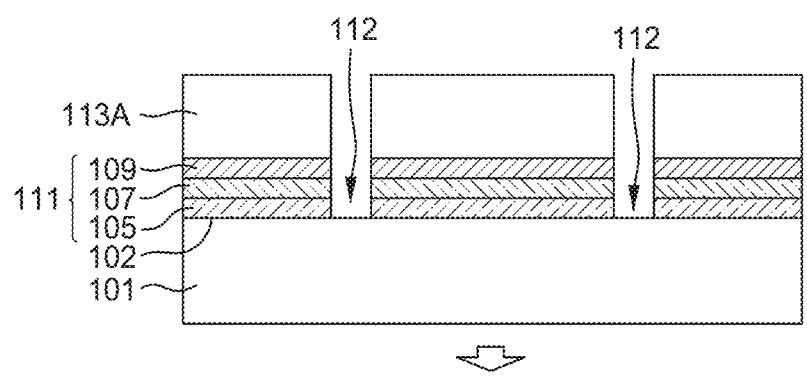
FIG. 1O
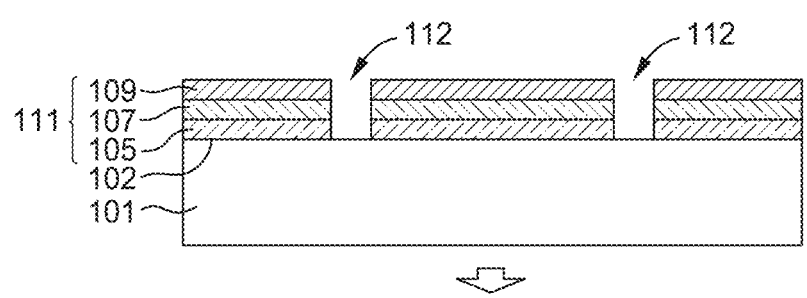
FIG. 1P
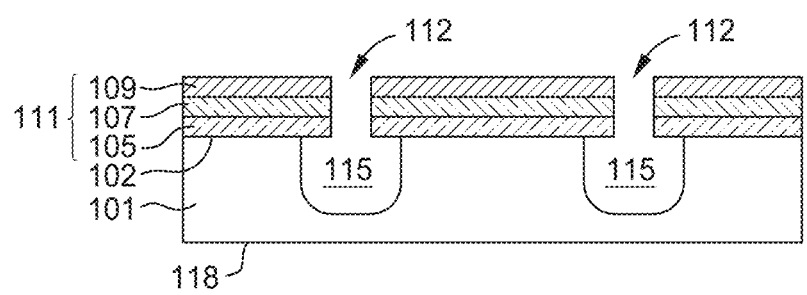
FIG. 1Q
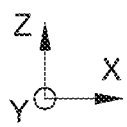

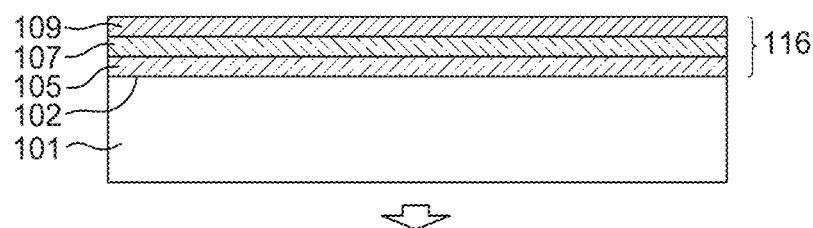
FIG. 1R
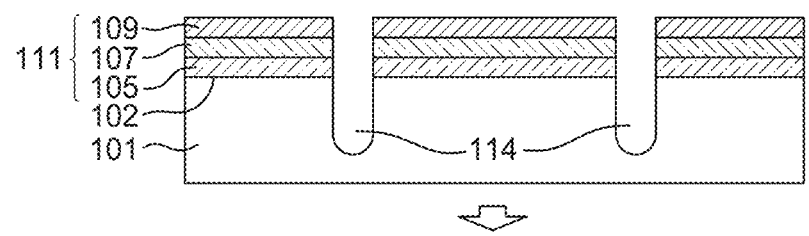
FIG. 1S
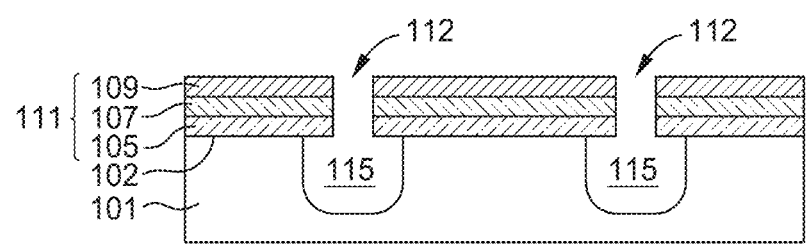
FIG. 1T
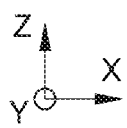

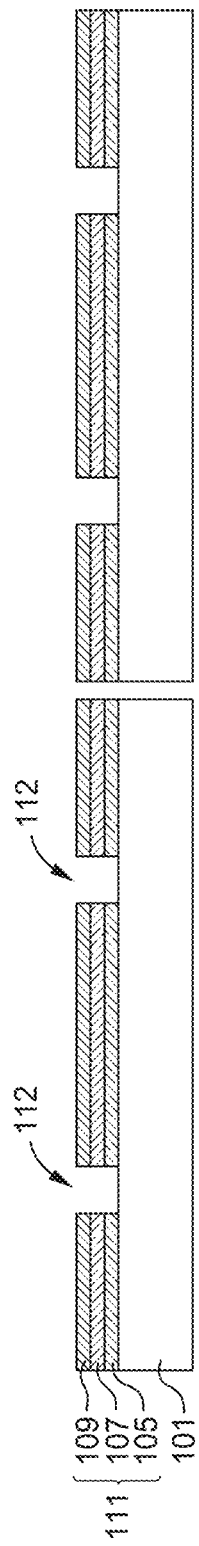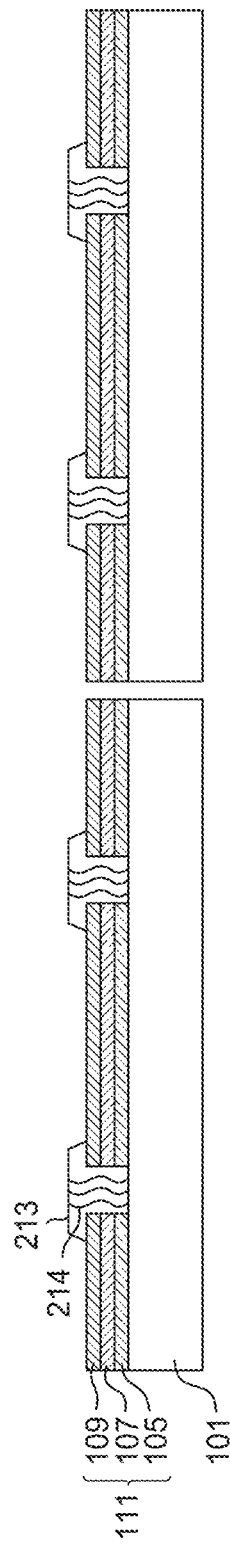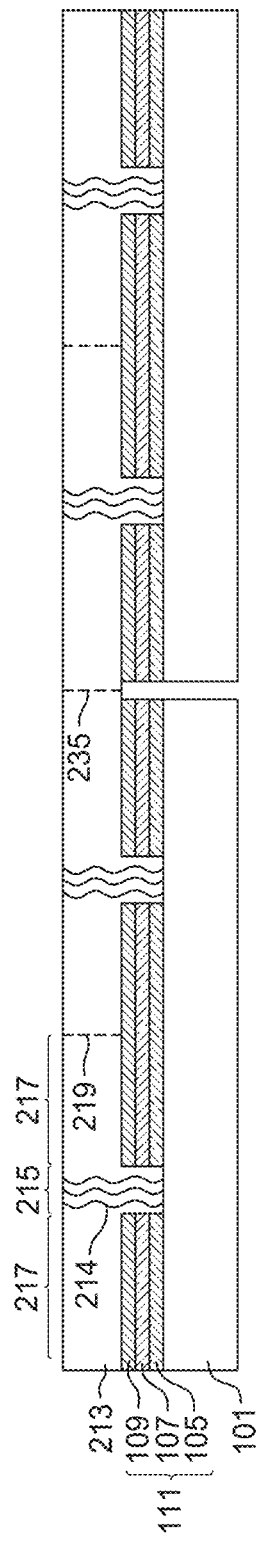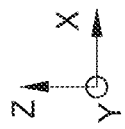

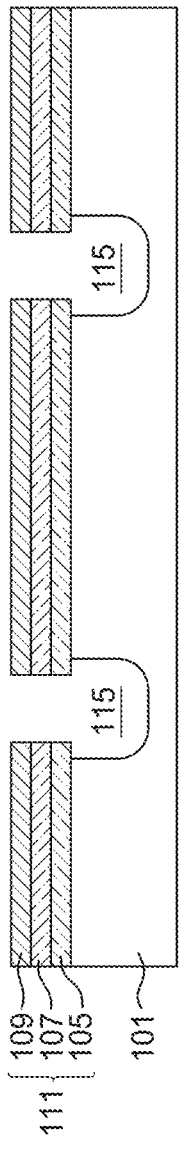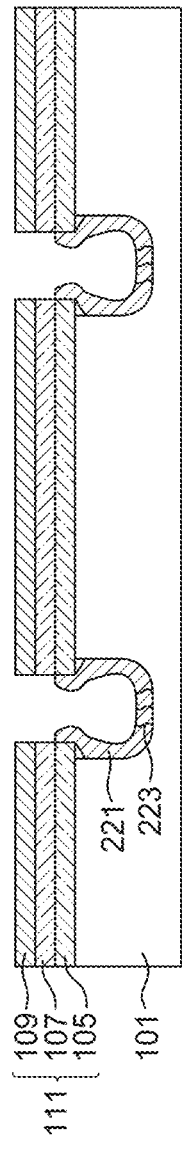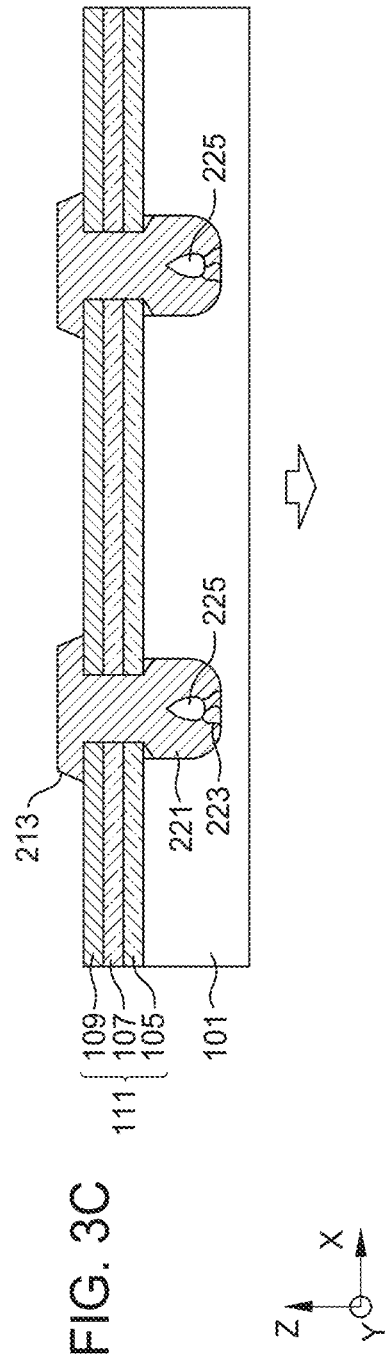

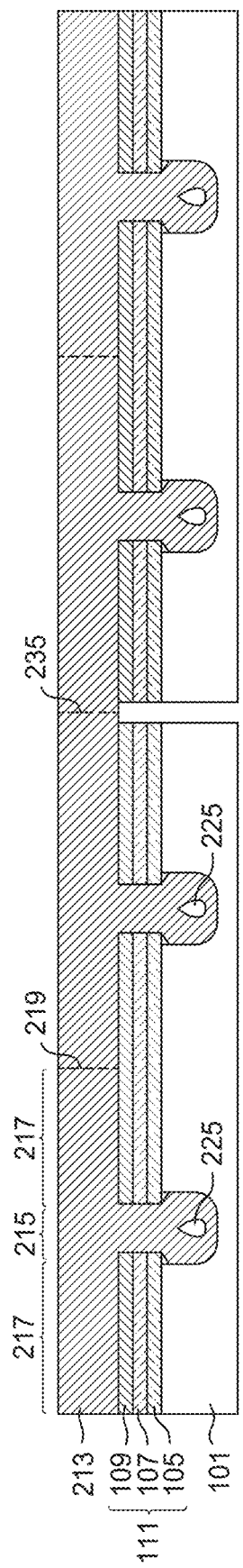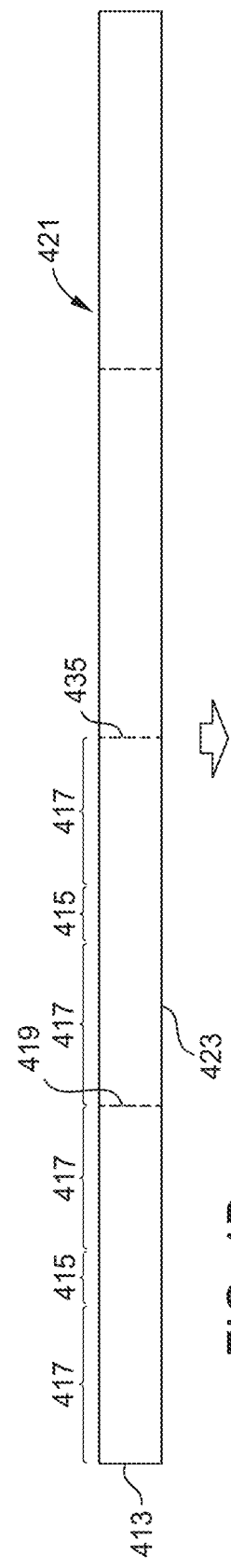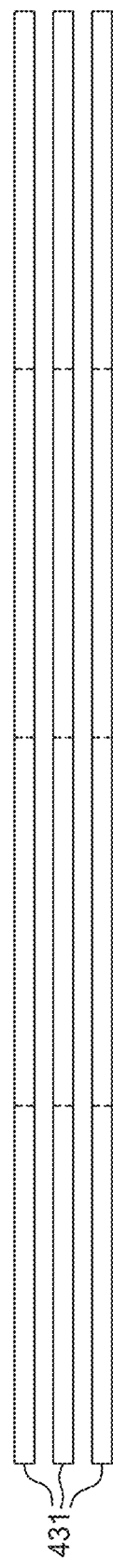
FIG. 4A
FIG. 4B
FIG. 4C

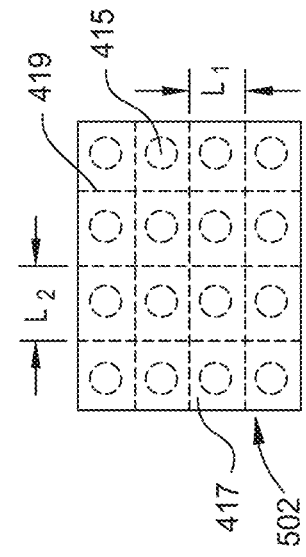
FIG. 5C
2D RECTANGULAR PATTERN
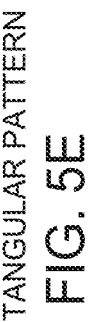
FIG. 5E
2D RECTANGULAR PATTERN
FIG. 5B
2D SQUARE PATTERN
FIG. 5D
1D LINEAR PATTERN
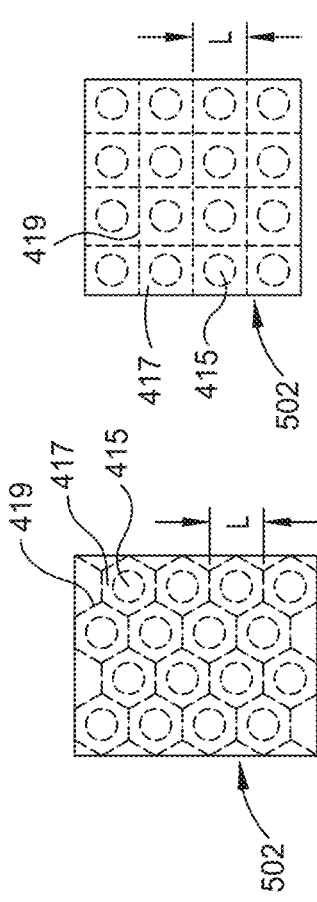
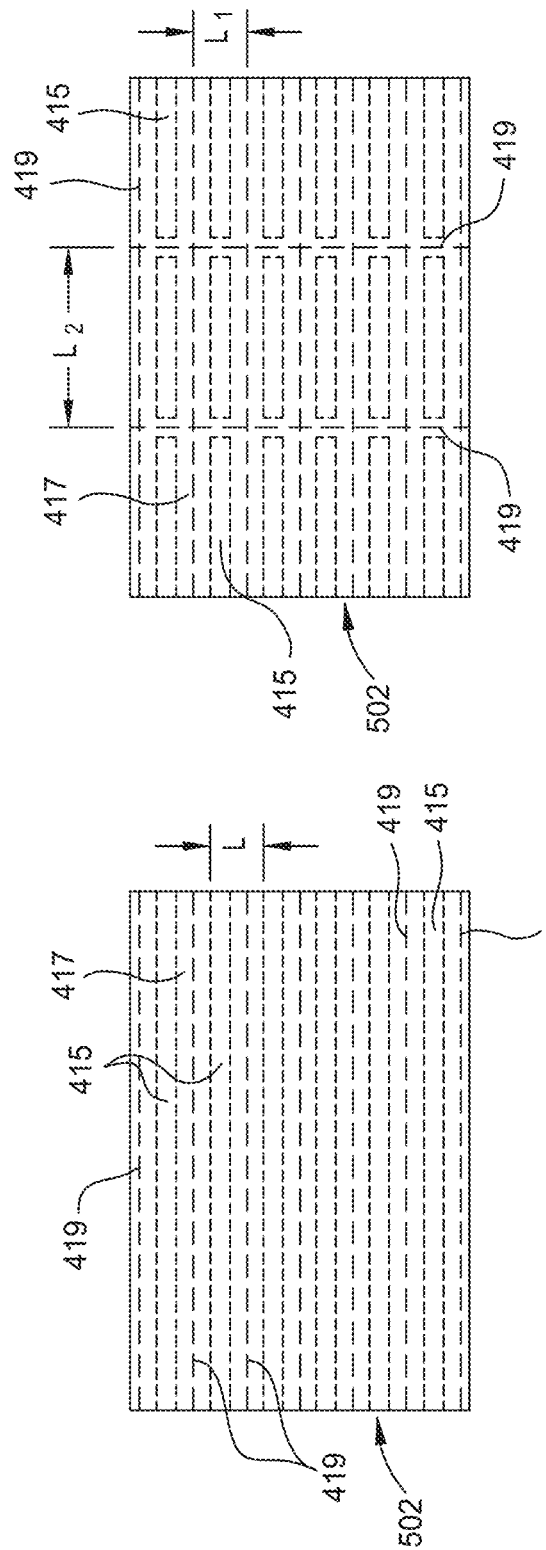
FIG. 5A
2D HEXAGONAL PATTERN

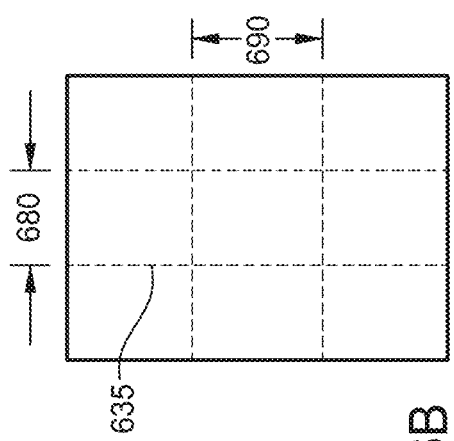
FIG. 6A
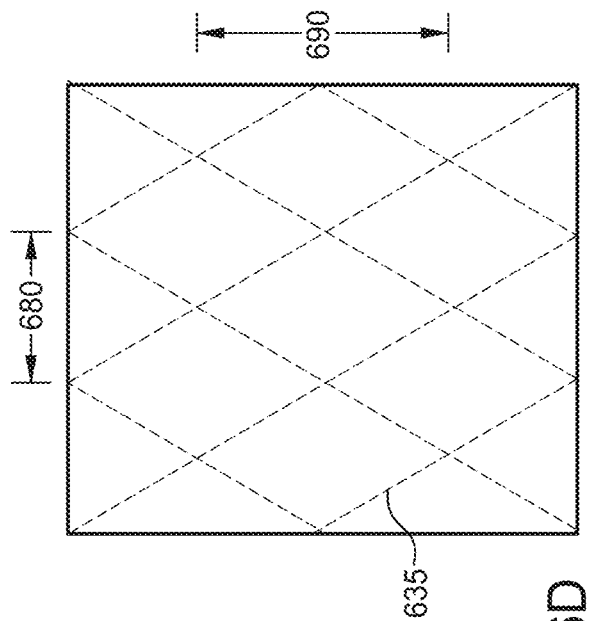
FIG. 6B
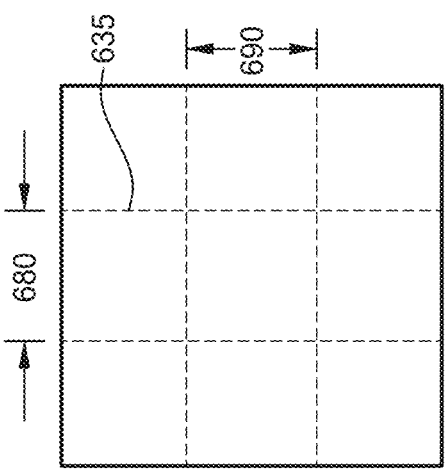
FIG. 6C
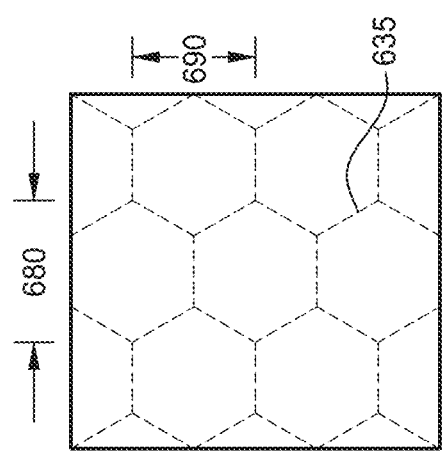
FIG. 6D
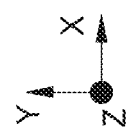

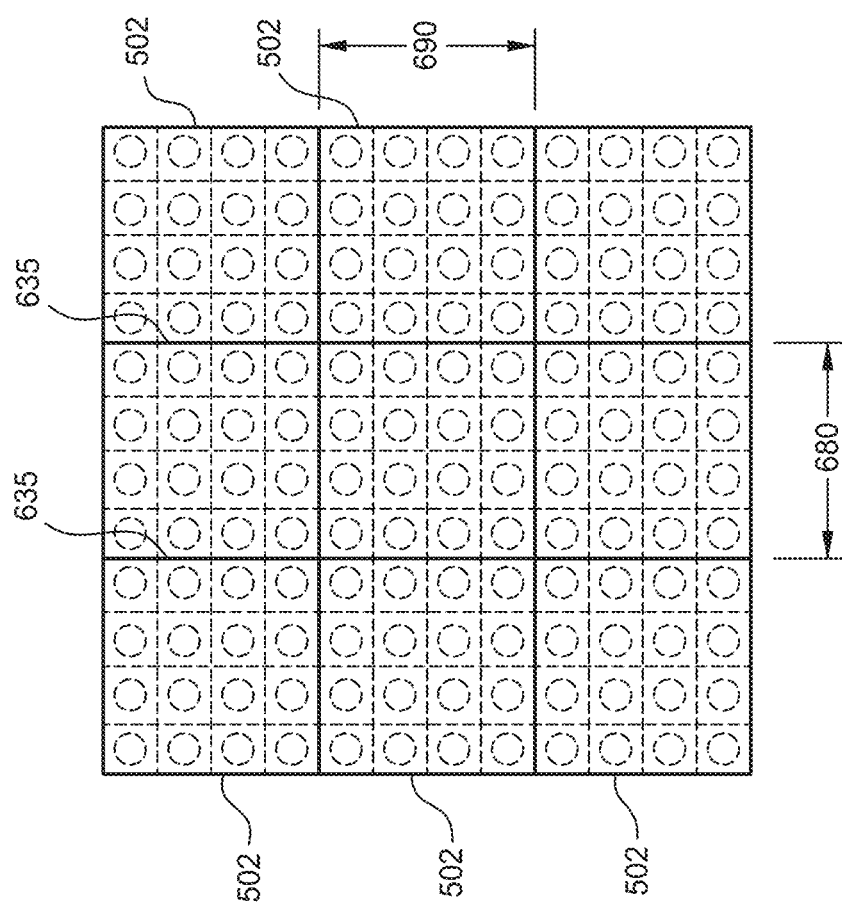
FIG. 6G
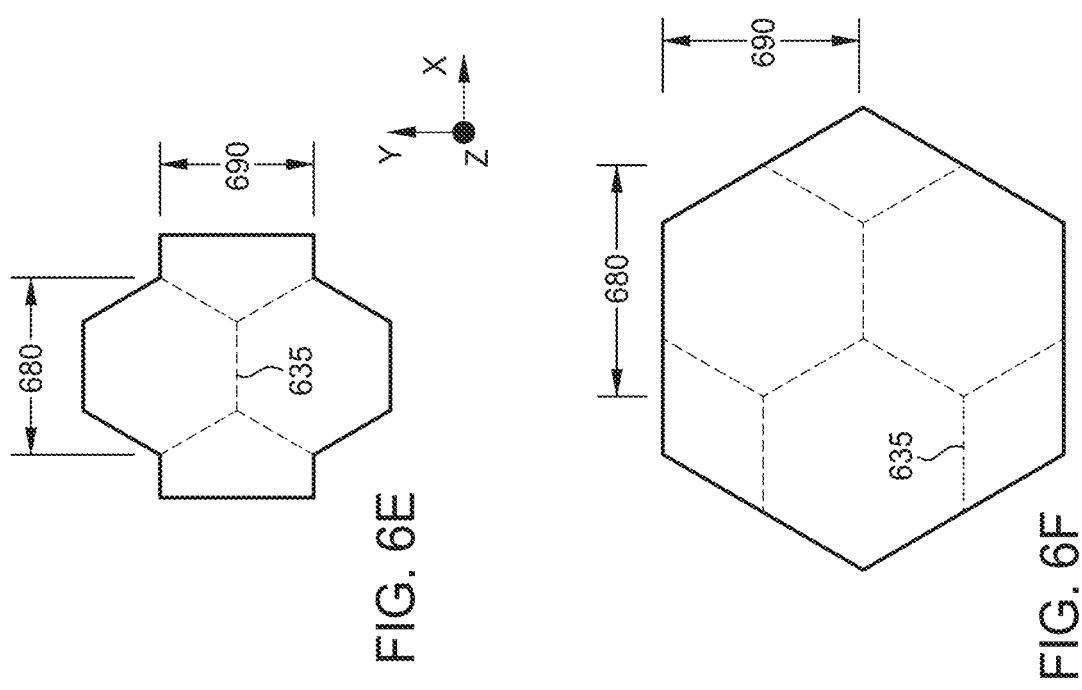
FIG. 6E
FIG. 6F

| Measuring point (9 point) | 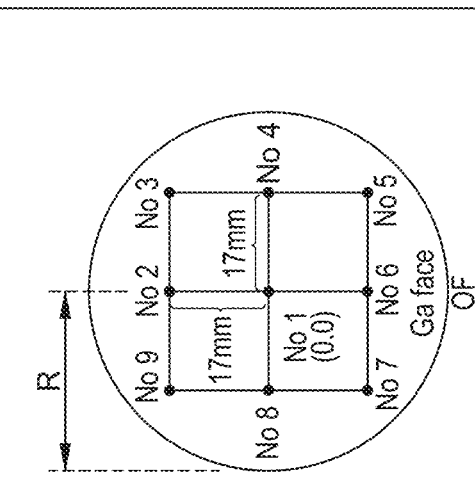 | 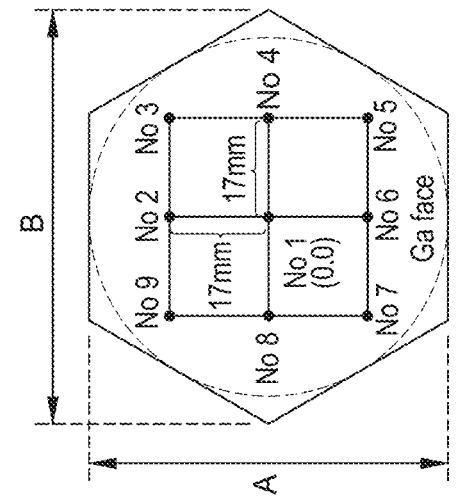 |
|---|---|---|
| Miscut range Along[1-100] <0.1° | 0.078° | 0.224° |
| Miscut range Along[11-20] <0.1° | 0.063° | 0.236° |
FIG. 13

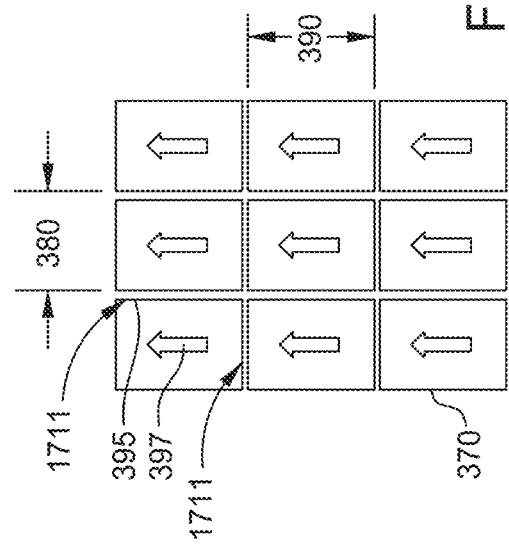
FIG. 17B
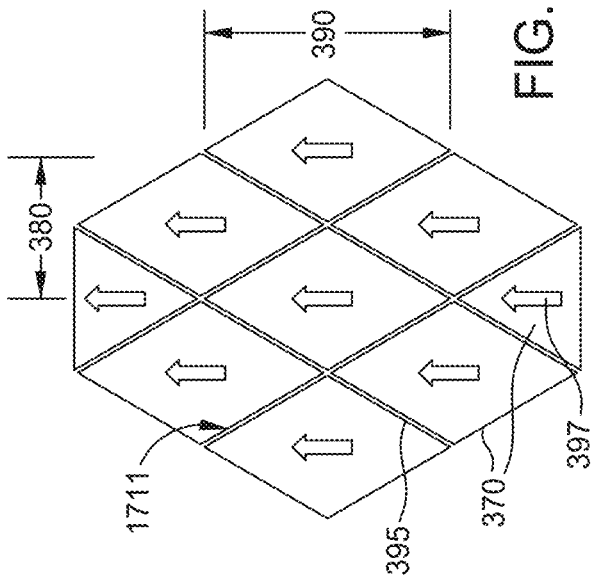
FIG. 17D
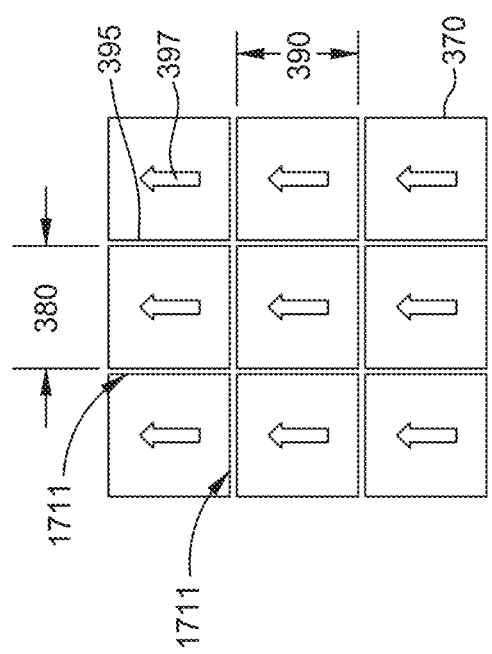
FIG. 17A
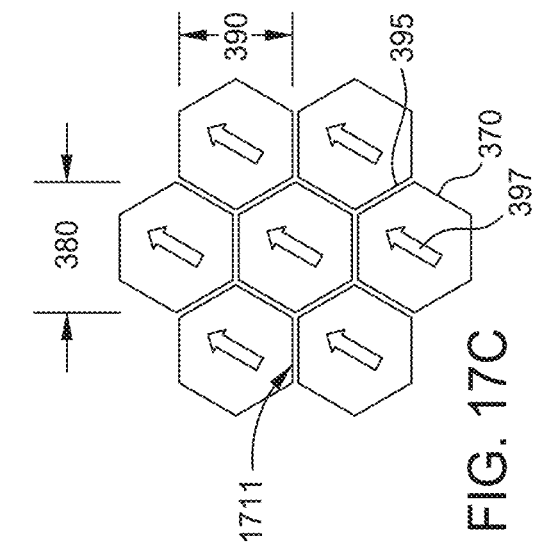
FIG. 17C
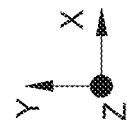

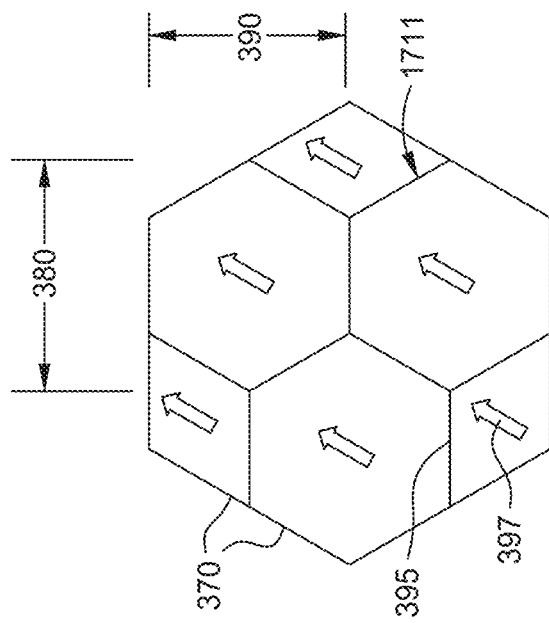
FIG. 17F
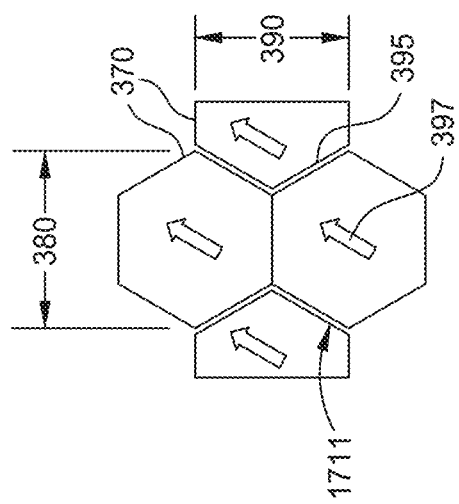
FIG. 17E
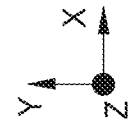

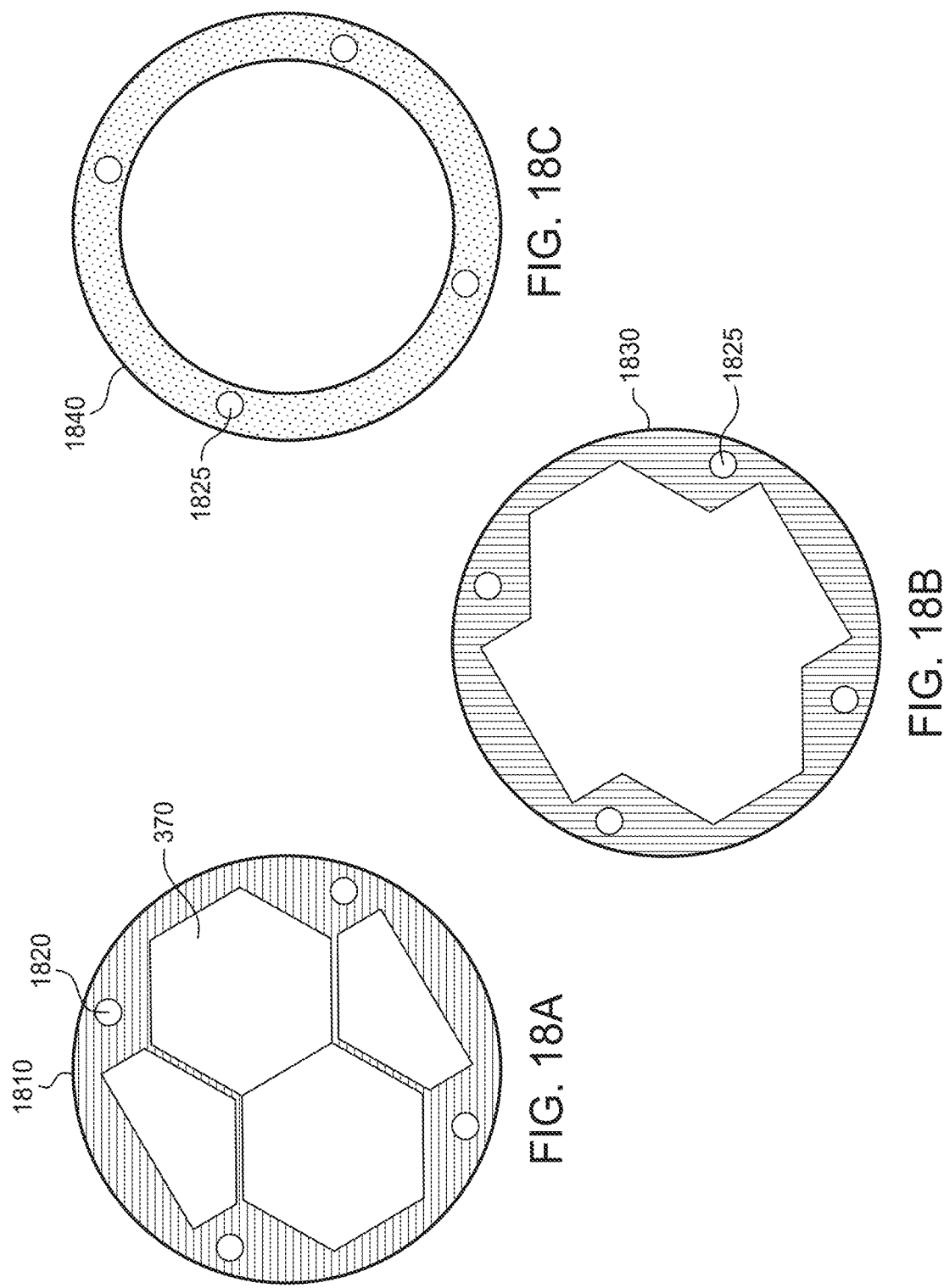

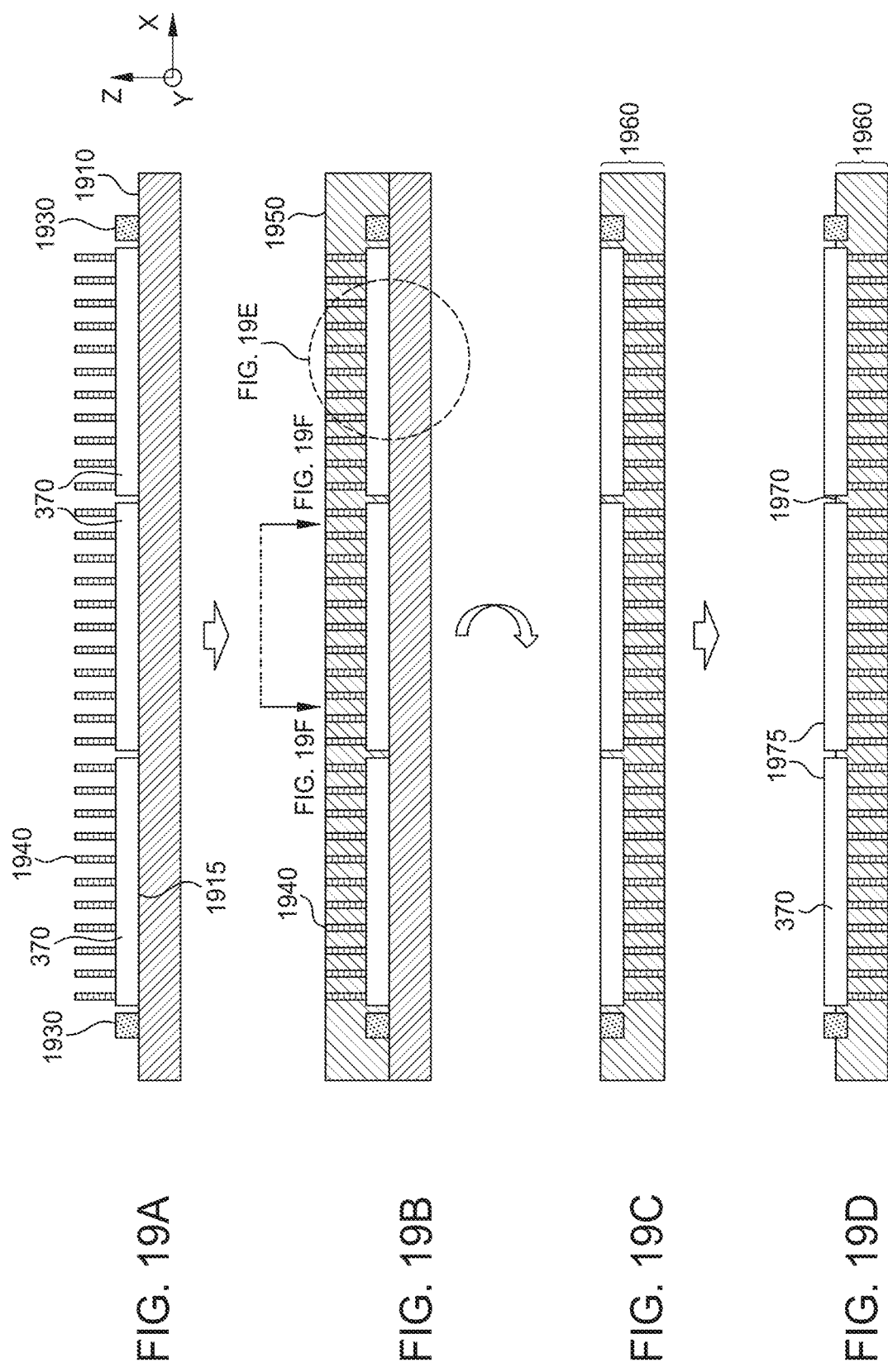

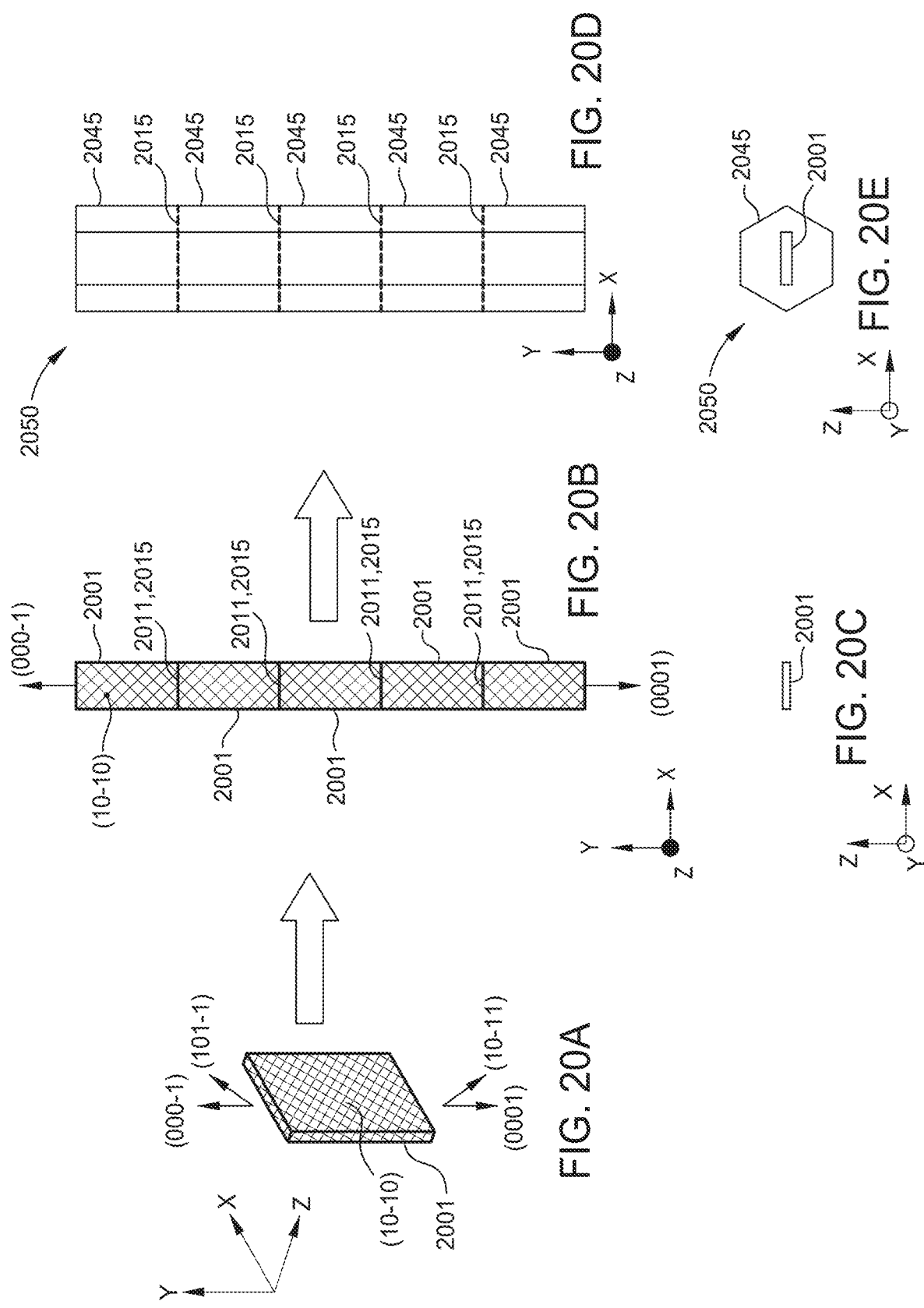

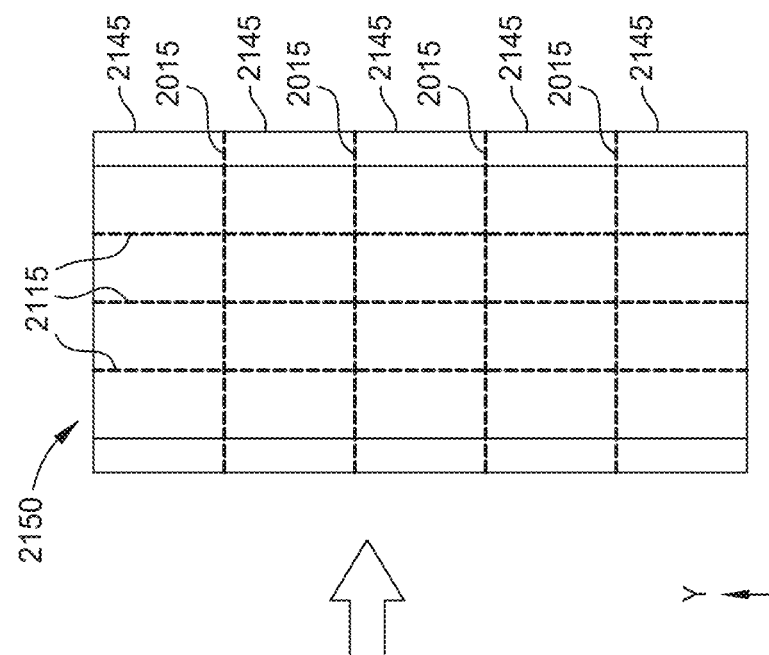
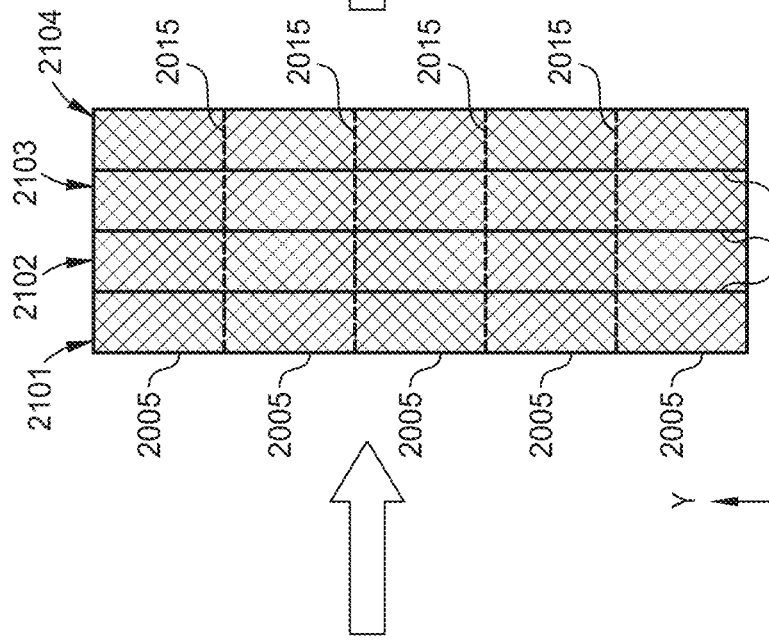
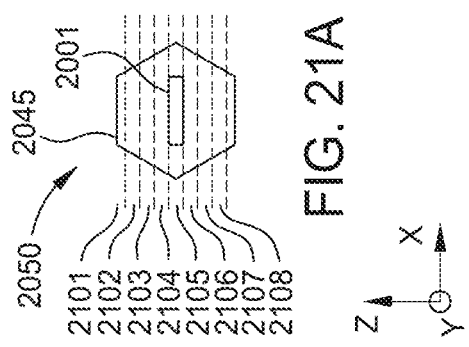
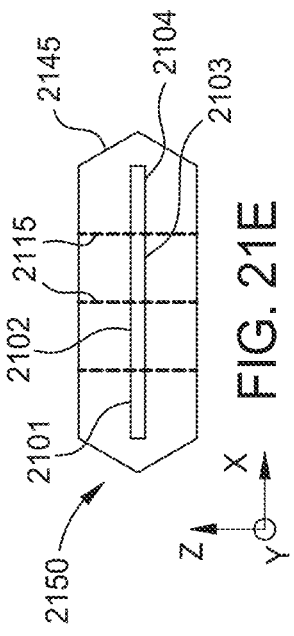

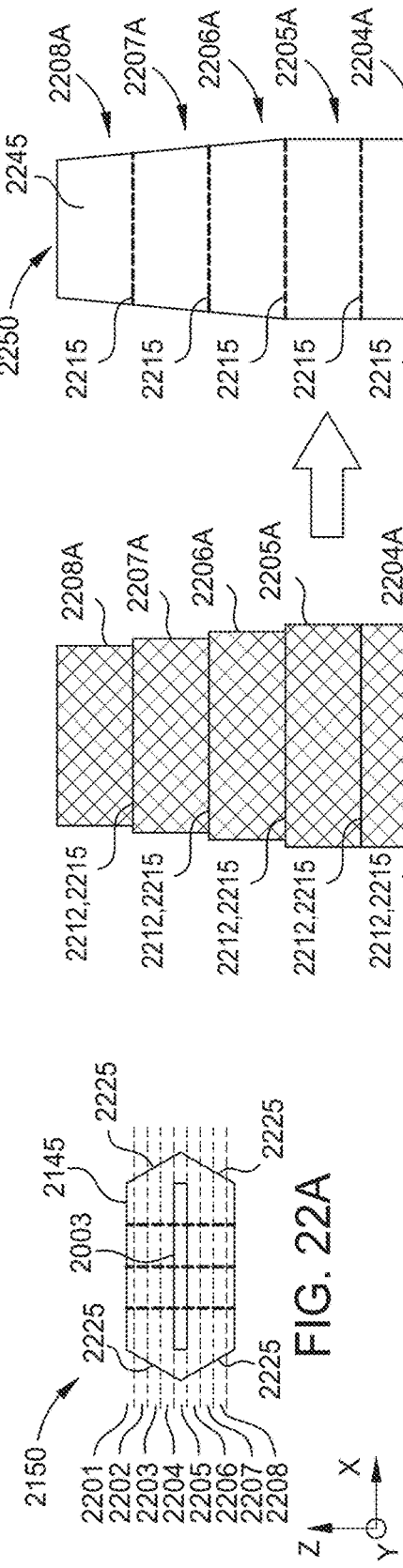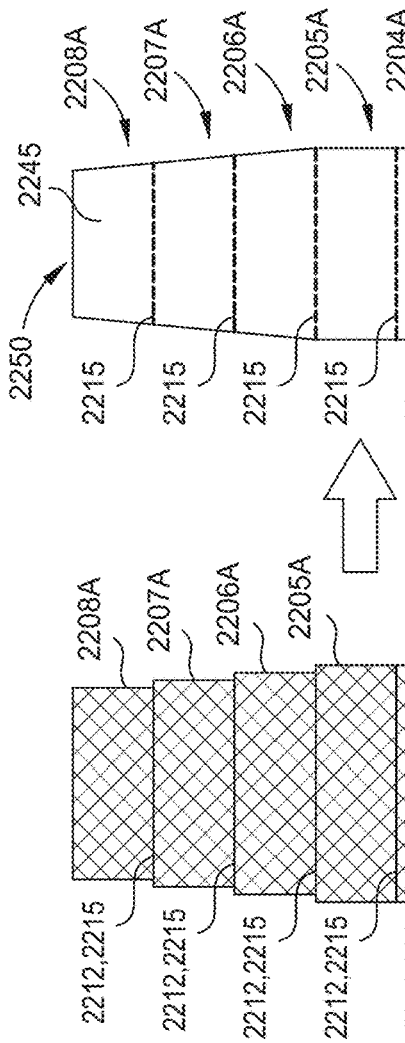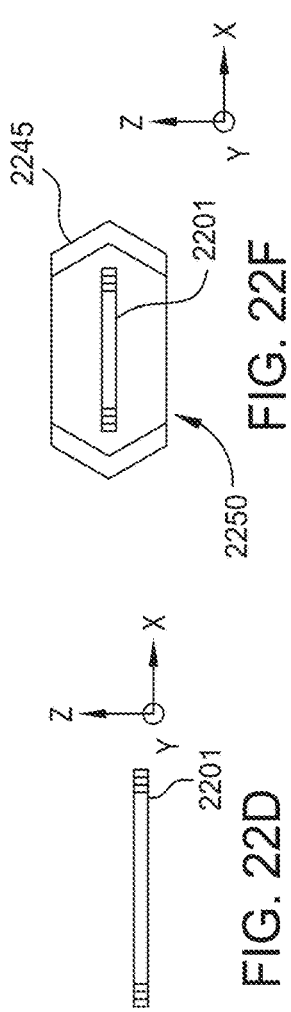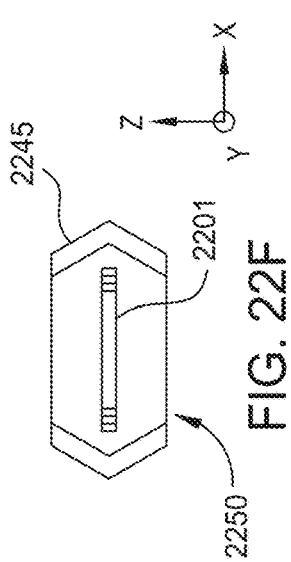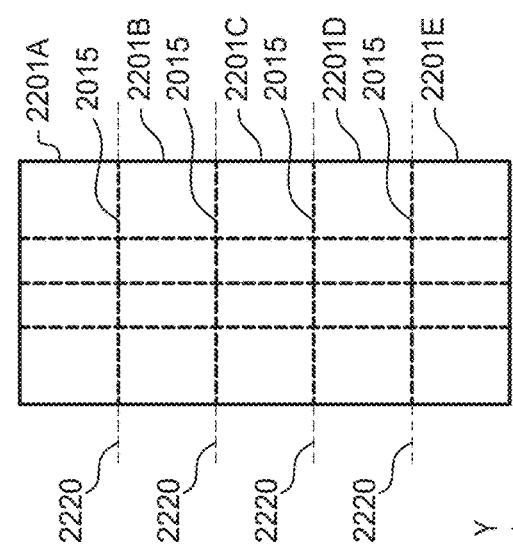
FIG. 22A
FIG. 22B
FIG. 22C
FIG. 22D
FIG. 22E
FIG. 22F

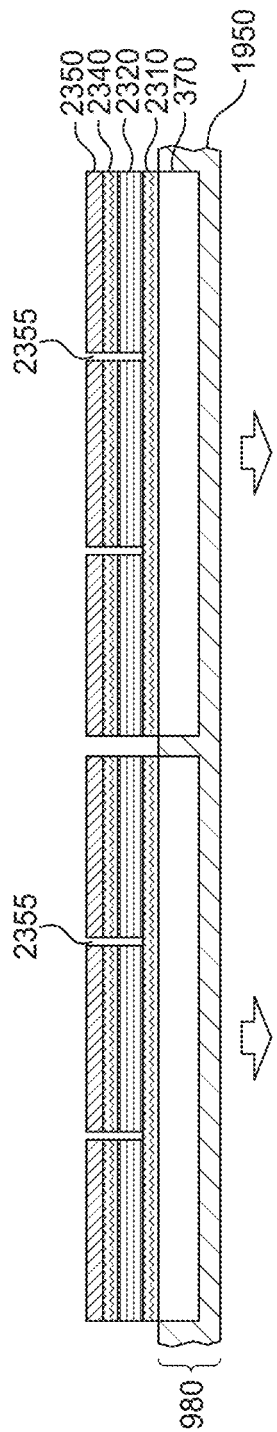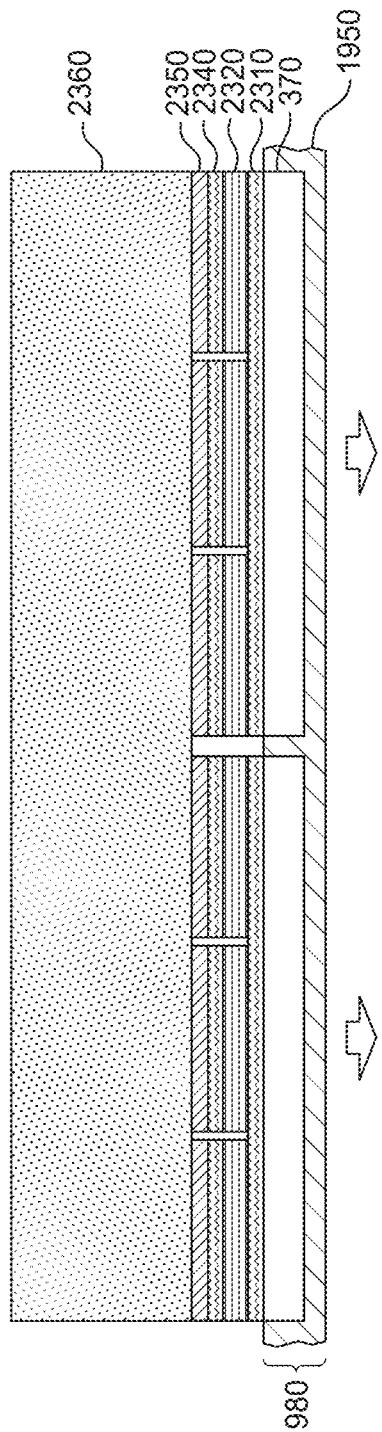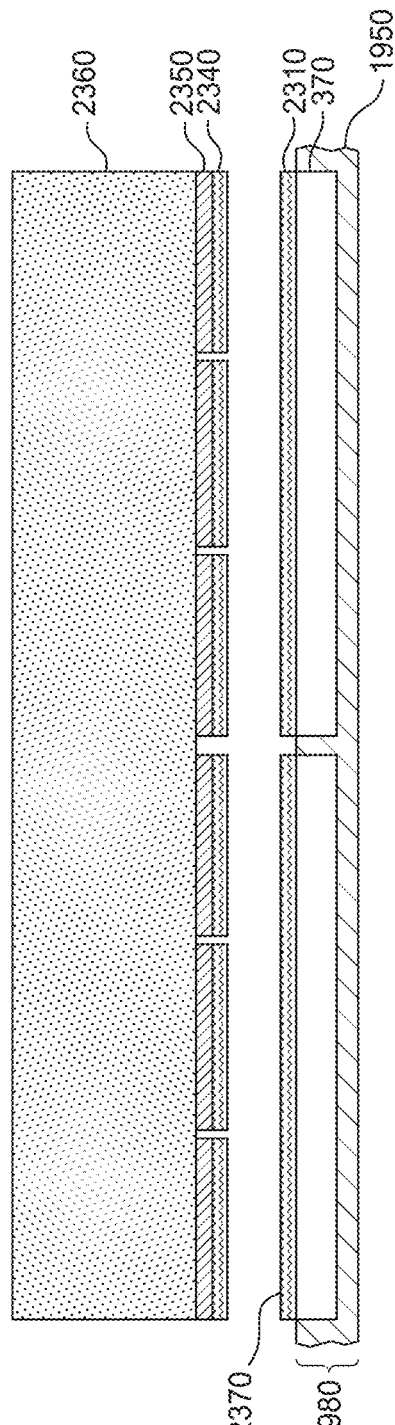

LARGE AREA GROUP III NITRIDE CRYSTALS AND SUBSTRATES, METHODS OF MAKING, AND METHODS OF USE

CROSS-REFERENCE TO RELATED APPLICATIONS

This patent application is a continuation-in-part of U.S. patent application Ser. No. 16/882,219, filed May 22, 2020, which claims the benefit of U.S. Provisional Application No. 62/975,078, filed Feb. 11, 2020. This application also claims the benefit of U.S. Provisional Application No. 63/006,700, filed Apr. 7, 2020. Each of these patent applications are incorporated by reference herein.

BACKGROUND

Field

This disclosure relates generally to techniques for processing materials for manufacture of gallium-containing nitride substrates and utilization of these substrates in optoelectronic and electronic devices. More specifically, embodiments of the disclosure include techniques for growing large area crystals and substrates using a combination of processing techniques.

Description of the Related Art

Gallium nitride (GaN) based optoelectronic and electronic devices are of tremendous commercial importance. The quality and reliability of these devices, however, is compromised by high defect levels, particularly threading dislocations, grain boundaries, and strain in semiconductor layers of the devices. Threading dislocations can arise from lattice mismatch of GaN based semiconductor layers to a non-GaN substrate such as sapphire or silicon carbide. Grain boundaries can arise from the coalescence fronts of epitaxially-overgrown layers. Additional defects can arise from thermal expansion mismatch, impurities, and tilt boundaries, depending on the details of the growth of the layers.

The presence of defects has deleterious effects on epitaxially-grown layers. Such effects include compromising electronic device performance. To overcome these defects, techniques have been proposed that require complex, tedious fabrication processes to reduce the concentration and/or impact of the defects. While a substantial number of conventional growth methods for gallium nitride crystals have been proposed, limitations still exist. That is, conventional methods still merit improvement to be cost effective and efficient.

Progress has been made in the growth of large-area gallium nitride crystals with considerably lower defect levels than heteroepitaxial GaN layers. However, most techniques for growth of large-area GaN substrates involve GaN deposition on a non-GaN substrate, such as sapphire or GaAs. This approach generally gives rise to threading dislocations at average concentrations of $10^5$-$10^7$ cm$^{-2}$ over the surface of thick boules, as well as significant bow, stress, and strain. Reduced concentrations of threading dislocations are desirable for a number of applications. Bow, stress, and strain can cause low yields when slicing the boules into wafers, make the wafers susceptible to cracking during down-stream processing, and may also negatively impact device reliability and lifetime. Another consequence of the bow, stress, and strain is that, during growth in m-plane and semipolar directions, even by near-equilibrium techniques such as ammonothermal growth, significant concentrations of stacking faults may be generated. In addition, the quality of c-plane growth may be unsatisfactory, due to formation of cracks, multiple crystallographic domains, and the like. Capability to manufacture substrates larger than 2 inches is currently very limited, as is capability to produce large-area GaN substrates with a nonpolar or semipolar crystallographic orientation. Most large area substrates are manufactured by vapor-phase methods, such as hydride vapor phase epitaxy (HVPE), which are relatively expensive. A less-expensive method is desired, while also achieving large area and low threading dislocation densities as quickly as possible.

Ammonothermal crystal growth has a number of advantages over HVPE as a means for manufacturing GaN boules. However, the performance of ammonothermal GaN crystal growth processing may be significantly dependent on the size and quality of seed crystals. Seed crystals fabricated by HVPE may suffer from many of the limitations described above, and large area ammonothermally-grown crystals are not widely available.

Legacy techniques have suggested methods for merging elementary GaN seed crystals into a larger compound crystal by a tiling method. Some of the legacy methods use elementary GaN seed crystals grown by hydride vapor phase epitaxy (HVPE) and involve polishing the edges of the elementary crystals at oblique angles to cause merger in fast-growing directions. Many or most of the legacy methods use HVPE as the crystal growth method to merge the seed crystals. Such legacy techniques, however, have limitations. Typically, for example, legacy techniques do not specify the accuracy of the crystallographic orientation, both polar and azimuthal, between the merged elementary seed crystals or provide a method capable of producing highly accurate crystallographic registry between the elementary seed crystals and minimizing defects resulting from the merging of the elementary seed crystals. Ammonothermal GaN typically has lattice constants that differ, at least slightly, from those of HVPE GaN. The presence of even a small mismatch in lattice constants can cause stress and cracking in crystals grown ammonothermally on HVPE seed crystals, particularly when tiling and coalescence are involved. Further, cracking may occur during subsequent sawing or polishing of an ammonothermally-grown crystal formed on one or more HVPE seed crystals.

Due to at least the issues described above, there is a need for substrates that have a lower defect density and are formed by techniques that improve the crystal growth process. Also, from the above, it is seen that techniques for improving crystal growth are highly desirable.

SUMMARY

Embodiments of the present disclosure include a free-standing group III metal nitride crystal. The free-standing crystal comprises a wurtzite crystal structure, a first surface having a maximum dimension greater than 40 millimeters in a first direction, an average concentration of stacking faults below $10^3$ cm$^{-1}$, an average concentration of threading dislocations between $10^1$ cm$^{-2}$ and $10^6$ cm$^{-2}$, wherein the average concentration of threading dislocations on the first surface varies periodically by at least a factor of two in the first direction, the period of the variation in the first direction being between 5 micrometers and 20 millimeters, and a miscut angle that varies by 0.1 degree or less in the central 80% of the first surface of the crystal along the first direction and by 0.1 degree or less in the central 80% of the first surface of the crystal along a second direction orthogonal to the first direction. The first surface comprises a plurality of first regions, each of the plurality of first regions having a locally-approximately-linear array of threading dislocations with a concentration between 5 cm$^{-1}$ and 10$^5$ cm$^{-1}$, the first surface further comprises a plurality of second regions, each of the plurality of second regions being disposed between an adjacent pair of the plurality of first regions and having a concentration of threading dislocations below 10$^5$ cm$^{-2}$ and a concentration of stacking faults below 10$^3$ cm$^{-1}$, and the first surface further comprises a plurality of third regions, each of the plurality of third regions being disposed within one of the plurality of second regions or between an adjacent pair of second and having a minimum dimension between 10 micrometers and 500 micrometers and threading dislocations with a concentration between 10$^3$ cm$^{-2}$ and 10$^8$ cm$^{-2}$.

Embodiments of the present disclosure include a free-standing group III metal nitride crystal comprising at least two domains. Each of the at least two domains include a group III metal selected from gallium, aluminum, and indium, or combinations thereof, and nitrogen. Each of the at least two domains has a wurtzite crystal structure and comprises a first surface having a maximum dimension greater than 10 millimeters in a first direction, an average concentration of threading dislocations between 10$^1$ cm$^{-2}$ and 1×10$^6$ cm$^{-2}$, an average concentration of stacking faults below 10$^3$ cm$^{-1}$, a symmetric x-ray rocking curve full width at half maximum less than 200 arcsec, an impurity concentration of H greater than 10$^{17}$ cm$^{-3}$, and an impurity concentration of at least one of Li, Na, K, F, Cl, Br, and I greater than 10$^{15}$ cm$^{-3}$, as quantified by calibrated secondary ion mass spectrometry. A concentration of the threading dislocations within a first surface of a domain on the first surface can vary periodically by at least a factor of two in the first direction, a period of a variation in the first direction being between 5 micrometers and 5 millimeters. The first surface comprises a plurality of first regions, each of the plurality of first regions having a locally-approximately-linear array of threading dislocations with a concentration between 5 cm$^{-1}$ and 10$^5$ cm$^{-1}$. The first surface may further comprise a plurality of second regions, each of the plurality of second regions being disposed between an adjacent pair of the plurality of first regions and having a concentration of threading dislocations below 10$^5$ cm$^{-2}$ and a concentration of stacking faults below 10$^3$ cm$^{-1}$. The first surface may further comprise a plurality of third regions, each of the plurality of third regions being disposed within one of the plurality of second regions or between an adjacent pair of second regions and having a minimum dimension between 10 micrometers and 500 micrometers and threading dislocations with a concentration between 10$^1$ cm$^{-2}$ and 10$^6$ cm$^{-2}$. The free-standing group III metal nitride crystal has a maximum dimension in the first direction greater than 40 millimeters, a crystallographic miscut varies by 0.2 degree or less in two orthogonal directions over a central 80% of the crystal along the first direction and by 0.1 degree or less in two orthogonal directions over the central 80% of the crystal along a second direction orthogonal to the first direction, and the at least two domains are separated by a line of dislocations with a linear density between about 50 cm$^{-1}$ and about 5×10$^5$ cm$^{-1}$, and a polar misorientation angle γ between a first domain and a second domain is greater than about 0.005 degrees and less than about 0.2 degrees and misorientation angles α and β are greater than about 0.01 degrees and less than about 1 degree.

Embodiments of the present disclosure include a method for forming a compound group III metal nitride crystal, comprising performing a bulk crystal growth process on a tiled array of at least two seed crystals in a crystal growth apparatus, wherein the bulk crystal growth process causes a bulk crystal layer grown from a first surface of a first seed crystal and a bulk crystal layer grown from a first surface of a second seed crystal to merge to form a compound crystal, a polar misorientation angle γ between a crystallographic orientation of the first surface of the first seed crystal and a crystallographic orientation of the first surface of the second seed crystal being greater than about 0.005 degrees and less than about 0.2 degrees and azimuthal misorientation angles α and β between the crystallographic orientations of the first surfaces of the first and second seed crystals being greater than about 0.01 degrees and less than about 1 degree, and each of the seed crystals comprising at least one of gallium, aluminum, and indium and nitrogen and having a wurtzite crystal structure and a maximum dimension of at least 5 millimeters. In some embodiments, the bulk crystal growth process is performed at a first temperature, the tiled array of at least two seed crystals are positioned on a first surface of a mechanical fixture during the bulk crystal growth process, the mechanical fixture comprises at least a backing plate member and a clamp member, each of which has a coefficient of thermal expansion that lies between 80% and 99% of the coefficient of thermal expansion of the at least two seed crystals averaged over a range between room temperature and the first temperature, and the coefficient of thermal expansion is measured in a plane parallel to the first surface.

Embodiments of the present disclosure include a method for forming a compound group III metal nitride crystal, comprising placing at least two seed crystals each having a first surface on a mechanical fixture, placing the mechanical fixture into a crystal growth apparatus, and performing a bulk crystal growth process at a second temperature, causing the first seed crystal and the second seed crystal to merge into a compound crystal, wherein each of the seed crystals comprises at least one of gallium, aluminum, and indium and nitrogen and has a wurtzite crystal structure and a maximum dimension of at least 5 millimeters. The mechanical fixture comprises at least a backing plate member and a clamp member, each of which has a coefficient of thermal expansion that lies between 80% and 99% of the coefficient of thermal expansion of the at least two seed crystals in a plane of the first surface, averaged over a range between room temperature and a second temperature, and a polar misorientation angle γ between a crystallographic orientation of the first surface of a first seed crystal and a crystallographic orientation of the first surface of a second seed crystal is greater than about 0.005 degrees and less than about 0.2 degrees and azimuthal misorientation angles α and β between the crystallographic orientations of the first surfaces of the first and second seed crystals are greater than about 0.01 degrees and less than about 1 degree.

Embodiments of the present disclosure include a method for forming a compound group III metal nitride crystal, comprising growing a polycrystalline group III metal nitride on a tiled array of at least two seed crystals, wherein the tiled array of at least two seed crystals comprises a first seed crystal that has a first surface and a second surface, and a second seed crystal that has a first surface and a second surface, and the process of growing a polycrystalline group III metal nitride on the tiled array of at least two seed crystals causes a polycrystalline group III metal nitride layer grown from the second surfaces of the first seed crystal and the second seed crystal to merge to form a tiled assembly; and performing a bulk crystal growth process on the tiled assembly in a crystal growth apparatus. The bulk crystal growth process causes a bulk crystal layer grown over the first surface of the first seed crystal and a bulk crystal layer grown over the first surface of the second seed crystal to merge to form a compound crystal, a polar misorientation angle γ between a crystallographic orientation of the first surface of the first seed crystal and a crystallographic orientation of the first surface of the second seed crystal being greater than about 0.005 degrees and less than about 0.2 degrees and azimuthal misorientation angles α and β between the crystallographic orientations of the first surfaces of the first and second seed crystals being greater than about 0.01 degrees and less than about 1 degree, and each of the seed crystals comprises at least one of gallium, aluminum, and indium and nitrogen and has a wurtzite crystal structure and a maximum dimension of at least 5 millimeters.

Embodiments of the present disclosure include a method for forming a compound group III metal nitride crystal, comprising growing a polycrystalline group III metal nitride on a tiled array of at least two seed crystals, separating the tiled assembly from a susceptor; and performing a bulk crystal growth process on the tiled assembly in a crystal growth apparatus. The tiled array of at least two seed crystals comprises a first seed crystal that has a first surface and a second surface; and a second seed crystal that has a first surface and a second surface, the tiled array of at least two seed crystals is disposed on the susceptor, the process of growing a polycrystalline group III metal nitride on the tiled array of at least two seed crystals causes a polycrystalline group III metal nitride layer deposited on the second surfaces of the first seed crystal and the second seed crystal to merge to form a tiled assembly. The bulk crystal growth process causes a bulk crystal layer grown over the first surface of the first seed crystal and a bulk crystal layer grown over the first surface of the second seed crystal to merge to form a compound crystal. A polar misorientation angle γ between a crystallographic orientation of the first surface of the first seed crystal and a crystallographic orientation of the first surface of the second seed crystal is greater than about 0.005 degrees and less than about 0.2 degrees and azimuthal misorientation angles α and β between the crystallographic orientations of the first surfaces of the first and second seed crystals are greater than about 0.01 degrees and less than about 1 degree, and each of the seed crystals comprises at least one of gallium, aluminum, and indium and nitrogen and has a wurtzite crystal structure and a maximum dimension of at least 5 millimeters.

Embodiments of the present disclosure include a method for forming a compound group III metal nitride crystal, comprising placing at least two seed crystals each having a first surface and a second surface opposite the first surface on a susceptor, placing the susceptor within a growth reactor and growing a polycrystalline group III metal nitride over the second surfaces of the at least two seed crystals to form a tiled assembly, separating the tiled assembly from the susceptor, and placing the tiled assembly into a crystal growth apparatus, and performing a bulk crystal growth process, causing the first seed crystal and the second seed crystal to merge into a compound crystal, wherein each of the seed crystals comprises at least one of gallium, aluminum, and indium and nitrogen and has a wurtzite crystal structure and a maximum dimension of at least 5 millimeters. Each of the seed crystals comprises at least one of gallium, aluminum, and indium and nitrogen and has a wurtzite crystal structure and a maximum dimension of at least 5 millimeters. A polar misorientation angle γ between a crystallographic orientation of the first surface of a first seed crystal and a crystallographic orientation of the first surface of a second seed crystal is greater than about 0.005 degrees and less than about 0.2 degrees and azimuthal misorientation angles α and β between the crystallographic orientations of the first surfaces of the first and second seed crystals are greater than about 0.01 degrees and less than about 1 degree.

Embodiments of the present disclosure include a method for forming a compound group III metal nitride crystal, comprising growing a group III metal nitride crystal layer over an array of at least two first seed crystals, wherein each of the first seed crystals in the array of at least two first seed crystals are aligned in an array that extends in a first direction, and the process of growing the group III metal nitride crystal layer forms a first tiled crystal, slicing the first tiled crystal along a second direction orthogonal to the first direction, wherein slicing the first tiled crystal forms at least two second seed crystals, and the at least two second seed crystals have a first surface, and growing a group III metal nitride crystal layer over an array of at least two second seed crystals, wherein each of the second seed crystals in the array of at least two second seed crystals are aligned in an array that extends in the first direction, and the process of growing the group III metal nitride crystal layer over the array of the at least two second seed crystals forms a second tiled crystal. The method further comprising slicing the second tiled crystal along both the second direction and the first direction to form at least two third seed crystals, and growing a group III metal nitride crystal layer over an array of at least two third seed crystals, wherein each of the third seed crystals in the array of at least two third seed crystals are aligned in an array that extends in the first direction, and the process of growing the group III metal nitride crystal layer over the array of the at least two second seed crystals forms a third tiled crystal.

Embodiments of the present disclosure include a method for forming a compound group III metal nitride crystal, comprising placing at least two first seed crystals each having a first surface and a second surface opposite the first surface on a support structure along a first direction, performing a first bulk crystal growth operation to coalesce the at least two first seed crystals to form a first one-dimensional-tiled crystal, slicing the first one-dimensional-tiled crystal along a second direction orthogonal to the first direction into at least two second seed crystals, placing the at least two second seed crystals having a first surface and a second surface opposite the first surface on a support structure along a third direction orthogonal to the first direction and to the second direction, performing a second bulk crystal growth operation to coalesce the at least two second seed crystals to form a second one-dimensional-tiled crystal, slicing the second one-dimensional-tiled crystal along both the second direction and the first direction to form at least two third seed crystals, placing the at least two third seed crystals having a first surface and a second surface opposite the first surface on a support structure along the first direction, performing a third bulk crystal growth operation to coalesce the at least two third seed crystals to form a third one-dimensional-tiled crystal having a first surface and a second surface opposite the first surface and at least two domains. Each of the at least two domains within a third one-dimensional-tiled crystal encloses at least a portion of the at two third seed crystals. A polar misorientation angle γ between a crystallographic orientation of the first surface of a first domain of the third one-dimensional-tiled crystal and a crystallographic orientation of the first surface of a second domain of the third one-dimensional-tiled crystal is greater than about 0.005 degrees and less than about 0.2 degrees and azimuthal misorientation angles α and β between the crystallographic orientations of the first surfaces of the first and second seed crystals are greater than about 0.01 degrees and less than about 1 degree. Each of the first seed crystals, the second seed crystals, and the third seed crystals comprise at least one of gallium, aluminum, and indium and nitrogen, has a wurtzite crystal structure. Each of the first seed crystals, the second seed crystals, and the third seed crystals comprise a maximum dimension of at least 5 millimeters, and the crystallographic orientations of the first surfaces of each of the first seed crystals, the second seed crystals, and the third seed crystals are identical, to within about 1 degree.

Embodiments of the present disclosure include a free-standing group III metal nitride substrate comprising at least two crystals, each of the at least two crystals comprising a group III metal selected from gallium, aluminum, and indium, or combinations thereof, and nitrogen. Each of the at least two crystals having a wurtzite crystal structure comprises a first surface having a maximum dimension greater than 10 millimeters in a first direction and a maximum dimension greater than 4 millimeters in a second direction orthogonal to the first direction, an average concentration of threading dislocations between $10^1$ cm$^{-2}$ and $1\times10^6$ cm$^{-2}$, an average concentration of stacking faults below $10^3$ cm$^{-1}$, a symmetric x-ray rocking curve full width at half maximum less than 200 arcsec. The free-standing group III metal nitride substrate has a maximum dimension in the first direction greater than 40 millimeters. The magnitude of a crystallographic miscut of the first surfaces of each of the at least two crystals is equal, to within 0.5 degree, and the directions of crystallographic miscuts of the first surfaces of each of the at least two crystals is equal, to within 10 degrees. Each of the at least two crystals is bonded to a matrix member comprising polycrystalline GaN, and a polar misorientation angle γ between a first domain and a second domain is greater than about 0.005 degrees and less than about 0.2 degrees and misorientation angles α and β are greater than about 0.01 degrees and less than about 1 degree.

Embodiments of the present disclosure include a method for fabricating a free-standing group III metal nitride substrate comprising at least two domains, the method comprising depositing a layer of polycrystalline GaN on an array of at least two seed crystals disposed on a susceptor to form a tiled composite member, and separating the tiled composite member from the susceptor. The layer of polycrystalline GaN is formed a second surface, opposite to a first surface, of each of the at least two seed crystals. Each of the at least two seed crystals comprise a group III metal selected from gallium, aluminum, and indium, or combinations thereof, and nitrogen, and the at least two seed crystals having a wurtzite crystal structure comprise a first surface having a maximum dimension greater than 10 millimeters in a first direction and a maximum dimension greater than 4 millimeters in a second direction orthogonal to the first direction, an average concentration of threading dislocations less than about $2\times10^7$ cm$^{-2}$, an average concentration of stacking faults below $10^3$ cm$^{-1}$, and a symmetric x-ray rocking curve full width at half maximum less than 200 arcsec.

Embodiments of the present disclosure include a method for fabricating a free-standing group III metal nitride substrate comprising at least two domains, the method comprising providing at least two seed crystals, each of the at least two seed crystals comprising a group III metal selected from gallium, aluminum, and indium, or combinations thereof, and nitrogen, placing the at least two seed crystals on a susceptor, depositing a layer of polycrystalline GaN on a second surface, opposite the first surface, of each of the at least two seed crystals to form a tiled composite member, and removing the tiled composite member from the susceptor. The at least two seed crystals having a wurtzite crystal structure comprise a first surface having a maximum dimension greater than 10 millimeters in a first direction and a maximum dimension greater than 4 millimeters in a second direction orthogonal to the first direction, an average concentration of threading dislocations less than about $2\times10^7$ cm$^{-2}$, an average concentration of stacking faults below $10^3$ cm$^{-1}$, and a symmetric x-ray rocking curve full width at half maximum less than 200 arcsec. A polar misorientation angle γ between the first surface of a first seed crystal and the first surface of a second seed crystal is greater than about 0.005 degrees and less than about 0.2 degrees and misorientation angles α and β are greater than about 0.01 degrees and less than about 1 degree.

Embodiments of the present disclosure include a free-standing group III metal nitride substrate, comprising an array of seed crystals, wherein each of the seed crystals in the array of seed crystals, comprise a group III metal selected from gallium, aluminum, and indium, or combinations thereof, and nitrogen, and a polycrystalline GaN layer that is disposed over at least one surface of each of the seed crystals within the array of seed crystals. Each of the seed crystals having a wurtzite crystal structure comprises a first surface having an average concentration of threading dislocations between $10^1$ cm$^{-2}$ and $1\times10^6$ cm$^{-2}$, and an average concentration of stacking faults below $10^3$ cm$^{-1}$. The magnitude of a crystallographic miscut of the first surfaces of each of the seed crystals is equal, to within 0.5 degree, and the directions of crystallographic miscuts of the first surfaces of each of the seed crystals is equal, to within 10 degrees. A polar misorientation angle γ between a first seed crystal of the array of seed crystals and a second seed crystal of the array of seed crystals is greater than about 0.005 degrees and less than about 0.2 degrees and misorientation angles α and β are greater than about 0.01 degrees and less than about 1 degree.

Embodiments of the present disclosure include a free-standing group III metal nitride crystal, comprising a wurtzite crystal structure, at least two domains, each of the at least two domains comprising a group III metal selected from gallium, aluminum, and indium, or combinations thereof, and nitrogen; a first surface having a maximum dimension greater than 40 millimeters in a first direction, the first surface comprising a domain surface of each of the at least two domains, wherein the domain surface of each of the at least two domains has a dimension of at least 10 millimeters in the first direction, an average concentration of stacking faults below $10^3$ cm$^{-1}$, and an average concentration of threading dislocations between $10^1$ cm$^{-2}$ and $10^6$ cm$^{-2}$. The average concentration of threading dislocations on the domain surface of each of the at least two domains varies periodically by at least a factor of two in the first direction, the period of the variation in the first direction being between 5 micrometers and 20 millimeters. The domain surface of each of the at least two domains comprises a plurality of first regions, each of the plurality of first regions having a locally-approximately-linear array of threading dislocations with a concentration between 5 cm$^{-1}$ and $10^5$ cm$^{-1}$. The domain surface of each of the at least two domains further comprises a plurality of second regions, each of the plurality of second regions being disposed between an adjacent pair of the plurality of first regions and having a concentration of threading dislocations below $10^5$ cm$^{-2}$ and a concentration of stacking faults below $10^3$ cm$^{-1}$.

The domain surface of each of the at least two domains further comprises a plurality of third regions, each of the plurality of third regions being disposed within one of the plurality of second regions or between an adjacent pair of second and having a minimum dimension between 10 micrometers and 500 micrometers and threading dislocations with a concentration between $10^3$ cm$^{-2}$ and $10^8$ cm$^{-2}$. The free-standing group III metal nitride crystal has a crystallographic miscut that varies by 0.5 degrees or less in two orthogonal directions over a central 80% of the crystal along the first direction and by 0.5 degree or less in two orthogonal directions over the central 80% of the crystal along a second direction orthogonal to the first direction. The at least two domains are separated by a line of dislocations with a linear density between about 50 cm$^{-1}$ and about 5×10$^5$ cm$^{-1}$, and a polar misorientation angle γ between a first domain and a second domain is greater than about 0.005 degrees and less than about 0.3 degrees and misorientation angles α and β are greater than about 0.01 degrees and less than about 1 degree.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, may admit to other equally effective embodiments.

FIGS. 1F, 1G, 1H, 1I, and 1J are top views of arrangements of openings in a patterned mask layer on a seed crystal or a substrate, according to an embodiment of the present disclosure.

FIGS. 1K and 1L are top views of arrangements of openings in a patterned mask layer on a seed crystal or a substrate, according to an embodiment of the present disclosure.

FIGS. 1M and 1N are simplified diagrams illustrating different stages of a method of forming a patterned photoresist layer on a seed crystal or a substrate, according to an alternate embodiment of the present disclosure.

FIGS. 1O and 1P are simplified diagrams illustrating a method of forming a patterned mask layer on a seed crystal or a substrate, according to an alternate embodiment of the present disclosure.

FIG. 1Q is a simplified diagram illustrating a method of forming patterned trenches within a seed crystal or a substrate, according to an embodiment of the present disclosure.

FIGS. 1R, 1S, and 1T are simplified diagrams illustrating an alternative method of forming patterned trenches within a seed crystal or a substrate, according to an embodiment of the present invention.

FIGS. 2A, 2B, and 2C are simplified diagrams illustrating an epitaxial lateral overgrowth process for forming a large area group III metal nitride crystal, according to an embodiment of the present disclosure.

FIGS. 3A, 3B, and 3C are simplified diagrams illustrating an improved epitaxial lateral overgrowth process for forming a large area group III metal nitride crystal, according to an embodiment of the present disclosure.

FIGS. 4A, 4B, and 4C are simplified diagrams illustrating a method of forming a free-standing ammonothermal group III metal nitride boule and free-standing ammonothermal group III metal nitride wafers.

FIGS. 5A-5E are simplified diagrams illustrating first threading dislocation patterns and regions on individual grains or domains of a free-standing, merged ammonothermal group III metal nitride boule or wafer, according to an embodiment of the present disclosure.

FIGS. 6A-6F are simplified diagrams illustrating second threading dislocation patterns and regions of a free-standing, merged ammonothermal group III metal nitride boule or wafer, according to an embodiment of the present disclosure.

FIG. 6G illustrates a free-standing, merged ammonothermal group III nitride boule or wafer characterized by a square pattern and formed by performing a crystal growth process on an array of tiled seed crystals that are configured as shown in FIG. 1G, according to an embodiment of the present disclosure.

FIG. 13 is a summary of x-ray diffraction measurements comparing the miscut variation across a 50 mm wafer fabricated according to one embodiment of the present disclosure with that of a commercially-available 50 mm wafer.

FIGS. 17A-17F are plan views of arrays of seed crystals, according to an embodiment of the current invention.

FIGS. 18A-18D are schematic diagrams of a fixture for holding an array of seed crystals during a substrate bulk crystal growth process, according to an embodiment of the current invention.

FIGS. 19A-19D are schematic diagrams of an array of seed crystals at various states within a process used to form a tiled composite substrate, according to an embodiment of the current invention.

FIG. 20A is a schematic diagram of a seed crystal that is adapted for use in an array of seed crystals, according to an embodiment of the current invention.

FIG. 20B is a top view of a one-dimensional array of seed crystals that include the seed crystal illustrated in FIG. 20A, according to an embodiment of the current invention.

FIG. 20C is an end view of the one-dimensional array of seed crystals illustrated in FIG. 20B, according to an embodiment of the current invention.

FIG. 20D is a top view of a one-dimensional array of seed crystals illustrated in FIG. 20B after a crystal layer has been grown thereon, according to an embodiment of the current invention.

FIG. 20E is an end view of the one-dimensional array of seed crystals illustrated in FIG. 20D, according to an embodiment of the current invention.

FIG. 21A illustrates lateral sections formed in the one-dimensional array of seed crystals illustrated in FIG. 20E by a desirable manufacturing process, according to an embodiment of the current invention.

FIG. 21B is a top view of a one-dimensional array of seed crystals that is formed using the lateral sections illustrated in FIG. 21A, according to an embodiment of the current invention.

FIG. 21C is an end view of the lateral sections of seed crystals illustrated in FIG. 21B, according to an embodiment of the current invention.

FIG. 21D is a top view of the one-dimensional array of seed crystals illustrated in FIG. 21B after a crystal layer has been grown thereon, according to an embodiment of the current invention.

FIG. 21E is a side view of the one-dimensional array of seed crystals illustrated in FIG. 21D, according to an embodiment of the current invention.

FIG. 22A illustrates lateral sections formed in the one-dimensional array of seed crystals illustrated in FIG. 21E by a desirable manufacturing process, according to an embodiment of the current invention.

FIG. 22B is a top view of the one-dimensional array of seed crystals illustrated in FIG. 22A showing slices performed along coalescence fronts, according to an embodiment of the current invention.

FIG. 22C is a top view of a one-dimensional array of seed crystals that is formed using a portion of the lateral sections formed by one or more manufacturing processes described in relation to FIGS. 22A and 22B, according to an embodiment of the current invention.

FIG. 22D is an end view of the one-dimensional array of the seed crystals illustrated in FIG. 22C, according to an embodiment of the current invention.

FIG. 22E is a top view of the one-dimensional array of seed crystals illustrated in FIG. 22C after a crystal layer has been grown thereon, according to an embodiment of the current invention.

FIG. 22F is an end view of the one-dimensional array of seed crystals illustrated in FIG. 22E, according to an embodiment of the current invention.

FIGS. 23A-23C are schematic diagrams of a composite substrate at various states within a process used to form an electronic device and recover the composite substrate, according to an embodiment of the current invention.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Figure 1A:
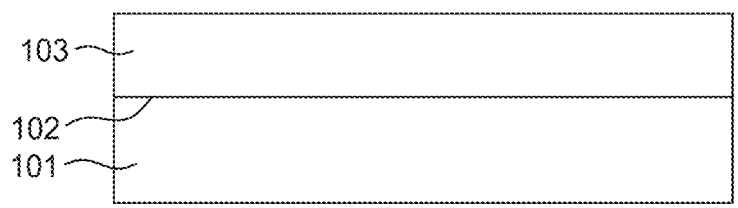
FIGS. 1A, 1B, and 1C are simplified diagrams illustrating different stages of a method of forming a patterned photoresist layer on a seed crystal or a substrate, according to an embodiment of the present disclosure.

According to the present disclosure, techniques related to techniques for processing materials for manufacture of group-III metal nitride and gallium based substrates are provided. More specifically, embodiments of the disclosure include techniques for growing large area substrates using a combination of processing techniques. In some embodiments of the disclosure, the large area substrates are referred to herein as free-standing group III metal nitride wafers. Additionally, in some embodiments, a formed or grown component that is configured to be further processed to form one or more free-standing group III metal nitride wafers is referred to herein as a free-standing group III metal nitride boule. Merely by way of example, the disclosure can be applied to growing crystals of GaN, AlN, InN, InGaN, AlGaN, and AlInGaN, and others for manufacture of bulk or patterned substrates. Such bulk or patterned substrates can be used for a variety of applications including optoelectronic devices, laser diodes, light emitting diodes, photodiodes, solar cells, photo-electrochemical water splitting and hydrogen generation, photodetectors, integrated circuits, and transistors, and others.

Threading dislocations in GaN are known to act as strong non-radiative recombination centers which can severely limit the efficiency of GaN-based LEDs and laser diodes. Non-radiative recombination generates local heating which may lead to faster device degradation (Cao et al., *Microelectronics Reliability*, 2003, 43(12), 1987-1991). In high-power applications, GaN-based devices suffer from decreased efficiency with increasing current density, known as droop. There is evidence suggesting a correlation between dislocation density and the magnitude of droop in LEDs (Schubert et al., *Applied Physics Letters*, 2007, 91(23), 231114). For GaN-based laser diodes there is a well-documented negative correlation between dislocation density and mean time to failure (MTTF) (Tomiya et al., *IEEE Journal of Selected Topics in Quantum Electronics*, 2004, 10(6), 1277-1286), which appears to be due to impurity diffusion along the dislocations (Orita et al., *IEEE International Reliability Physics Symposium Proceedings*, 2009, 736-740). For electronic devices, dislocations have been shown to markedly increase the leakage current (Kaun et al., *Applied Physics Express*, 2011, 4(2), 024101) and reduce the device lifetime (Tapajna et al., *Applied Physics Letters*, 2011, 99(22), 223501-223503) in HEMT structures. One of the primary advantages of using bulk GaN as a substrate material for epitaxial thin film growth is a large reduction in the concentration of threading dislocations in the film. Therefore, the dislocation density in the bulk GaN substrate will have a significant impact on the device efficiency and the reliability.

Lateral epitaxial overgrowth (LEO) is a method that has been widely applied to improvement in the crystallographic quality of films grown by vapor-phase methods. For example, methods whereby GaN layers were nucleated on a sapphire substrate, a $SiO_2$ mask with a periodic array of openings was deposited on the GaN layer, and then GaN was grown by metalorganic chemical vapor deposition (MOCVD) through the openings in the $SiO_2$ mask layer, grew laterally over the mask, and coalesced. The dislocation density in the areas above the openings in the mask were very high, similar to the layer below the mask, but the dislocation density in the laterally-overgrown regions was orders of magnitude less. This method is attractive because it can be applied to large area substrates, significantly reducing their dislocation density. Similar methods, with variations, have been applied by a number of groups to vapor-phase growth of GaN layers. These methods are variously referred to as LEO, epitaxial lateral overgrowth (ELO or ELOG), selective area growth (SAG), and dislocation elimination by epitaxial growth with inverse pyramidal pits (DEEP), or the like. In the case of essentially all variations of this method, it is believed that a thin heteroepitaxial GaN layer is grown on a non-GaN substrate, a patterned mask is deposited on the GaN layer, and growth is re-initiated in a one-dimensional or two-dimensional array of openings in the mask. The period or pitch of the growth locations defined by the openings in the mask is typically between 2 and 100 micrometers, typically between about 5 and 20 micrometers. The individual GaN crystallites or regions grow and then coalesce. Epitaxial growth may then be continued on top of the coalesced GaN material to produce a thick film or "ingot." A relatively thick GaN layer may be deposited on the coalesced GaN material by HVPE. The LEO process is capable of large reductions in the concentration of dislocations, particularly in the regions above the mask, typically to levels of about $10^5$-$10^7$ cm$^{-2}$. However, very often the laterally-grown wings of the formed LEO layer are crystallographically tilted from the underlying substrate ("wing tilt"), by as much as several degrees, which may be acceptable for a thin-film process but may not be acceptable for a bulk crystal growth process, as it may give rise to stresses and cracking as well as unacceptable variation in surface crystallographic orientation.

Several factors limit the capability of the LEO method, as conventionally applied, to reduce the average dislocation density below about $10^5$ to $10^7$ cm$^{-2}$, or to reduce the miscut variation across a 50 or 100 mm wafer to below about 0.1 degree. First, the pitch of the pattern of openings formed in the mask layer tends to be modest, but larger pitches may be desirable for certain applications. Second, c-plane LEO growth is generally performed in the (0001), or Ga-face direction, which creates at least two limitations. One limitation is that M-direction growth rates tend to be lower than those of (0001)-direction growth rates and semipolar (10-11) facets often form, with the consequence that the overall crystal diameter decreases with increasing thickness and making coalescence of large-pitch patterns difficult. In addition, another limitation is that growth in the (0001) direction tends to exclude oxygen, in contrast to growth in other crystallographic directions. As a consequence, there may be a significant lattice mismatch between a (0001)-grown HVPE crystal used as a seed and the crystal grown upon it by another technique. In addition, if semipolar facets form during the LEO process there may be a significant variation in oxygen (or other dopant) level, giving rise to lateral variations in the lattice constant and stresses that can cause cracking in the LEO crystal itself or in a crystal grown on the latter, used as a seed.

Variations of the LEO method have been disclosed for other group III metal nitride growth techniques besides HVPE. In a first example, Jiang, et al. (U.S. No. 2014/0147650, now U.S. Pat. No. 9,589,792) disclosed a process for ammonothermal LEO growth of group-III metal nitrides, replacing the mask layer in typical vapor-phase LEO-type processes ($SiO_2$ or $SiN_x$) by a combination of an adhesion layer, a diffusion-barrier layer, and an inert layer. In a second example, Mori, et al. (U.S. No. 2014/0328742, now U.S. Pat. No. 9,834,859) disclosed a process for LEO growth of group-III metal nitrides in a sodium-gallium flux. However, in this method the coalescing crystallites typically have prominent semipolar facets, leading to significant lateral variation in the impurity content of coalesced crystals, and the thermal expansion mismatch between the coalesced nitride layer and a hetero-substrate, which includes a different material than the coalesced nitride layer, may cause uncontrolled cracking.

Several authors, for example, Linthicum et al. (*Applied Physics Letters*, 75, 196, (1999)), Chen et al. (*Applied Physics Letters* 75, 2062 (1999)), and Wang, et al. (U.S. Pat. No. 6,500,257) have noted that threading dislocations in growing GaN normally propagate predominantly in the growth direction and showed that the dislocation density can be reduced even more than in the conventional LEO method by growing from the sidewalls of trenches in thin, highly-defective c-plane GaN layers rather than vertically through windows in a patterned mask. These methods have been extended to nonpolar- and semipolar-oriented thin GaN films by other authors, for example, Chen et al. (*Japanese Journal of Applied Physics* 42, L818 (2003)) and Imer et al. (U.S. Pat. No. 7,361,576). However, to the best of the inventors' knowledge, sidewall LEO methods have not yet been extended to growth of bulk GaN, nor to the growth of N-sector GaN. In particular, we have found that different methods that those used in the thin film studies work best to form trenches several hundred microns deep with pitches on the millimeter scale and produce some unexpected benefits.

FIGS. 1A-1T are schematic cross-sectional views of a seed crystal or a substrate during various stages of a method for forming a patterned mask seed layer for ammonothermal sidewall lateral epitaxial overgrowth. Referring to FIG. 1A, a substrate 101 is provided with a photoresist layer 103 disposed thereon. Substrate 101 and the subsequently formed layers described in relation to FIGS. 1A-1T can be used in a subsequent tiling operation, as discussed further in relation to FIGS. 2A-2C, 3A-3E, and 17A-22F. In certain embodiments, some of the layer forming process steps described in relation to FIGS. 1A-1T are performed subsequently to some of the process steps in a tiling operation, as discussed further in relation to FIGS. 17A-F, for example. In certain embodiments, substrate 101 consists of or includes a substrate material that is a single-crystalline group-III metal nitride, gallium-containing nitride, or gallium nitride. The substrate 101 may be grown by HVPE, ammonothermally, or by a flux method. One or both large area surfaces of substrate 101 may be polished and/or chemical-mechanically polished. A large-area surface 102 of substrate 101 may have a crystallographic orientation within 5 degrees, within 2 degrees, within 1 degree, or within 0.5 degree of (0001) +c-plane, (000-1) −c-plane, {10−10} m-plane, {11−2±2}, {60−6±1}, {50−5±1}, {40−4±1}, {30−3±1}, {50−5±2}, {70−7±3}, {20−2±1}, {30−3±2}, {40−4±3}, {50−5±4}, {10−1±1}, {1 0−1±2}, {1 0−1±3}, {2 1−3±1}, or {3 0−3±4}. It will be understood that plane {3 0−3±4} means the {3 0−3 4} plane and the {3 0−3 −4} plane. Large-area surface 102 may have an (h k i l) semipolar orientation, where i=−(h+k) and l and at least one of h and k are nonzero. Large-area surface 102 may have a maximum lateral dimension between about 5 millimeters and about 600 millimeters and a minimum lateral dimension between about 1 millimeter and about 600 millimeters and substrate 101 may have a thickness between about 10 micrometers and about 10 millimeters, or between about 100 micrometers and about 2 millimeters.

Substrate 101 may have a surface threading dislocation density less than about $10^7$ cm$^{-2}$, less than about $10^6$ cm$^{-2}$, less than about $10^5$ cm$^{-2}$, less than about $10^4$ cm$^{-2}$ less than about $10^3$ cm$^{-2}$, or less than about $10^2$ cm$^{-2}$. Substrate 101 may have a stacking-fault concentration below about $10^4$ cm$^{-1}$, below about $10^3$ cm$^{-1}$, below about $10^2$ cm$^{-1}$, below about 10 cm$^{-1}$ or below about 1 cm$^{-1}$. Substrate 101 may have a symmetric x-ray rocking curve, for example, (002) in the case of c-plane, full width at half maximum (FWHM) less than about 500 arcsec, less than about 300 arcsec, less than about 200 arcsec, less than about 100 arcsec, less than about 50 arcsec, less than about 35 arcsec, less than about 25 arcsec, or less than about 15 arcsec. Substrate 101 may have a non-symmetric x-ray rocking curve, for example, (201) in the case of c-plane, full width at half maximum (FWHM) less than about 500 arcsec, less than about 300 arcsec, less than about 200 arcsec, less than about 100 arcsec, less than about 50 arcsec, less than about 35 arcsec, less than about 25 arcsec, or less than about 15 arcsec. Substrate 101 may have a crystallographic radius of curvature greater than 0.1 meter, greater than 1 meter, greater than 10 meters, greater than 100 meters, or greater than 1000 meters, in at least one, at least two, or in three independent or orthogonal directions.

Substrate 101 may comprise regions having a relatively high concentration of threading dislocations separated by regions having a relatively low concentration of threading dislocations. The concentration of threading dislocations in the relatively high concentration regions may be greater than about $10^5$ cm$^{-2}$, greater than about $10^6$ cm$^{-2}$ greater than about $10^7$ cm$^{-2}$, or greater than about $10^8$ cm$^{-2}$. The concentration of threading dislocations in the relatively low concentration regions may be less than about $10^6$ cm$^{-2}$, less than about $10^5$ cm$^{-2}$, or less than about $10^4$ cm$^{-2}$. Substrate 101 may comprise regions having a relatively high electrical conductivity separated by regions having a relatively low electrical conductivity. Substrate 101 may have a thickness between about 10 microns and about 100 millimeters, or between about 0.1 millimeter and 10 millimeters. Substrate 101 may have a maximum dimension, including a diameter, of at least about 5 millimeters, at least about 10 millimeters, at least about 25 millimeters, at least about 50 millimeters, at least about 75 millimeters, at least about 100 millimeters, at least about 150 millimeters, at least about 200 millimeters, at least about 300 millimeters, at least about 400 millimeters, or at least about 600 millimeters.

Large-area surface 102 (FIG. 1A) may have a crystallographic orientation within about 5 degrees of the (000-1) N-face, c-plane orientation, may have an x-ray diffraction ω-scan rocking curve full-width-at-half-maximum (FWHM) less than about 200 arcsec less than about 100 arcsec, less than about 50 arcsec, or less than about 30 arcsec for the (002) and/or the (102) and/or the (201) reflections and may have an average dislocation density less than about $10^7$ cm$^{-2}$, less than about $10^6$ cm$^{-2}$, less than about $10^5$ cm$^{-2}$, or less that about $10^4$ cm$^{-2}$. In some embodiments, the threading dislocations in large-area surface 102 are approximately uniformly distributed. In other embodiments, the threading dislocations in large-area surface 102 are arranged inhomogenously as a one-dimensional array of rows of relatively high- and relatively low-concentration regions or as a two-dimensional array of high-dislocation-density regions within a matrix of low-dislocation-density regions. The crystallographic orientation of large-area surface 102 may be constant to less than about 1 degree, less than about 0.5 degrees, less than about 0.2 degrees, less than about 0.1 degrees, or less than about 0.05 degrees, less than about 0.02 degrees, or less than about 0.01 degrees. In certain embodiments, large-area surface 102 is roughened to enhance adhesion of a mask layer, for example, by wet-etching, to form a frosted morphology.

Figure 1B:
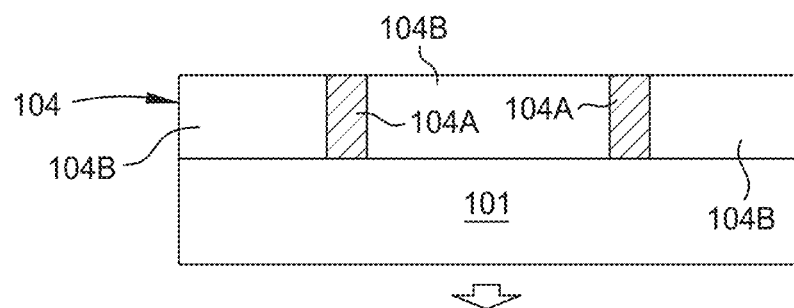
Figure 1C:
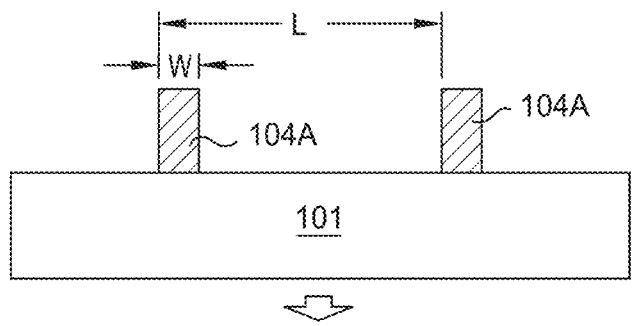

Referring again to FIG. 1A, a photoresist layer 103 may be deposited on the large-area surface 102 by methods that are known in the art. For example, in a certain embodiment of a lift-off process, a liquid solution of a negative photoresist is first applied to large-area surface 102. Substrate 101 is then spun at a high speed (for example, between 1000 to 6000 revolutions per minute for 30 to 60 seconds), resulting in a uniform photoresist layer 103 on large-area surface 102. Photoresist layer 103 may then be baked (for example, between about 90 and about 120 degrees Celsius) to remove excess photoresist solvent. After baking, the photoresist layer 103 may then be exposed to UV light through a photomask (not shown) to form a patterned photoresist layer 104 (FIG. 1B) having a pre-determined pattern of cross-linked photoresist, such as regions 104A, formed within the unexposed regions 104B. The regions 104B of the patterned photoresist may form stripes or dots having characteristic width or diameter W and pitch L. The patterned photoresist layer 104 may then be developed to remove non-cross linked material found in regions 104B and leave regions 104A, such as illustrated in FIG. 1C.

Figure 1D:
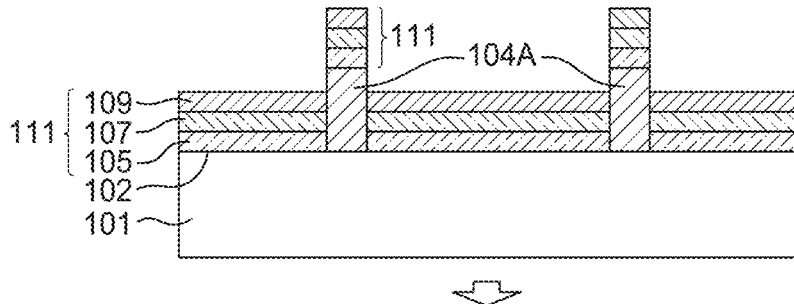
FIGS. 1D and 1E are simplified diagrams illustrating a method of forming a patterned mask layer on a seed crystal or a substrate, according to an embodiment of the present disclosure.
Figure 1E:
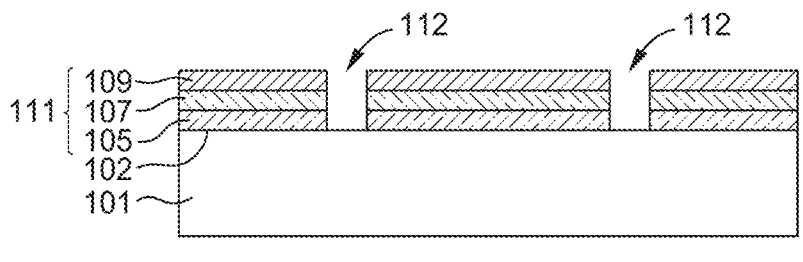

Referring to FIG. 1D, one or more patterned mask layers 111 may be deposited on large-area surface 102 and regions 104A of the patterned photoresist layer 104. The one or more patterned mask layers 111 may comprise an adhesion layer 105 that is deposited on the large-area surface 102, a diffusion-barrier layer 107 deposited over the adhesion layer 105, and an inert layer 109 deposited over the diffusion-barrier layer 107. The adhesion layer 105 may comprise one or more of Ti, TiN, TiN$_y$, TiSi$_2$, Ta, TaN$_y$, Al, Ge, Al$_x$Ge$_y$, Cu, Si, Cr, V, Ni, W, TiW$_x$, TiW$_x$N$_y$, or the like and may have a thickness between about 1 nanometer and about 1 micrometer. The diffusion-barrier layer 107 may comprise one or more of TiN, TiN$_y$, TiSi$_2$, W, TiW$_x$, TiN$_y$, WN$_y$, TaN$_y$, TiW$_x$N$_y$, TiW$_x$Si$_z$N$_y$, TiC, TiCN, Pd, Rh, Cr, or the like, and have a thickness between about 1 nanometer and about 10 micrometers. The inert layer 109 may comprise one or more of Au, Ag, Pt, Pd, Rh, Ru, Ir, Ni, Cr, V, Ti, or Ta and may have a thickness between about 10 nanometers and about 100 micrometers. The one or more patterned mask layers 111 may be deposited by sputter deposition, thermal evaporation, electron-beam evaporation, or the like. After deposition of the patterned mask layer(s) 111, the portion of the patterned mask layer(s) 111 residing above the regions 104A of the patterned photoresist layer 104 are not in direct contact with the substrate 101, as shown in FIG. 1D. The regions 104A and portions of the patterned mask layer(s) 111 disposed thereon are then lifted off by methods that are known in the art to form the openings 112 in the patterned mask layer(s) 111, as shown in FIG. 1E. In certain embodiments, a relatively thin inert layer, for example, 10 to 500 nanometers thick, is deposited prior to the lift-off process. After performing the lift-off process, an additional, thicker inert layer, for example, 5 to 100 micrometers thick, may be deposited over the already-patterned inert layer by electroplating, electroless deposition, or the like.

Other methods besides the lift-off procedure described above may be used to form the patterned mask layer 111, including shadow masking, positive resist reactive ion etching, wet chemical etching, ion milling, and nanoimprint lithography, plus variations of the negative resist lift-off procedure described above.

In certain embodiments, patterned mask layer(s) 111 are deposited on both the front and back surfaces of substrate 101.

FIGS. 1F-1L are top views of arrangements of exposed regions 120 on the substrate 101 formed by one or more of the processed described above. The exposed regions 120 (or also referred to herein as growth centers), which are illustrated, for example, in FIGS. 1F-1L, may be defined by the openings 112 formed in patterned mask layer(s) 111 shown in FIG. 1E. In certain embodiments, the exposed regions 120 are arranged in a one-dimensional (1D) array in the y-direction, such as a single column of exposed regions 120 as shown in FIG. 1I. In certain embodiments, the exposed regions 120 are arranged in a two-dimensional (2D) array in x- and y-directions, such as illustrated in FIGS. 1F-1H and 1J-1L. The openings 112, and thus exposed regions 120, may be round, square, rectangular, triangular, hexagonal, or the like, and may have an opening dimension or diameter W between about 1 micrometer and about 5 millimeters, or between about 10 micrometers and about 500 micrometers such as illustrated in FIGS. 1F-1L. The exposed regions 120 may be arranged in a 2D hexagonal or square array with a pitch dimension L between about 5 micrometers and about 20 millimeters, between about 200 micrometers and about 15 millimeters, or between about 500 micrometers and about 10 millimeters, or between about 0.8 millimeter and about 5 millimeters, such as illustrated in FIGS. 1F and 1G. The exposed regions 120 may be arranged in a 2D array, in which the pitch dimension $L_1$ in the y-direction and pitch dimension $L_2$ in the x-direction may be different from one another, as illustrated in FIGS. 1H and 1J-1L. The exposed regions 120 may be arranged in a rectangular, parallelogram, hexagonal, or trapezoidal array (not shown), in which the pitch dimensions $L_1$ in the y-direction and $L_2$ in the x-direction may be different from one another, as illustrated in FIGS. 1H and 1J-1L). The array of exposed regions 120 may also be linear or irregular shaped. The exposed regions 120 in patterned mask layer(s) 111 may be placed in registry with the structure of substrate 101. For example, in certain embodiments, large-area surface 102 is hexagonal, e.g., a (0001) or (000-1) crystallographic orientation, and the openings in patterned mask layer(s) 111 comprise a 2D hexagonal array such that the separations between nearest-neighbor openings are parallel to <11-20> or <10-10> directions in large-area surface 102. In certain embodiments, large-area surface 102 of the substrate is nonpolar or semipolar and the exposed regions 120 comprise a 2D square or rectangular array such that the separations between nearest-neighbor openings are parallel to the projections of two of the c-axis, an m-axis, and an a-axis on large-area surface 102 of substrate 101. In certain embodiments, the pattern of exposed regions 120 is obliquely oriented with respect to the structure of substrate 101, for example, wherein the exposed regions 120 are rotated by between about 1 degree and about 44 degrees with respect to a high-symmetry axis of the substrate, such as a projection of the c-axis, an m-axis, or an a-axis on large-area surface 102 of substrate 101 that has a hexagonal crystal structure, such as a Wurtzite crystal structure. In certain embodiments, the exposed regions 120 are substantially linear rather than substantially round. In certain embodiments, the exposed regions 120 are slits having a width W and period L that run across the entire length of substrate 101, as illustrated in FIG. 1I. In certain embodiments, the exposed regions 120 are slits that have a width W1 in the y-direction and a predetermined length $W_2$ in the x-direction that is less than the length of substrate 101 and may be arranged in a 2D linear array with period $L_1$ in the y-direction and period $L_2$ in the x-direction, as illustrated in FIGS. 1J-1L. In some embodiments, adjacent rows of exposed regions 120 (e.g., slits) may be offset in the x-direction from one another rather than arranged directly adjacent, as shown in FIG. 1K. In certain embodiments, the adjacent rows of exposed regions 120 (e.g., slits) may be offset in the longitudinal y-direction from one another. In certain embodiments, the exposed regions 120 include slits that extend in two or more different directions, for example, the x-direction and the y-direction, as shown in FIG. 1L. In certain embodiments, the exposed regions 120 (e.g., slits) may be arranged in a way that reflects the hexagonal symmetry of the substrate. In certain embodiments, exposed regions 120 (e.g., slits) may extend to the edge of the substrate 101.

In certain embodiments, the pattern of openings is terminated by a predetermined distance from the edge of the substrate, for example, by a distance between 10 micrometers and 5 millimeters, between 20 micrometers and 2 millimeters, between 50 micrometers and 1 millimeter, or between 100 micrometers and 500 micrometers. The termination of the pattern(s) form a rim that surrounds the edge of the substrate. The rim can have a width equal to the predetermined distance, which can be used to improve the integrity and robustness of the edges of the patterned mask layers, for example. The rim, as well as the edges of the substrate, may be covered by patterned mask layers 111.

In an alternative embodiment, as shown in FIG. 1M, large-area surface 102 of substrate 101 is covered with a blanket mask 116, comprising one, two, or more of adhesion layer 105, diffusion-barrier layer 107, and inert layer 109, followed by a positive photoresist layer 113. The photoresist layer is exposed to UV light through a photomask (not shown), forming solubilizable, exposed regions 106B and unexposed regions 106A, as shown in FIG. 1N (essentially the negative of the pattern shown in FIG. 1B). Exposed regions 106B are then removed by developing. As shown in FIG. 1O, openings 112 in the blanket mask 116 (comprising adhesion layer 105, diffusion-barrier layer 107, and inert layer 109) may then be formed by wet or dry etching through the openings in patterned photoresist layer 113A, to form the patterned mask layer 111. After forming the openings 112 the photoresist layer 113 is removed, as shown in FIG. 1P, producing a structure that is similar or identical to that shown in FIG. 1E.

Trenches 115 are then formed in exposed regions 120 of the substrate 101 through the openings 112 (or "windows") formed in patterned mask layer 111, as shown in FIG. 1Q. In certain embodiments, the depth of the trenches 115 is between 50 micrometers and about 1 millimeter or between about 100 micrometers and about 300 micrometers. In certain embodiments the trenches 115 penetrate the entire thickness of substrate 101, forming patterned holes or slits that extend from the rear side 118 of the substrate 101 and through the openings 112 of the patterned mask layer 111. The width of an individual trench may be between about 10 micrometers and about 500 micrometers, or between about 20 micrometers and about 200 micrometers. Individual trenches 115 may be linear or curved and may have a length in the X-direction and/or Y-direction between about 100 micrometers and about 50 millimeters, or between about 200 micrometers and about 10 millimeters, or between about 500 micrometers and about 5 millimeters. In a specific embodiment, large-area surface 102 of substrate 101 has a (000-1), N-face orientation and trench 115 is formed by wet etching. In a specific embodiment, an etchant composition or solution comprises a solution of 85% phosphoric acid ($H_3PO_4$) and sulfuric ($H_2SO_4$) acids with a $H_2SO_4/H_3PO_4$ ratio between 0 and about 1:1. In certain embodiments, a phosphoric acid solution is conditioned to form polyphosphoric acid, increasing its boiling point. For example, reagent-grade (85%) $H_3PO_4$ may be conditioned by stirring and heating in a beaker at a temperature between about 200 degrees Celsius and about 450 degrees Celsius for between about 5 minutes and about five hours. In a specific embodiment, trench 115 is formed by heating masked substrate 101 in one of the aforementioned etch solutions at a temperature between about 200 degrees Celsius and about 350 degrees Celsius for a time between about 15 minutes and about 6 hours. In another embodiment, trench 115 is formed by electrochemical wet etching.

FIGS. 1R-1T show an alternative approach to forming an array of patterned, masked trenches in substrate 101. A blanket mask 116 (comprising adhesion layer 105, diffusion-barrier layer 107, and inert layer 109) may be deposited on large-area surface 102 of substrate 101 as shown in FIG. 1R. Nascent trenches 114 may be formed by laser ablation, as shown in FIG. 1S, to form a patterned mask layer 111. The laser ablation process is also known as or referred to as laser machining or laser beam machining processes. Laser ablation may be performed by a watt-level laser, such as a neodymium-doped yttrium-aluminum-garnet (Nd:YAG) laser, a $CO_2$ laser, an excimer laser, a Ti:sapphire laser, or the like. The laser may emit pulses with a pulse length in the nanosecond, picosecond, or femtosecond range. In certain embodiments the frequency of the output light of the laser may be doubled, tripled, or quadrupled using an appropriate nonlinear optic. The beam width, power, and scan rate of the laser over the surface of substrate 101 with patterned mask layer 111 may be varied to adjust the width, depth, and aspect ratio of nascent trenches 114. The laser may be scanned repetitively over a single trench or repetitively over the whole array of trenches.

The surfaces and sidewalls of the nascent trenches 114 may contain damage left over from the laser ablation process. In certain embodiments, substrate 101, containing nascent trenches 114, is further processed by wet etching, dry etching, or photoelectrochemical etching in order to remove residual damage in nascent trenches 114 as shown in FIG. 1T. In a specific embodiment, large-area surface 102 of substrate 101 has a (000-1), N-face orientation and a trench 115 is formed from nascent trench 114 by wet etching. In a specific embodiment, an etchant composition or solution comprises a solution of 85% phosphoric acid ($H_3PO_4$) and sulfuric ($H_2SO_4$) acids with a $H_2SO_4/H_3PO_4$ ratio between 0 and about 1:1. In certain embodiments, a phosphoric acid solution is conditioned to form polyphosphoric acid, increasing its boiling point. For example, reagent-grade (85%) $H_3PO_4$ may be conditioned by stirring and heating in a beaker at a temperature between about 200 degrees Celsius and about 450 degrees Celsius for between about 5 minutes and about five hours. In a specific embodiment, trench 115 is formed by heating substrate 101 in one of the aforementioned etch solutions at a temperature between about 200 degrees Celsius and about 350 degrees Celsius for a time between about 15 minutes and about 6 hours.

After performing one or more of the processes described above on the substrate 101, a crystal growth process can be performed on a single substrate 101 or on an array of substrates 101 at the same time. The single substrate 101 or array of substrates 101 act as a seed crystal or seed crystals, respectively, during the crystal growth process. FIGS. 17A-17F illustrate some examples of various arrays of seed crystals 370, such as substrates 101, which can be used during a crystal growth process. Referring to FIGS. 17A-17F, at least some of the edges 395 of two or more seed crystals 370 are prepared for tessellation to form a one- or two-dimensional array of tile crystals. The seed crystals 370 may each be prepared in a square shape (FIG. 17A), a rectangular shape (FIG. 17B), a hexagonal shape (FIG. 17C), a mix of a rhombus and a triangular shape (FIG. 17D), a mix of a hexagonal and a pentagonal shape (FIG. 17E), a mix of a hexagonal and a rhombus shape (FIG. 17F), or other shapes, or combinations thereof. Square or rectangular shapes may be preferred when surface 102 has a nonpolar or semipolar orientation. Hexagonal, rhombus, triangular, rhombohedral, pentagonal, or trapezoidal shapes may be preferred when surface 102 has a (000±1) c-plane orientation. Triangular, tetragonal, or pentagonal shapes may be useful for defining the outer perimeter of the array of seed crystals. In certain embodiments, some or all of the edges 395 of the seed crystals 370 are prepared such that the intersection of the edge with large-area surface 102 is parallel, to within 0.5 degree, 0.2 degree, 0.1 degree, 0.05 degree, 0.02 degree, or 0.01 degree, to a plane chosen from {11–20} a-plane, (000±1) c-plane, {10–10} m-plane, {10–1±1}, or a plane defined by a perpendicular to large-area surface 102 and an axis chosen from the c-axis, an m-axis, or an a-axis. In certain embodiments, the edges 395 are prepared with a root-mean-square surface roughness that is less than 10 micrometers, less than 5 micrometers, less than 2 micrometers, or less than 1 micrometer. In certain embodiments, the edges 395 are prepared prior to pattern deposition and patterning, as described above and in FIGS. 1A-1T, so that patterned mask layer 111 extends from large-area surface 102 over at least a portion of the edges. In certain embodiments, edges 395 are prepared by at least one of a dicing saw, a wire saw, and a laser. In certain embodiments, the edges 395 also include an orientation flat, such as missing corner, or an orientation groove, so as to simplify tracking of the crystallographic orientation of each seed crystal 370.

Figure 19G:
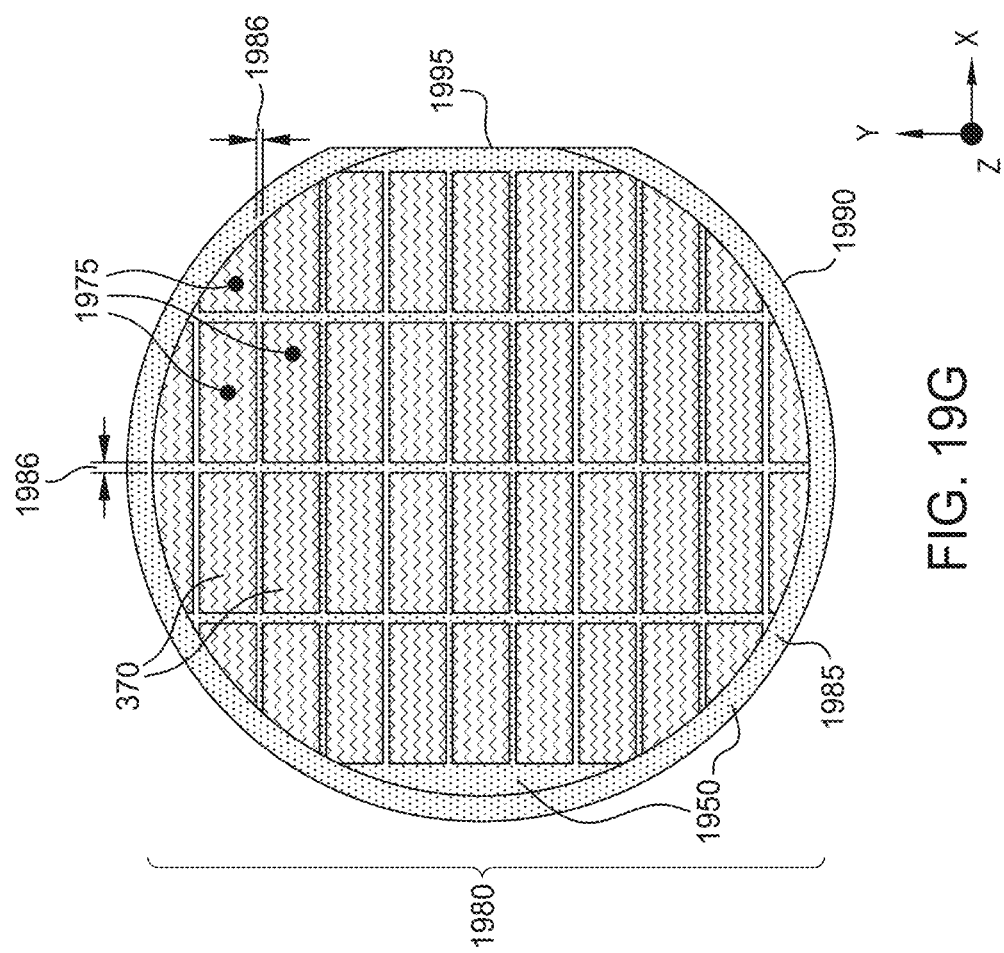
FIG. 19G is a top view of a tiled composite substrate, according to an embodiment of the current invention.
Figure 19E:
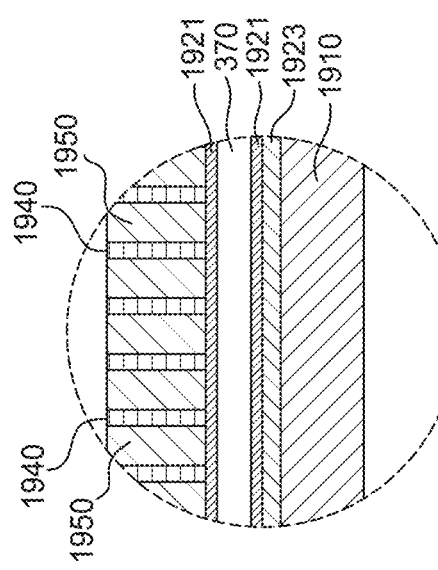
FIG. 19E is a close-up view of a portion of seed crystal within the array of seed crystals illustrated in FIG. 19B, according to an embodiment of the current invention.

In certain embodiments, many, most, or all of the seed crystals 370 positioned in an array are prepared such that they have, accurately, the same size and shape. For example, the X-direction dimensions 380 of each of the nominally-identical seed crystals 370 in the array may be equal to within 0.5 millimeter, 0.2 millimeter, 0.1 millimeter, 50 micrometers, 20 micrometers, 10 micrometers, 5 micrometers, 2 micrometers, or 1 micrometer. In certain embodiments, X-direction dimension 380 is between 4 millimeters and 10 millimeters, between 10 millimeters and 15 millimeters, between 15 millimeters and 25 millimeters, between 25 millimeters and 50 millimeters, between 50 millimeters and 100 millimeters, or between 100 millimeters and 150 millimeters. Similarly, the Y-direction dimensions 390 of each of the nominally-identical seed crystals in the array may be equal to within 0.5 millimeter, 0.2 millimeter, 0.1 millimeter, 50 micrometers, 20 micrometers, 10 micrometers, 5 micrometers, 2 micrometers, or 1 micrometer. Similarly, the Y-direction dimensions 390 of each of the nominally-identical seed crystals in the array may be equal to within 0.5 millimeter, 0.2 millimeter, 0.1 millimeter, 50 micrometers, 20 micrometers, 10 micrometers, 5 micrometers, 2 micrometers, or 1 micrometer. In certain embodiments, Y-direction dimension 390 is between 8 millimeters and 10 millimeters, between 10 millimeters and 15 millimeters, between 15 millimeters and 25 millimeters, between 25 millimeters and 50 millimeters, between 50 millimeters and 100 millimeters, or between 100 millimeters and 150 millimeters. In certain embodiments, some of the edges 395, specifically, the outward-facing edges in the array of seed crystals, may be cut to be circular or elliptical sections, rather than straight lines, in order to enable a curved or approximately circular or elliptical perimeter 1985 of the array of seed crystals 370, as illustrated in FIG. 19G. In certain embodiments, the starting point for seed crystals 370 are wafers, with a predominantly round perimeter, and portions of the original edges are retained while other edges are prepared as described above for tessellation.

In certain embodiments, a backside and, optionally, one or more edges and/or a front side, of one or more seed crystals is coated with a mechanically-compliant coating, or interfacial layer 1921 (FIG. 19E), which is configured to accommodate any extrinsic or intrinsic stress formed between the seed crystal 370 and deposited layers or structures disposed thereon without either the seed crystal 370 or the deposited layers or structures undergoing cracking or other failure. The mechanically-compliant coating may include or consist of one or more of graphite, pyrolytic graphite, boron nitride, pyrolytic boron nitride, molybdenum disulfide, and tungsten disulfide. In certain embodiments, the mechanically-compliant coating is deposited by at least one of sputtering, chemical vapor deposition, plasma-enhanced chemical vapor deposition, high density plasma chemical vapor deposition, and electron-beam evaporation. In certain embodiments, the mechanically-compliant coating is not fully dense and is deposited by one or more of spraying particles suspended in a slurry, screen printing of particles suspended in a slurry, painting of particles suspended in a slurry, plasma spraying, or the like. In certain embodiments the mechanically-compliant coating is subjected to a heat treatment process to partially or fully sinter particles in the mechanically-compliant coating.

In some embodiments, the thicknesses of each of seed crystals 370 are equal, to within 50 micrometers, to within 25 micrometers, to within 10 micrometers (μm), to within 5 micrometers, to within 2 micrometers, or to within 1 micrometer. In certain embodiments, a uniform seed thickness will improve the mechanical integrity of a clamped array of seed crystals. In certain embodiments, a uniform seed thickness will enhance the co-planarity of the top surface of the seed crystals. In certain embodiments, a uniform seed thickness may enhance both the mechanical integrity and thermal uniformity of the composite structure being fabricated. The crystallographic miscut of each of the large-area surfaces 102 of seed crystals 370 has a magnitude and a direction 397. For example, if a particular c-plane seed crystal is miscut by 0.50 degrees in the m-direction and by 0.06 degrees in an orthogonal a-direction, the magnitude of the miscut is approximately 0.504 degrees and its direction is 6.8 degrees away from a particular m-direction. In some embodiments, the magnitudes of each of the crystallographic miscuts of seed crystals 370 are equal, within 0.2 degree, within 0.1 degree, within 0.05 degree, within 0.02 degree, or within 0.01 degree. In some embodiments, the directions 397 of the crystallographic miscuts of each of the seed crystals are aligned to within 10 degrees, within 5 degrees, within 2 degrees, within 1 degree, within 0.5 degree, within 0.2 degree, or within 0.1 degree.

In certain embodiments, an array of seed crystals 370 is placed in a mechanical fixture, as shown schematically in FIGS. 18A-18D. This embodiment may be suitable when there are small number of seed crystals, or when each seed crystal can be held in place by clamping a portion of the periphery of each seed crystal in the array of seed crystals. For example, this technique may be used with the seed crystal arrays shown in FIGS. 17E and 17F, but not with the seed crystal arrays shown in FIGS. 17A-D. The seed crystals 370 may be placed on a backing plate 1810 (FIG. 18A), a retaining ring 1830 (FIG. 18B) may be placed around the perimeter of the array of seed crystals 370, and a clamp ring 1840 (FIG. 18C) may be placed on top of retaining ring 1830. Each of backing plate 1810, retaining ring 1830, and clamp ring 1840 may have three or more through-holes 1820, 1825 for attachment by a set of fasteners, such as screws, bolts, or threaded rods. In certain embodiments through-holes 1820 are tapped while through-holes 1825 are bored through. In preferred embodiments, each of backing plate 1810, retaining ring 1830, and clamp ring 1840 are fabricated from a material having a coefficient of thermal expansion (CTE) that is slightly smaller than that of seed crystals 370, such as molybdenum. In certain embodiments, through-holes 1820 are located to the periphery of seed crystals 370. In certain embodiments, at least one seed crystal 370 is penetrated by a through-hole that is aligned with a least one through-hole 1820 or 1825 in backing plate 1810. In certain embodiments, one or more of backing plate 1810, retaining ring 1830, and clamp ring 1840 may be coated with a release coating to simplify removal of a merged crystal from the fixture components. In certain embodiments, the release coating inhibits deposition or adhesion of GaN on the mechanical components. In certain embodiments, the release coating provides mechanical compliance between the seed crystal and the fixture components, accommodating stress due to residual CTE mismatch without cracking or failure. The release coating may include or consist of one or more of graphite, boron nitride, molybdenum disulfide, or tungsten disulfide. In certain embodiments, the release coating is not fully dense and is deposited by one or more of spraying particles suspended in a slurry, screen printing of particles suspended in a slurry, painting of particles suspended in a slurry, or the like.

In some embodiments, it is desirable to form at least some portion of the mechanical fixture out of molybdenum (Mo), since Mo is known to have a CTE of approximately $5.8 \times 10^{-6}$/K, when averaged over the temperature range of 20 degrees Celsius and 1000 degrees Celsius. In some embodiments the alloy of Mo is chosen such that its recrystallization temperature exceeds the maximum temperature that the mechanical fixture will reach during the crystal growth process. If the recrystallization temperature is exceeded during processing, grain growth can occur in the Mo substrate resulting in changes in the stress state of the material, which can lead to embrittlement of the material after it is subsequently cooled. Doping of Mo with Titanium and Zirconium to produce what is commercially referred to as titanium-zirconium-molybdenum (TZM) alloy, is known to increase the recrystallization temperature relative to Mo to the range of 1200 degrees Celsius to 1400 degrees Celsius, which is 200 degrees Celsius to 300 degrees Celsius higher than the recrystallization temperature of elemental Mo and 100 degrees Celsius to 600 degrees Celsius higher than the epitaxial growth temperature. TZM is a dilute alloy of Mo (greater than 98% and preferably at least 99%), Ti (between 0.2% and 1.0%), Zr (between 0% and 0.3%), and C (between 0% and 0.1%). Other alloys are also possible. For example, the CTE of alloys of MoW, averaged over the temperature range of 20-1000 degrees Celsius, can be engineered to fall in the range of $4.9 \times 10^{-6}$/K and $5.8 \times 10^{-6}$/K. The CTE of the mechanical fixture component material may be engineered to be between 80% and 99%, between 85% and 98%, between 90 and 97%, or between 94% and 96% of the CTE of the crystals in the plane of the first surface.

The flatness of the mechanical fixture components is such that the amount of warp across their diameter should not exceed 0.1% of their diameter, and preferably should not exceed 0.02%. Warp is herein defined as the sum of the maximum positive and maximum negative deviation of the fixture component top surface from an imaginary flat plane, where the imaginary flat plane is selected to be that plane which intersects the fixture component top surface and minimizes the magnitude of the warp.

The clearance between the retaining ring and the array of seed crystals 370 may be chosen so that the clearance shrinks to nearly zero at a predetermined temperature used for bulk crystal growth, causing each of the seed crystals 370 to be positioned so that there is little to no gap between adjacent edges of neighbors, ensuring accurate crystallographic alignment of the seed crystals 370. In one example, the gap 1711 (FIGS. 17A-17F) between adjacent edges of the seed crystals 370 is between zero and 200 micrometers, between 0.1 micrometer and 50 micrometers, or between 0.2 micrometer and 50 micrometers. In certain embodiments, each of backing plate 1810, retaining ring 1830, and clamp ring 1840 is fabricated from molybdenum or a molybdenum alloy, such as MoW or TZM or silver-clad or silver-clad Mo, W, or Ni. In certain embodiments, the materials used to prepare at least one of backing plate 1810, retaining ring 1830, and clamp ring 1840 are annealed to remove residual stresses before machining. In certain embodiments, mesa structures are incorporated into backing plate 1810 at positions of the intersections of two, three or more seed crystals. In certain embodiments, the tops of the mesas are ground to be accurately flat and co-planar, so as to improve the alignment accuracy or planarity of a surface of the seed crystals 370 that is parallel to the flat or co-planar surfaces of the mesas. In certain embodiments, additional components are incorporated into the mechanical fixture, such as spacer pads or springs. The additional components may be fabricated from materials that are compatible with an ammonothermal crystal growth environment, such as at least one of molybdenum, tungsten, tantalum, niobium, silver, gold, platinum, or iridium.

Figure 18D:
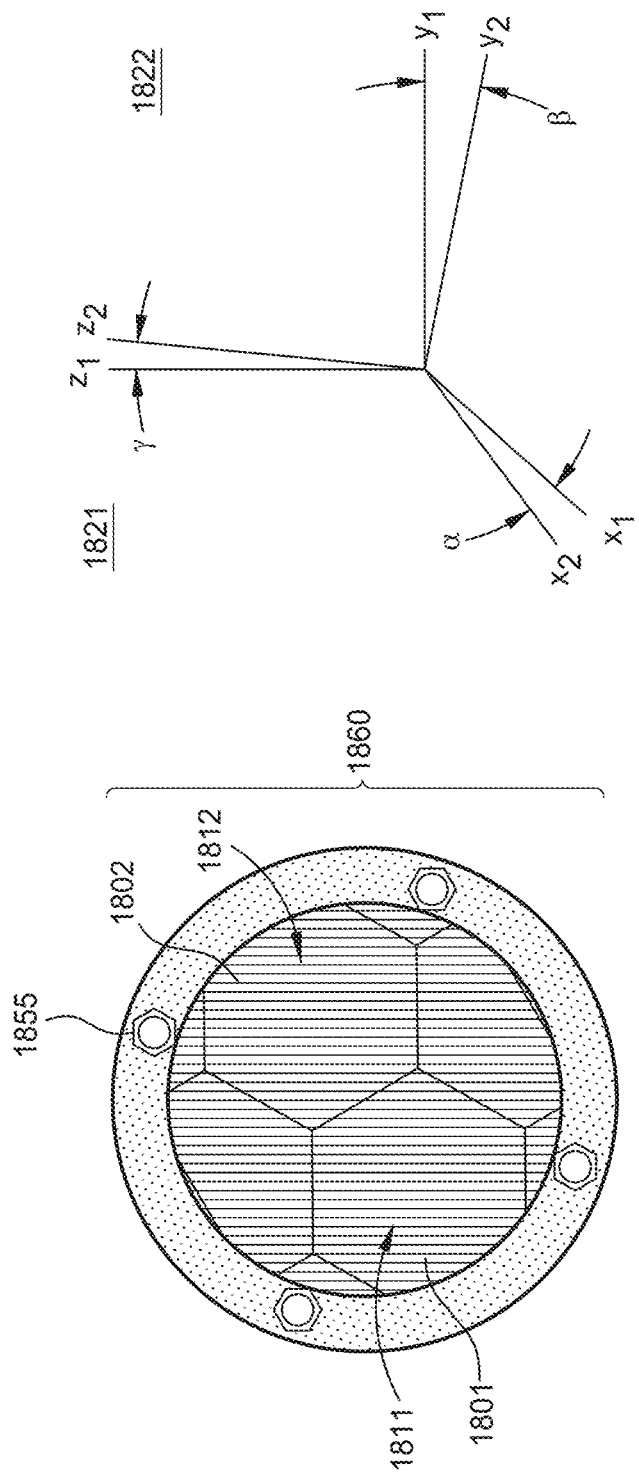

After assembling the array of seed crystals in the fixture, the fixture may be fastened together using at least three screws, bolts, threaded rod and nuts, or similar fasteners 1855 to form tiled array 1860 (FIG. 18D).

The mechanical fixture is designed and fabricated in such a way that the crystallographic orientations between each of the group III nitride crystals positioned on the fixture, or positioned within the fixture, are substantially identical. Referring again to FIG. 18D, first coordinate system 1821 ($x_1$ $y_1$ $z_1$) represents the crystallographic orientation of a first group III nitride crystal 1801, where $z_1$ is the negative surface normal of the nominal orientation of the surface 1811 of first group III nitride crystal 1801, and $x_1$ and $y_1$ are vectors that are orthogonal to $z_1$. For example, if surface 1801 has a (0 0 0 1) orientation, then $z_1$ is a unit vector along [0 0 0–1], and $x_1$ and $y_1$ may be chosen to be along [1 0–1 0] and [1–2 1 0], respectively. If surface 1811 has a (1 0–1 0) orientation, then $z_1$ is a unit vector along [–1 0 1 0] and $x_1$ and $y_1$ may be chosen to be along [1–2 1 0] and [0 0 0 1], respectively. Similarly, second coordinate system 1822 ($x_2$ $y_2$ $z_2$) represents the crystallographic orientation of the second nitride crystal 1802, where $z_2$ is the negative surface normal of the nominal orientation of surface 1812 of second nitride crystal 1802 and $x_2$ and $y_2$ are vectors that are orthogonal to $z_2$, where the same convention is used for the crystallographic directions corresponding to ($x_2$ $y_2$ $z_2$) as for ($x_1$ $y_1$ $z_1$). The crystallographic misorientation between the surface of first nitride crystal and the surface of second nitride crystal may be specified by the three angles $\alpha$, $\beta$, and $\gamma$, where $\alpha$ is the angle between $x_1$ and $x_2$, $\beta$ is the angle between $y_1$ and $y_2$, and $\gamma$ is the angle between $z_1$ and $z_2$. Because the surface orientations of the first and second nitride crystals are nearly identical, the polar misorientation angle $\gamma$ is very small, for example, less than 0.5 degree, less than 0.2 degree, less than 0.15 degree, less than 0.1 degree, less than 0.05 degree, less than 0.02 degree, or less than 0.01 degree. Because of the precise control in the orientation of the nitride crystals during placement, the misorientation angles $\alpha$ and $\beta$ are also very small, for example, less than 1 degree, less than 0.5 degree, less than 0.2 degree, less than 0.1 degree, less than 0.05 degree, less than 0.02 degree, or less than 0.01 degree. Typically, $\gamma$ will be less than or equal to $\alpha$ and $\beta$. The crystallographic misorientation between additional, adjacent nitride crystals is similarly very small. However, the crystallographic misorientation angles $\alpha$, $\beta$, and $\gamma$ may be detectable by x-ray measurements and may be greater than about 0.005 degree, greater than about 0.01 degree, greater than about 0.02 degree, greater than about 0.05 degree, greater than about 0.1 degree, or greater than about 0.2 degree.

In the embodiment described above the mechanical fixture supporting the array of seed crystals may have a CTE that is similar to, but slightly less than, the CTE of the seed crystals themselves. In another embodiment, a polycrystalline group III nitride containing supporting structure is used in place of the molybdenum material in the mechanical fixture. The polycrystalline group III nitride may be textured or highly textured. Since the CTE of GaN differs by approximately 12% between the a and c directions, for example, polycrystalline GaN will not have a precise CTE match to single-crystal GaN seed crystals. However, the mismatch is small and the temperature dependence of the CTE in the a and c directions are similar. In addition, in the limit that the polycrystalline GaN material is highly textured in the c-direction, its CTE in the lateral direction will closely approximate the CTE of single-crystal GaN in the a-direction. Exemplary methods for fabricating textured, polycrystalline group III metal nitride are described in U.S. Pat. Nos.

8,039,412 8,461,071, RE47114, 10,094,017, and 10,619, 239, each of which is incorporated by reference in its entirety.

In certain embodiments, used to support an array of seed crystals 370 during processing, the array of seed crystals 370 is placed on a supporting surface 1915 of a susceptor 1910, as shown in FIG. 19A. This embodiment may be suitable for each of the seed arrays shown schematically in FIGS. 17A-F. In some embodiments, a spacer (not shown) of a desired size is disposed between the adjacent edges of each of the seed crystals 370 so that a defined and regular spacing can be maintained in at least one direction, such as the X-direction, or even the X-direction and the Y-direction. The spacer may include a machined block or a wire of a desired diameter. The spacing between adjacent edges of each of the seed crystals 370 may be set such that the spacing is less than 2 millimeters (mm), such as such as between 0.1 micrometer (μm) and 1 millimeters (mm), or between 0.1 micrometer and 200 micrometers, between 0.1 micrometer and 50 micrometers, or between 0.2 micrometer and 50 micrometers.

Susceptor 1910 may include or consist of one or more of $SiO_2$, graphite, pyrolytic boron nitride (PBN), SiC-coated graphite, PBN-coated graphite, TaC-coated graphite, molybdenum, or molybdenum alloy. In certain embodiments, a surface 1915 of susceptor 1910 facing one or more seed crystals may be coated with a release coating 1923. The release coating 1923 may include or consist of one or more of graphite, boron nitride, molybdenum disulfide, or tungsten disulfide. In certain embodiments, the release coating 1923 is not fully dense and is deposited by one or more of spraying particles suspended in a slurry, screen printing of particles suspended in a slurry, painting of particles suspended in a slurry, or the like. In certain embodiments the array of seed crystals 370 is surrounded by a retainer ring 1930 that is disposed over the supporting surface 1915. In certain embodiments, retainer ring 1930 includes or consists of a material with a slightly smaller CTE than GaN, for example, molybdenum or a molybdenum alloy. In certain embodiments susceptor 1910 is machined to have hollow regions or formed depressions in the supporting surface 1915 that are formed in the shapes of seed crystals 370 in order to facilitate accurate alignment of the seed crystals and crystal planes formed therein to one another. In certain embodiments, retainer ring 1930 includes or consists of a wire. In certain embodiments, a large area surface of one or more seed crystals having a mechanically-compliant coating (e.g., interfacial layer 1921 in FIG. 19E) formed therebetween is placed in contact with the supporting surface 1915 of the susceptor 1910. In certain embodiments, a large area surface of one or seed crystals having a mechanically-compliant coating (e.g., interfacial layer 1921) is positioned on a side that is opposite to the supporting surface 1915 of the susceptor 1910. The mechanically-compliant coating is used to relieve some of the extrinsic and intrinsic stress formed between the seed crystal(s) 370 and the susceptor 1910 and/or the seed crystal(s) 370 and a porous member 1940 and/or polycrystalline GaN layer 1950 disposed on an opposing side, which are discussed below.

Figure 19F:
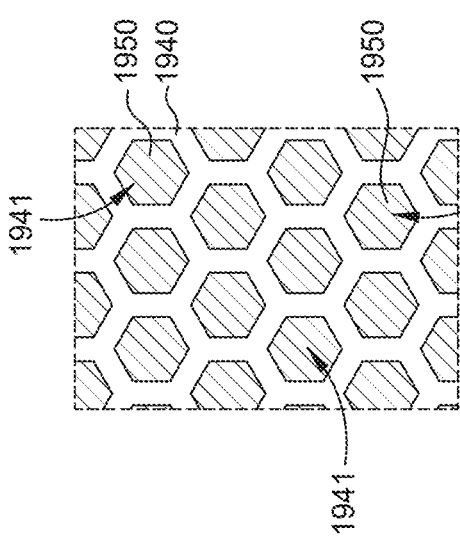
FIG. 19F is a top section-view of a portion of a structure that includes a porous member and polycrystalline GaN layer, as illustrated in FIG. 19B, according to an embodiment of the current invention.

In certain embodiments, a porous member 1940 is placed over one or more of the seed crystals 370, and is configured to minimize the extrinsic stress induced in the seed crystals 370 due to the CTE mismatch created between the seed crystals 370 and the porous member 1940. The porous member 1940 is also useful to reduce the stress induced in the seed crystals 370 due to the CTE mismatch created between the seed crystals 370 and the subsequently deposited polycrystalline GaN layer 1950 formed thereover. In certain embodiments, porous member 1940 has a honeycomb structure, as illustrated in FIG. 19F. The porous member 1940 may include or consist of one or more of graphite, carbon fiber, silica fiber, aluminosilicate fiber, borosilicate fiber, a silicon carbide coating, a pyrolytic boron nitride coating, a pyrolytic graphite coating, or a polymer.

As part of a process used to form a support for the array of seed crystals 370, the susceptor 1910, with the array of seed crystals 370 positioned precisely on it, may be placed into a reactor capable of polycrystalline GaN synthesis. The polycrystalline-GaN reactor may then be closed, evacuated, and back-filled with nitrogen. The temperature of the susceptor 1910 in the reactor may be raised to approximately 900° C. and a bake-out in a mixture of 5% $H_2$ in $N_2$ may be performed for approximately 24 hours to remove oxygen and moisture from the furnace. After the nitrogen bake-out, for example, 1.2 standard liters per minute of $Cl_2$ may flowed through a source chamber containing gallium at a temperature of approximately 850 degrees Celsius and the effluent may be mixed with a flow of 15 standard liters per minute of $NH_3$ in a nitrogen carrier gas. The process may be run for approximately 30 hours, the reactive gases may be stopped, and the reactor may be cooled. A textured, polycrystalline GaN layer 1950, approximately 1 millimeter thick, may be deposited on the array of seed crystals 370, producing a structure similar to that shown schematically in FIG. 19B. Openings, gaps 1941, or pores within porous member 1940, if present, are partially or fully filled with polycrystalline GaN. In certain embodiments, porous member 1940 becomes completely encased (not shown) within polycrystalline GaN. In certain embodiments, one or more components of porous member 1940, for example, a polymer disposed within the material used to form the porous member 1940, undergoes partial or complete decomposition during deposition of polycrystalline GaN layer 1950, and thus allows the material within the porous member 1940 to develop one or more desired mechanical properties.

After forming the polycrystalline GaN layer 1950, the tiled composite structure 1960, containing seed crystals 370, which are bonded together by polycrystalline GaN layer 1950, may then be separated from susceptor 1910, as shown schematically in FIG. 19C. As a component of the tiled composite structure 1960, which also includes at least the array of seed crystals 370, the polycrystalline GaN layer 1950 is often referred to herein as a matrix member. While the tiled composite structure 1960 and polycrystalline GaN layer or matrix member 1950 illustrated in FIGS. 19C-19F includes a porous member 1940, this configuration is not intended to limiting as to the scope of the disclosure provided herein. In some embodiments, the matrix member may optionally include the porous member 1940. In certain embodiments, the susceptor 1910 is separated from tiled composite structure 1960 by use of a mechanical process that is used to break any bond formed between the susceptor 1910 and the components within the tiled composite structure 1960. In one example, a mechanical shear force is applied between the susceptor 1910 and tiled composite structure 1960 to causes a portion of a release coating 1923 or an interfacial layer 1921, which is disposed therebetween, to crack and fail, and thus allow the susceptor 1910 and tiled composite structure 1960 to be separated. In other embodiments susceptor 1910 is dissolved, for example, in a mineral acid or base.

In certain embodiments of the tiled composite structure 1960, gaps 1970 are formed between adjacent tiled seed crystals 370, as shown schematically in FIG. 19D. The formed gaps 1970 may be helpful during subsequent processing steps, such as a merging process, to inhibit growth of polycrystalline GaN layer 1950 from interfering with lateral growth from seed crystals 370. Gaps 1970 may have a width between about 1 micrometer and about 5 millimeters, between about 5 micrometers and about 1 millimeter, between about 10 micrometer and about 500 micrometers, or between about 20 micrometers and about 200 micrometers. Gaps 1970 may have a depth between about 1 micrometer and about 1 millimeter, between about 5 micrometers and about 300 micrometers, or between about 10 micrometers and about 100 micrometers. Gaps 1970 may be formed by laser machining, for example, a dicing saw, or the like. In certain embodiments, the gap forming process includes a masking operation such that the polycrystalline group III nitride material is prevented from forming between adjacent seed crystals 370 instead of or in addition to etching. In certain embodiments, patterning and etching of seed crystals 370, as shown schematically in FIGS. 1A-1T, is performed after formation of tiled composite structure 1960 rather than beforehand.

The tile array 1860 and/or tiled composite structure 1960, which include the array of precisely-oriented seed crystals 370, may then be used as a substrate for bulk crystal growth, for example, comprising ammonothermal growth, HVPE growth, or flux growth. In the discussion below the grown GaN layer will be referred to as an ammonothermal layer, even though other bulk growth methods, such as HVPE or flux growth, may be used instead. In certain embodiments, comprising ammonothermal bulk growth, one or more tiled arrays 1860 and/or tiled composite structures 1960 may then be suspended on a seed rack and placed in a sealable container, such as a capsule, an autoclave, or a liner within an autoclave. In certain embodiments, one or more pairs of tiled arrays are suspended back to back, with the open and/or patterned large area surfaces facing outward. A group III metal source, such as polycrystalline group III metal nitride, at least one mineralizer composition, and ammonia (or other nitrogen containing solvent) are then added to the sealable container and the sealable container is sealed. The mineralizer composition may comprise an alkali metal such as Li, Na, K, Rb, or Cs, an alkaline earth metal, such as Mg, Ca, Sr, or Ba, or an alkali or alkaline earth hydride, amide, imide, amido-imide, nitride, or azide. The mineralizer may comprise an ammonium halide, such as $NH_4F$, $NH_4Cl$, $NH_4Br$, or $NH_4I$, a gallium halide, such as $GaF_3$, $GaCl_3$, $GaBr_3$, $GaI_3$, or any compound that may be formed by reaction of one or more of F, Cl, Br, I, HF, HCl, HBr, HI, Ga, GaN, and $NH_3$. The mineralizer may comprise other alkali, alkaline earth, or ammonium salts, other halides, urea, sulfur or a sulfide salt, or phosphorus or a phosphorus-containing salt. The sealable container (e.g., capsule) may then be placed in a high pressure apparatus, such as an internally heated high pressure apparatus or an autoclave, and the high pressure apparatus sealed. The sealable container, containing tiled arrays 1860 and/or tiled composite structures 1960, is then heated to a temperature above about 400 degrees Celsius and pressurized above about 50 megapascal to perform ammonothermal crystal growth.

FIGS. 2A-2C illustrate different steps within a bulk crystal growth process performed on an array of adjacently-tiled seed crystals, where the patterned seed crystals are formed by a LEO process with no trenches below mask openings. During a bulk crystal growth process, group III metal nitride layer 213 grows through the openings 112 of patterned mask layer 111, grows outward through the openings, as shown in FIG. 2B, grows laterally over patterned mask layer 111, and coalesces (FIG. 2C), first, between adjacent mask openings and second, between adjacent tile or seed crystals. After coalescence, group III metal nitride layer 213 comprises window regions 215, which have grown vertically with respect to the openings in patterned mask layer 111, wing regions 217, which have grown laterally over patterned mask layer 111, and coalescence fronts 219, which form at the boundaries between wings growing from adjacent openings in patterned mask layer 111, and second coalescence fronts 235, which form at the boundaries between wings growing from adjacent tile or seed crystals. Threading dislocations 214 may be present in window regions 215, originating from threading dislocations that were present at the surface of the substrate 101.

Figure 3D:
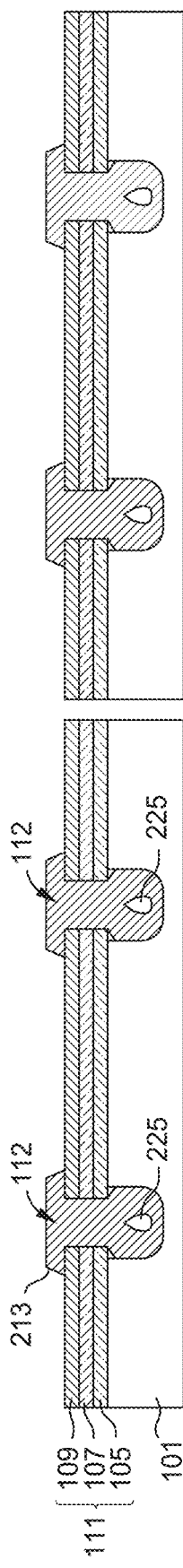
FIGS. 3D and 3E are simplified diagrams illustrating an improved epitaxial lateral overgrowth process for forming a large area group III metal nitride crystal, according to an embodiment of the present disclosure.
Figure 3E:
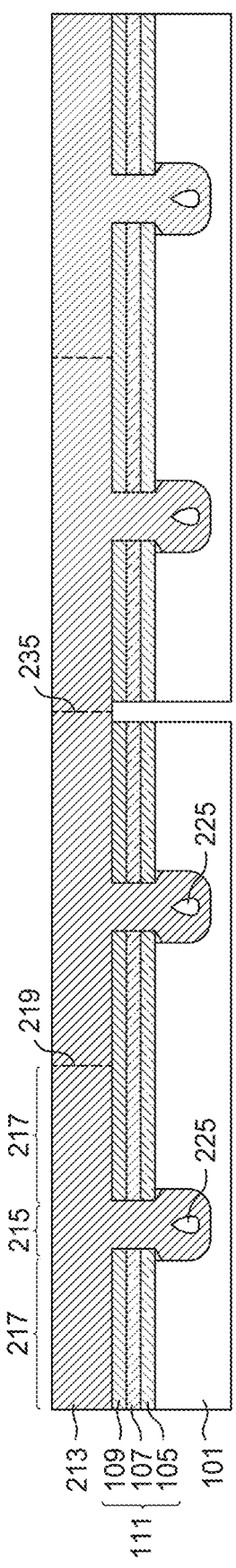

FIGS. 3A-3C illustrate a bulk group III nitride sidewall LEO process. FIGS. 3D-3E illustrate bulk crystal growth on adjacent tiled seed crystals, where the patterned seed crystals are formed by a sidewall LEO process. FIG. 3A illustrates a substrate that includes a patterned, masked trench 115, formed by one of the processes described herein. In a sidewall LEO process, a group III metal nitride material 221 grows on the sides and bottoms of the patterned, masked trenches 115 as shown in FIG. 3B. As group III metal nitride material 221 on the sidewalls of trenches 115 grow inward, it becomes progressively more difficult for group III nitride nutrient material to reach the bottom of the trenches, whether the nutrient material comprises an ammonothermal complex of a group III metal (in the case of ammonothermal growth), a group III metal halide (in the case of HVPE), or a group III metal alloy or inorganic complex (in the case of flux growth). Eventually group III metal nitride material 221 pinches off the lower regions of the trenches, forming voids 225 as shown in FIG. 3C. It has been found that the concentration of threading dislocations in group III metal nitride material 221, which has grown laterally, is lower than that in substrate 101. Many threading dislocations 223, originating from substrate 101, terminate on the surfaces of voids 225. Concomitantly, the group III metal nitride layer 213 grows upward through openings 112 (or windows) in patterned mask layer 111. However, since laterally-grown group III metal nitride material 221 has a lower concentration of threading dislocations than substrate 101 and many dislocations from substrate 101 have terminated at surfaces of voids 225, the dislocation density in the vertically grown group III metal nitride layer 213 is considerably reduced, relative to a conventional LEO process, as described above in conjunction with FIG. 2A-2C.

FIGS. 3D-3E illustrate the continuation of the sidewall LEO growth process and fusion between adjacent tile or seed crystals. As in the conventional LEO process (FIGS. 2A-2C), group III metal nitride layer 213 grows within the openings 112 of patterned mask layer 111, grows outward through the openings as shown in FIG. 3D, grows laterally over patterned mask layer 111, and coalesces (FIG. 3E), first, between adjacent mask openings and second, between adjacent tile or seed crystals. After coalescence, group III metal nitride layer 213 comprises window regions 215, which have grown vertically with respect to the openings in patterned mask layer 111, wing regions 217, which have grown laterally over patterned mask layer 111, and first coalescence fronts 219, which form at the boundaries between wings growing from adjacent openings in patterned mask layer 111, as shown in FIG. 3E, and second coalescence fronts 235, which form at the boundaries between wings growing from adjacent tile or seed crystals. Since laterally-grown group III metal nitride material 221 has a lower concentration of threading dislocations than substrate 101 and many threading dislocations from substrate 101 have terminated in voids 225, the concentration of threading dislocations in window regions 215 is significantly lower than in the case of conventional LEO.

Ammonothermal group III metal nitride layer 213 may have a thickness between about 10 micrometers and about 100 millimeters, or between about 100 micrometers and about 20 millimeters.

In certain embodiments, ammonothermal group III metal nitride layer 213 is subjected to one or more processes, such as at least one of sawing, lapping, grinding, polishing, chemical-mechanical polishing, or etching.

In certain embodiments, the concentration of extended defects, such as threading dislocations and stacking faults, in the ammonothermal group III metal nitride layer 213 may be quantified by defect selective etching. Defect-selective etching may be performed, for example, using a solution comprising one or more of $H_3PO_4$, $H_3PO_4$ that has been conditioned by prolonged heat treatment to form polyphosphoric acid, and $H_2SO_4$, or a molten flux comprising one or more of NaOH and KOH. Defect-selective etching may be performed at a temperature between about 100 degrees Celsius and about 500 degrees Celsius for a time between about 5 minutes and about 5 hours, wherein the processing temperature and time are selected so as to cause formation of etch pits with diameters between about 1 micrometer and about 25 micrometers, then removing the ammonothermal group III metal nitride layer, crystal, or wafer from the etchant solution.

The concentration of threading dislocations in the surface of the window regions 215 may be less than that in the underlying substrate 101 by a factor between about 10 and about $10^4$. The concentration of threading dislocations in the surface of the window regions 215 may be less than about $10^8$ $cm^{-2}$, less than about $10^7$ $cm^{-2}$, less than about $10^6$ $cm^{-2}$, less than about $10^5$ $cm^{-2}$, or less than about $10^4$ $cm^{-2}$. The concentration of threading dislocations in the surface of wing regions 217 may be lower, by about one to about three orders of magnitude, than the concentration of threading dislocations in the surface of the window regions 215, and may be below about $10^5$ $cm^{-2}$, below about $10^4$ $cm^{-2}$, below about $10^3$ $cm^{-2}$, below about $10^2$ $cm^{-2}$, or below about 10 $cm^{-2}$. Some stacking faults, for example, at a concentration between about 1 $cm^{-1}$ and about $10^4$ $cm^{-1}$, may be present at the surface of the window regions 215. The concentration of stacking faults in the surface of wing regions 217 may be lower, by about one to about three orders of magnitude, than the concentration of stacking faults in the surface of the window regions 215, and may be below about $10^2$ $cm^{-1}$, below about 10 $cm^{-1}$, below about 1 $cm^{-1}$, or below about 0.1 $cm^{-1}$, or may be undetectable. Threading dislocations, for example, edge dislocations, may be present at coalescence fronts 219 and 235, for example, with a line density that is less than about $1\times10^5$ $cm^{-1}$, less than about $3\times10^4$ $cm^{-1}$, less than about $1\times10^4$ $cm^{-1}$, less than about $3\times10^3$ $cm^{-1}$, less than about $1\times10^3$ $cm^{-1}$, less than about $3\times10^2$ $cm^{-1}$, or less than $1\times10^2$ $cm^{-1}$. The density of dislocations along the coalescence fronts may be greater than 5 $cm^{-1}$, greater than 10 $cm^{-1}$, greater than 20 $cm^{-1}$, greater than 50 $cm^{-1}$, greater than $10^0$ $cm^{-1}$, greater than 200 $cm^{-1}$, or greater than 500 $cm^{-1}$.

In certain embodiments, the process of masking and bulk group III nitride crystal growth is repeated one, two, three, or more times. In some embodiments, these operations are performed while the first bulk group III metal nitride layer remains coupled to substrate 101. In other embodiments, substrate 101 is removed prior to a subsequent masking and bulk crystal growth operation, for example, by sawing, lapping, grinding, and/or etching.

FIGS. 4A, 4B, and 4C are simplified diagrams illustrating a method of forming a free-standing group III metal nitride boule and free-standing group III metal nitride wafers. In certain embodiments, substrate 101 is removed from ammonothermal group III metal nitride layer 213 (FIG. 4A, which is similarly configured as FIG. 3E), or the last such layer deposited, to form a free-standing, merged ammonothermal group III metal nitride boule 413, which comprises at least a portion of the ammonothermal group III metal nitride layer 213. Removal of substrates 101 may be accomplished by one or more of sawing, grinding, lapping, polishing, laser lift-off, self-separation, and etching to form a processed free-standing laterally-grown group III metal nitride boule 413. The processed free-standing laterally-grown group III metal nitride boule 413 may include a similar or essentially identical composition as the ammonothermal group III metal nitride layer and etching may be performed under conditions where the etch rate of the back side of substrate 101 is much faster than the etch rate of the front surface of the ammonothermal group III metal nitride layer. In certain embodiments a portion of ammonothermal group III metal nitride layer 213, or the last such layer deposited, may be protected from attack by the etchant by deposition of a mask layer, wrapping the portion of the layer with Teflon, clamping the portion of the layer against Teflon, painting with Teflon paint, or the like. In a specific embodiment, substrate 101 comprises single crystal gallium nitride, large-area surface 102 of substrate 101 has a crystallographic orientation within about 5 degrees of a (0001) crystallographic orientation, and substrate 101 is preferentially etched by heating in a solution comprising one or more of $H_3PO_4$, $H_3PO_4$ that has been conditioned by prolonged heat treatment to form polyphosphoric acid, and $H_2SO_4$ at a temperature between about 150 degrees Celsius and about 500 degrees Celsius for a time between about 30 minutes and about 5 hours, or by heating in a molten flux comprising one or more of NaOH and KOH. Surprisingly, patterned mask layer(s) 111 may facilitate preferential removal of substrate 101 by acting as an etch stop. The processed free-standing, merged ammonothermal group III metal nitride boule 413 may include one or more window regions 415 that were formed above exposed regions 120, such as openings 112 in patterned mask layer(s) 111, on a substrate 101. The processed free-standing, merged laterally-grown group III metal nitride boule 413 may also include one or more wing regions 417 that were formed above non-open regions in patterned mask layer(s) 111, and a pattern of locally-approximately-linear arrays 419 of threading dislocations, as shown in FIG. 4B, and one or more second coalescence fronts 435. One or more of front surface 421 and back surface 423 of free-standing, merged ammonothermal group III metal nitride boule 413 may be lapped, polished, etched, and chemical-mechanically polished. As similarly discussed above, the pattern of locally-approximately-linear arrays 419 and one or more second coalescence fronts 435 may include a coalescence front region that includes a "sharp boundary" that has a width less than about 25 micrometers or less than about 10 micrometers that is disposed between the adjacent wing regions 417, or an "extended boundary" that has a width between about 25 micrometers and about 1000 micrometers or between about 30 micrometers and about 250 micrometers that is disposed between the adjacent wing regions 417, depending on the growth conditions.

In certain embodiments, the edge of free-standing, merged ammonothermal group III metal nitride boule 413 is ground to form a cylindrically-shaped ammonothermal group III metal nitride boule. In certain embodiments, one or more flats is ground into the side of free-standing, merged ammonothermal group III metal nitride boule 413. In certain embodiments, free-standing, merged ammonothermal group III metal nitride boule 413 is sliced into one or more free-standing, merged ammonothermal group III metal nitride wafers 431, as shown in FIG. 4C. The slicing may be performed by multi-wire sawing, multi-wire slurry sawing, slicing, inner-diameter sawing, outer-diameter sawing, cleaving, ion implantation followed by exfoliation, spalling, laser cutting, or the like. One or more large-area surface of free-standing, merged ammonothermal group III metal nitride wafers 431 may be lapped, polished, etched, electrochemically polished, photoelectrochemically polished, reactive-ion-etched, and/or chemical-mechanically polished according to methods that are known in the art. In certain embodiments, a chamfer, bevel, or rounded edge is ground into the edges of free-standing, merged ammonothermal group III metal nitride wafers 431. The free-standing, merged ammonothermal group III metal nitride wafers may have a diameter of at least about 10 millimeters, at least about 25 millimeters, at least about 50 millimeters, at least about 75 millimeters, at least about 100 millimeters, at least about 150 millimeters, at least about 200 millimeters, at least about 300 millimeters, at least about 400 millimeters, or at least about 600 millimeters and may have a thickness between about 50 micrometers and about 20 millimeters or between about 150 micrometers and about 5 millimeter. One or more large-area surface of free-standing, merged ammonothermal group III metal nitride wafers 431 may be used as a substrate for group III metal nitride growth by chemical vapor deposition, metalorganic chemical vapor deposition, hydride vapor phase epitaxy, molecular beam epitaxy, flux growth, solution growth, ammonothermal growth, among others, or the like.

Tiled Seed Crystal Array Configuration Examples

In some embodiments of the disclosure, the tiled array of seed crystals used during a crystal growth process, or one or more steps in a multiple step crystal growth process, may include the use of and alignment of seed crystals that have desirable crystallographic and structural attributes, such that the crystal layers grown from the formed tiled seed crystal array have a reduced number of crystalline defects, particularly at coalescence fronts, and reduced misalignment between adjacent grains or seed crystals. In certain embodiments, an array of seed crystals 370 are aligned, oriented and positioned in a one-dimensional array, as illustrated in FIGS. 20B-20C, rather than in a two-dimensional array, as shown in FIGS. 17A-19G. Tiling in one dimension at a time may offer certain advantages, relative to tiling simultaneously in two dimensions, as described in more detail below. In general, a fixture or handle substrate supporting the two or more seed crystals that are positioned in an array is approximately CTE-matched to the seed crystals. However, in the case of tiling of nonpolar or semipolar GaN crystals, where the CTEs in the c- and a-directions are distinct, by virtue of the wurtzite crystal structure, the handle substrate is unlikely to be CTE-matched in both directions unless the handle substrate is also single-crystal GaN having the same crystallographic orientation. An advantage of forming and coalescing a one-dimensional array of seed crystals is that it can be more difficult to coalesce crystals in two directions simultaneously than to do so only in one growth direction at a time. In addition, the defect level at the coalescence boundaries and the tile-to-tile misorientation angle are critically dependent on the accuracy of the polishing and alignment operations, and thus it may be easier to align and configure a one-dimensional array of seed crystals such that a very high quality, coalesced GaN crystal can be formed in subsequent operations.

In certain embodiments of the disclosure, a plurality of first GaN tile or seed crystals 2001 are provided for tiling in a first direction to form a one-dimensional array of seed crystals, as shown in FIGS. 20A-20C. In certain embodiments, each of the tile crystals 2001, which may include or consist of a seed crystal 370, is prepared from a common single crystal, for example, by multi-wire-sawing, grinding, polishing, and chemical-mechanical polishing. The formed tile crystals 2001 may be tiled in one dimension, for example, along the c-direction for m-plane seed crystals, coalesced, and grown out to an approximately equilibrium shape, as shown in FIG. 20A-20C. In another specific embodiment, c-plane seed crystals may be tiled along an a-direction and grown out to an approximately equilibrium shape. The original seed may have been grown ammonothermally or by HVPE.

During the process of forming the one-dimensional array of seed crystals, after positioning and aligning the seed crystals in a desired orientation, a coalescence step is used to couple the seed crystals disposed in the one-dimensional array together (Y direction). During the coalescence process, gaps 2011 between adjacent tile crystals 2001 (FIG. 20B, analogous to gaps 1711 in FIGS. 17A-17F) may fill in, forming coalescence fronts 2015 in the same positions as gaps 2011 (FIGS. 20 B and 20D) The coalescence step may be carried out in a separate step, for example, using a mechanical fixture as shown in FIGS. 18A-18D, by bonding using a polycrystalline group III nitride layer, as shown in FIGS. 19A-19C, or by bonding to a handle substrate, as described below. The coalesced array of seed crystals may then be removed from the handle substrate, and used as a seed for a subsequent ammonothermal crystal growth run. In the subsequent ammonothermal crystal growth process the grown crystal layer 2045 formed on the coalesced array of seed crystals can be grown out to a near-equilibrium shape to form a grown tiled seed crystal 2050, as illustrated in FIGS. 20D-20E.

In some embodiments, rather than using a mechanical fixture (FIGS. 18A-18D) or polycrystalline group III nitride bonding layer (FIGS. 19A-19C), the coalescence step is performed using a handle substrate that consists of or includes a supporting component that is formed from one or more of molybdenum, a molybdenum alloy, a single crystal or polycrystalline group III metal nitride, or another material that has a close CTE match to the seed crystals and is compatible with the crystal growth environment. An adhesion layer may be deposited on the front side of the handle substrate and the back side of the seed crystals. The adhesion layer may include one or more of $SiO_2$, $GeO_2$, $SiN_x$, $AlN_x$, or B, Al, Si, P, Zn, Ga, Si, Ge, Au, Ag, Ni, Ti, Cr, Zn, Cd, In, Sn, Sb, TI, W, In, Cu, or Pb, or an oxide, nitride, or oxynitride thereof. In certain embodiments, the composition of the adhesion layer on at least one of the handle substrate and the seed crystals may have a melting point may be chosen so as to undergo nascent melting at a temperature below about 300 degrees Celsius, below about 400 degrees Celsius, or below about 500 degrees Celsius. In certain embodiments, the composition of the adhesion layer on the other of the at least one of the handle substrate and the seed crystals may have a melting point may be chosen so as to undergo nascent melting at a temperature below about 300 degrees Celsius, below about 400 degrees Celsius, or below about 500 degrees Celsius, and may be chosen so as to have a melting point above about 600 degrees Celsius, above about 700 degrees Celsius, above about 800 degrees Celsius, or above about 900 degrees Celsius. The composition and structure of the adhesion layer may be chosen so as to undergo nascent melting at a temperature below about 300 degrees Celsius, below about 400 degrees Celsius, below about 500 degrees Celsius, or below about 600 degrees Celsius, then, following bonding to a mating adhesion layer and a thermal treatment at a temperature below the solidus temperature, to remain unmelted, or with a volume fraction of melt below about 20%, below about 10%, or below about 5%, at a temperature above about 600 degrees Celsius, above about 700 degrees Celsius, above about 800 degrees Celsius, or above about 900 degrees Celsius. The seed crystals may be bonded to the handle substrate at a first temperature, at which at least one adhesion layer composition may be molten, then heat treated so as to remain unmelted at a second, higher temperature, at which a crystal growth process is performed to cause coalescence of the seed crystals into a merged crystal. Further details are described in U.S. Pat. No. 10,400,352, which is hereby incorporated by reference in its entirety.

In some embodiments of the crystal forming process, the grown tiled seed crystal 2050 is then sliced, as shown schematically in FIG. 21A. In one example, the slicing is performed parallel to an m-plane and parallel to the original seed surface, forming long, narrow portions of the grown tiled seed crystal 2050, for example, crystals 2101, 2102, 2103, 2104, 2105, 2106, 2107, and 2108. The long, narrow portions of the grown tiled seed crystal 2050 are then tiled side-by-side, as shown in FIG. 21B. Since adjacent strips were formed from crystals above or below one another, the crystallographic orientation along a row will be quite precise, for example, better than 0.3°, better than 0.1°, better than 0.05°, better than 0.02°, or better than 0.01°, even if the original one-dimensional tiling process shown in FIGS. 20A-20E was not nearly as accurate.

During the process of forming the array of seed crystals, illustrated in FIGS. 21B-21C, after positioning and aligning the narrow portions of the grown tiled seed crystal in a desired orientation, a coalescence step is used to couple the narrow portions of the grown tiled seed crystal together (X direction). During the coalescence process, gaps 2112 between adjacent tile crystals 2001 (FIG. 21B) may fill in, forming coalescence fronts 2115 in the same positions as gaps 2112 (FIGS. 21B and 21D). After coalescence, a first second-dimension-tiled crystal may be de-bonded from a fixture or handle substrate and re-grown to a near-equilibrium shape, encompassing regrown crystal layer 2145, as shown in FIGS. 21D-21E. The regrown crystal 2150 will include a grown crystal layer 2145 that includes coalescence fronts 2115 formed within or over gaps 2112 (FIG. 21B) found in the array of crystals, which are similar to the second coalescence fronts 435 described above, along with coalescence fronts 2015 formed by extension of pre-existing coalescence fronts 2015 in seed crystals 2101, 2102, etc. Inaccuracies in the original tiling may be manifested as grain boundaries in the Y, or axial direction (i.e., coalescence fronts 2015; c-direction in the specific example shown) but misorientation in the X-direction (i.e., coalescence fronts 2115; a-direction in the specific example shown) should be minimal.

The regrown crystal 2150 may then be sliced in the X-Y plane (parallel to the m-plane in the specific example shown), as shown schematically in FIG. 22A, forming, for example, slices 2201, 2202, 2203, 2204, 2205, 2206, 2207, and 2208. In addition, as shown in FIG. 22B, the regrown crystal 2150 or slices 2201-2208 may then be sliced at positions 2220, corresponding to the defective grain boundaries found at the coalescence fronts 2015, which are parallel to c-plane in the specific example shown (FIG. 21D) forming, for examples slabs 2201A, 2201B, 2201C, ..., 2202A, 2202B, 2202C, ... 2208C, 2208D, and 2208E (e.g., 40 total slabs). After forming the slices 2201-2208 and sectioning the slices at positions 2220, the resulting slabs 2201A-2208E can then be tiled again, in a direction orthogonal to the previous tiling operation, as shown in FIG. 22C. In this configuration, slabs that are adjacent to one another in the Z direction are placed side-by-side to make a one-dimensional array in the Y direction, with edges prepared at the positions 2220 placed next to one another. This formed array of slabs 2201A-2208A (FIGS. 22C-22D) will allow the very small misorientations found in the regrown crystal 2150 to be replicated in the subsequently formed entire mosaic crystal 2250.

During the process of forming the array of slabs 2201A-2208A, illustrated in FIGS. 22B-22C, after positioning and aligning the slabs 2201A-2208A in a desired orientation, a coalescence step is used to couple the array of slabs 2201A-2208A together (Y direction). During the coalescence process, gaps 2212 between adjacent slabs 2201A-2208A (FIG. 22C) may fill in, forming coalescence fronts 2215 in the same positions as gaps 2212 (FIGS. 22C and 22E). Each of the slabs 2201A-2208A disposed in the array are coupled together by at least one coalescence front 2215 (FIG. 22C). Once the array of slabs 2201A-2208A are re-coalesced they can then be de-bonded from a fixture or handle substrate, and re-grown to form an equilibrium shape having a grown crystal layer 2245 that includes a greatly reduced defect concentration associated with the coalescence fronts 2215, as shown in FIG. 22E. Similar procedures may be followed to coalesce and grow on slabs 2201B-2208B, 2201C-2208C, ... and 2201E-2208E.

The procedure shown schematically in FIGS. 20A-22F may be employed to fabricate large-area, low-defect m-plane GaN crystals suitable for use as seeds in subsequent ammonothermal crystal growth of m-plane boules or in subsequent bulk crystal growth by another method, such as HVPE or flux growth. Similar, sequential 1-D tiling operations may be used to prepare large-area, low-defect c-plane or semipolar GaN crystals suitable for use as seeds in subsequent bulk crystal growth or for use as substrates for electronic or optoelectronic device fabrication.

In certain embodiments, the mosaic crystal 2250 is sliced along a short dimension or at an oblique angle, for example, to form seed crystals suitable for use as seeds in subsequent ammonothermal crystal growth or in subsequent bulk crystal growth by another method, such as HVPE or flux growth, for use in a further one-dimensional or two-dimensional tiling process, or for use as substrates for electronic or optoelectronic device fabrication.

In an alternative embodiment, for example, for growth of c-plane or semipolar crystals, the initial one-dimensional tiling operation (FIG. 20A-20D) is omitted, and isolated m-plane crystals are simply grown to a near-equilibrium shape. The formed crystals may be sliced parallel to m-plane and tiled as shown in FIGS. 21A-21E to form the regrown crystal 2150. Alternatively, the formed crystals may be sliced parallel to c-plane or in a semipolar orientation to prepare seeds for a one-dimensional tiling operation. Crystals sliced from the region of the boule that grew in the +c [0001] direction have a substantially-reduced dislocation density and are particularly well-suited for growth of c-plane and/or semipolar crystals with a dislocation density below $10^6$ cm$^{-2}$, below $10^5$ cm$^{-2}$, below $10^4$ cm$^{-2}$, or below $10^3$ cm$^{-2}$.

Relative to a two-dimensional tile-in-one-step process, as illustrated schematically in FIGS. 17A-19F, the sequential 1-D tiling approach may have several advantages, including enabling easier tile selection, preparation, and stacking; more accurately aligned single crystal domains; reduced CTE mismatch to a handle substrate or fixture and thereby reduced risk of cracking; and reduced risk of individual tiles being mis-oriented beyond a target specification, for example, 0.1°.

Grown and Freestanding Crystal Examples

FIGS. 5A-5E are simplified diagrams illustrating threading dislocation patterns formed above individual tile crystals that have been formed by the patterned growth methods summarized in FIGS. 1A-4C. The individual tile crystals illustrated in FIGS. 5A-5E, can form part of a free-standing, merged group III metal nitride boule 413 or wafer 431, which are described in relation to FIGS. 4A-4C, or form part of the free-standing, merged ammonothermal group III nitride boule or wafer, which are illustrated in FIGS. 6A-6G, which are described further below. The large-area surfaces of the free-standing, merged ammonothermal group III metal nitride boule 413 or wafers 431 may be characterized by a pattern of locally-approximately-linear arrays 419 of threading dislocations that propagated from coalescence fronts 219 formed during the epitaxial lateral overgrowth process, as discussed above in conjunction with FIGS. 3A-3E. The pattern of locally-approximately-linear arrays of threading dislocations may be 2D hexagonal, square, rectangular, trapezoidal, triangular, 1D linear, or an irregular pattern that is formed at least partially due to the pattern of the exposed regions 120 (FIGS. 1F-1L) used during the process to form free-standing laterally-grown group III metal nitride boule 413. One or more window regions 415 are formed above the exposed regions 120 (FIGS. 1F-1L), and one or more wing regions 417 are formed on portions that are not above the exposed regions 120, that is, were formed by lateral growth. As discussed above, the formed coalescence fronts 219 or pattern of locally-approximately-linear arrays 419 may include coalescence front regions that have a lateral width (i.e., measured parallel to the surface of the page containing FIGS. 5A-5E) that can vary depending on the growth conditions.

More complex patterns are also possible and may be advantageous, for example, in being more resistant to cracking or cleaving. The pattern 502 may be elongated in one direction compared to another orthogonal direction, for example, due to the free-standing, merged laterally-grown group III metal nitride boule 413 being sliced at an inclined angle relative to the large-area surface of a free-standing, merged ammonothermal group III metal nitride boule 413. The pattern 502 of locally-approximately-linear arrays of threading dislocations may be characterized by a linear array of threading dislocations (FIG. 5D) that have a pitch dimension L between about 5 micrometers and about 20 millimeters or between about 200 micrometers and about 5 millimeters. The pattern 502 of locally-approximately-linear arrays of threading dislocations may be characterized by a pitch dimension L (FIGS. 5A, 5B), or by pitch dimensions $L_1$ and $L_2$ in two orthogonal directions (FIGS. 5C and 5E), between about 5 micrometers and about 20 millimeters or between about 200 micrometers and about 5 millimeters, or between about 500 micrometers and about 2 millimeters. In certain embodiments, the pattern 502 of locally-approximately-linear arrays of threading dislocations is approximately aligned with the underlying crystal structure of the group III metal nitride, for example, with the locally-approximately-linear arrays lying within about 5 degrees, within about 2 degrees, or within about 1 degree of one or more of <1 0-1 0>, <1 1-2 0>, or [0 0 0 ±1] or their projections in the plane of the surface of the free-standing, merged ammonothermal group III metal nitride boule 413 or group III metal nitride wafer 431. The linear concentration of threading dislocations in the pattern may be less than about $1 \times 10^5$ cm$^{-1}$, less than about $3 \times 10^4$ cm$^{-1}$, less than about $1 \times 10^4$ cm$^{-1}$, less than about $3 \times 10^3$ cm$^{-1}$, less than about $1 \times 10^3$ cm$^{-1}$, less than about $3 \times 10^2$ cm$^{-1}$, or less than about $1 \times 10^2$ cm$^{-1}$. The linear concentration of threading dislocations in the pattern 502 may be greater than 5 cm$^{-1}$, greater than 10 cm$^{-1}$, greater than 20 cm$^{-1}$, greater than 50 cm$^{-1}$, greater than $10^0$ cm$^{-1}$, greater than 200 cm$^{-1}$, or greater than 500 cm$^{-1}$.

Referring again to FIGS. 5A-5E, the large-area surfaces of individual grains or domains within the free-standing, merged ammonothermal group III metal nitride boule or wafer may further be characterized by an array of wing regions 417 and by an array of window regions 415. Each domain, or sometimes referred to herein as a grain, may be formed by growth above an individual tile crystal (e.g., seed crystals 370). A domain will generally include wing regions, window regions, coalescence fronts and locally-approximately-linear arrays of dislocations and are generally bounded by coalescence fronts. Each wing region 417 may be positioned between adjacent locally-approximately-linear arrays 419 of threading dislocations. Each window region 415 may be positioned within a single wing region 417 or may be positioned between two adjacent wing regions 417 and may have a minimum dimension between 10 micrometers and 500 micrometers and be characterized by concentration of threading dislocations between $10^3$ cm$^{-2}$ and $10^8$ cm$^{-2}$, resulting from residual threading dislocations that propagated vertically from window regions during the bulk crystal growth process, and by a concentration of stacking faults below $10^3$ cm$^{-1}$. In some embodiments the boundary between the window regions and the wing regions may be decorated with dislocations, for example, with a line density between about 5 cm$^{-1}$ and $10^5$ cm$^{-1}$.

The arrays may be elongated in one direction compared to another orthogonal direction, for example, due to the boule being sliced at an inclined angle relative to the large-area surface of a free-standing, merged ammonothermal group III metal nitride boule. The pattern of locally-approximately-linear arrays 419 of threading dislocations may be characterized by a pitch dimension L, or by pitch dimensions $L_1$ and $L_2$ in two orthogonal directions, between about 5 micrometers and about 20 millimeters or between about 200 micrometers and about 2 millimeters. In certain embodiments, the first pattern of locally-approximately-linear arrays 419 of threading dislocations is approximately aligned with the underlying crystal structure of the group III metal nitride, for example, with the locally-approximately-linear arrays lying within about 5 degrees, within about 2 degrees, or within about 1 degree of one or more of <1 0-1 0>, <1 1-2 0>, or [0 0 0 ±1] or their projections in the plane of the surface of the free-standing ammonothermal group III nitride boule or wafer. The linear concentration of threading dislocations in the pattern may be less than about $1 \times 10^5$ cm$^{-1}$, less than about $3 \times 10^4$ cm$^{-1}$, less than about $1 \times 10^4$ cm$^{-1}$, less than about $3 \times 10^3$ cm$^{-1}$, less than about $1 \times 10^3$ cm$^{-1}$, less than about $3 \times 10^2$ cm$^{-1}$, or less than about $1 \times 10^2$ cm$^{-1}$. The linear concentration of threading dislocations in the pattern may be greater than 5 cm$^{-1}$, greater than 10 cm$^{-1}$, greater than 20 cm$^{-1}$, greater than 50 cm$^{-1}$, greater than $10^0$ cm$^{-1}$, greater than 200 cm$^{-1}$, or greater than 500 cm$^{-1}$.

The concentration of threading dislocations in the wing regions 417 between the locally-approximately-linear arrays of threading dislocations may be below about 105 cm$^{-2}$, below about $10^4$ cm$^{-2}$, below about $10^3$ cm$^{-2}$, below about $10^2$ cm$^{-1}$, or below about 10 cm$^{-2}$. The concentration of threading dislocations in the surface of the window regions 415 may be less than about $10^8$ cm$^{-2}$, less than about $10^7$ cm$^{-2}$, less than about $10^6$ cm$^{-2}$ less than about $10^5$ cm$^{-2}$, or less than about $10^4$ cm$^{-2}$. The concentration of threading dislocations in the surface of the window regions may be higher than the concentration of threading dislocations in the surface of the wing regions by at least a factor of two, by at least a factor of three, by at least a factor of ten, by at least a factor of 30, or by at least a factor of 100. The concentration of threading dislocations in the surface of the window regions may be higher than concentration of threading dislocations in the surface of the wing regions by less than a factor of $10^4$, by less than a factor of 3000, by less than a factor of 1000, by less than a factor of 300, by less than a factor of 100, or by less than a factor of 30. In some embodiments the boundary between the window regions 415 and the wing regions 417 may be decorated with dislocations, for example, with a line density between about 5 cm$^{-1}$ and $10^5$ cm$^{-1}$. The concentration of threading dislocations, averaged over a large area surface of the free-standing ammonothermal group III nitride boule or wafer, may be below about $10^7$ cm$^{-2}$, below about $10^6$ cm$^{-2}$, below about 105 cm$^{-2}$, below about $10^4$ cm$^{-2}$, below about $10^3$ cm$^{-2}$, or below about $10^2$ cm$^{-2}$. The concentration of stacking faults, averaged over a large area surface of the free-standing ammonothermal group III nitride boule or wafer, may be below about $10^3$ cm$^{-1}$, below about $10^2$ cm$^{-1}$, below about 10 cm$^{-1}$, below about 1 cm$^{-1}$, or below about 0.1 cm$^{-1}$, or may be undetectable. In some embodiments, for example, after repeated re-growth on a seed crystal with a patterned array of dislocations and/or growth to a thickness greater than 2 millimeters, greater than 3 millimeters, greater than 5 millimeters, or greater than 10 millimeters, the positions of the threading dislocations may be displaced laterally to some extent with respect to the pattern on the seed crystal. In such a case the regions with a higher concentration of threading dislocations may be somewhat more diffuse than the relatively sharp lines illustrated schematically in FIGS. 5A-5E. However, the concentration of threading dislocations as a function of lateral position along a line on the surface will vary periodically, with a period between about 5 micrometers and about 20 millimeters or between about 200 micrometers and about 5 millimeters. The concentration of threading dislocations within the periodically-varying region may vary by at least a factor of two, at least a factor of 5, at least a factor of 10, at least a factor of 30, at least a factor of 100, at least a factor of 300, or at least a factor of 1000.

Referring to FIGS. 6A-6F, as discussed above, a free-standing, merged ammonothermal group III nitride boule or wafer can be formed by use of one or more of the tiling processes described in relation to FIGS. 3A-4C and 17A-22F. The free-standing, merged ammonothermal group III nitride boule or wafer can include two or more domains or grains separated by one or more second lines of dislocations 635, the latter originating from the second coalescence fronts 235 or 2215 formed during lateral growth of ammonothermal group III metal nitride material from one seed to its neighbor, as shown schematically in FIGS. 2C, 3E, and 22E. Depending on the geometry of the original nitride crystals, the pattern of domains may be, for example, (a) square (FIGS. 6A and 17A), (b) rectangular (FIGS. 6B and 17B), (c) hexagonal (FIGS. 6C and 17C), (d) rhombohedral (FIGS. 6D and 17D), (e) a mix of hexagonal and pentagonal (FIGS. 6E and 17E); or (f) a mix of hexagonal and rhombohedral (FIGS. 6F and 17F). Other patterns are also possible. FIG. 6G illustrates an example of a square free-standing, merged ammonothermal group III nitride boule or wafer that was formed using a plurality of tiled seed crystals (e.g., seed crystals 370), which are shown in FIG. 1G, during a crystal growth process, where each of the domains resulting from a single tile crystal (e.g., seed crystal 370) includes window and wing regions and coalescence fronts. The domains may have a first lateral tile dimension 680 and a second lateral tile dimension 690, corresponding approximately to original tile crystal dimensions 380 and 390, respectively (see FIGS. 17A-17F), the lateral dimensions defining a plane that is perpendicular to the thickness, where each of the first lateral tile dimension 680 and the second lateral tile dimension 690 may be at least about 5 millimeters, 10 millimeters, 15 millimeters, 20 millimeters, 25 millimeters, 35 millimeters, 50 millimeters, 75 millimeters, 100 millimeters, 150 millimeters, or at least about 200 millimeters. The polar misorientation angle $\gamma$ between adjacent domains may be less than 0.5 degree, less than 0.2 degree, less than 0.1 degree, less than 0.05 degree, less than 0.02 degree, or less than 0.01 degree. The first lateral tile dimension 680 may be approximately the same as the first lateral seed dimension (i.e., X-direction dimension 380). Similar, the second lateral tile dimension 690 may be approximately equal to the second lateral seed dimension (i.e., Y-direction dimension 390). The misorientation angles $\alpha$ and $\beta$ between adjacent domains may be less than 0.5 degree, less than 0.2 degree, less than 0.1 degree, less than 0.05 degree, less than 0.02 degree, or less than 0.01 degree. Typically, $\gamma$ will be less than or equal to $\alpha$ and $\beta$. The crystallographic misorientation angles $\alpha$, $\beta$, and $\gamma$ may be greater than about 0.01 degree, greater than about 0.02 degree, greater than about 0.05 degree, or greater than about 0.1 degree. The density of dislocations along the lines between adjacent domains may be less than about $5 \times 10^5$ cm$^{-1}$, less than about $2 \times 10^5$ cm$^{-1}$, less than about $1 \times 10^5$ cm$^{-1}$, less than about $5 \times 10^4$ cm$^{-1}$, less than about $2 \times 10^4$ cm$^{-1}$, less than about $1 \times 10^3$ cm$^{-1}$, less than about $5 \times 10^3$ cm$^{-1}$, less than about $2 \times 10^3$ cm$^{-1}$, or less than about $1 \times 10^3$ cm$^{-1}$. The density of dislocations along the lines between adjacent domains may be greater than 50 cm$^{-1}$, greater than $10^0$ cm$^{-1}$, greater than 200 cm$^{-1}$, greater than 500 cm$^{-1}$, greater than 1,000 cm$^{-1}$, greater than 2000 cm$^{-1}$, or greater than 5000 cm$^{-1}$.

The free-standing, merged ammonothermal group III nitride boule or wafer may have a symmetric x-ray rocking curve, for example, (002) in the case of c-plane, full width at half maximum (FWHM) less than about 300 arc sec, less than about 200 arc sec, less than about 100 arc sec, less than about 50 arc sec, less than about 35 arc sec, less than about 25 arc sec, or less than about 15 arc sec. The free-standing, merged ammonothermal group III nitride boule or wafer may have a non-symmetric x-ray rocking curve, for example, (201) or (102) in the case of c-plane, full width at half maximum (FWHM) less than about 300 arc sec, less than about 200 arc sec, less than about 100 arc sec, less than about 50 arc sec, less than about 35 arc sec, less than about 25 arc sec, or less than about 15 arc sec. The free-standing, merged ammonothermal group III nitride boule or wafer may have a thickness between about 100 microns and about 100 millimeters, or between about 1 millimeter and about 10 millimeters. The free-standing, merged ammonothermal group III nitride boule or wafer may have a diameter of at least about 15 millimeters, at least about 20 millimeters, at least about 25 millimeters, at least about 35 millimeters, at least about 50 millimeters, at least about 75 millimeters, at least about 100 millimeters, at least about 150 millimeters, at least about 200 millimeters, or at least about 400 millimeters. The surface of the free-standing, merged ammonothermal group III nitride boule or wafer may have a crystallographic orientation within 10 degrees, within 5 degrees, within 2 degrees, within 1 degree, within 0.5 degree, within 0.2 degree, within 0.1 degree, within 0.05 degree, within 0.02 degree, or within 0.01 degree of (0 0 0 1) Ga-polar, (0 0 0–1) N-polar, {1 0–1 0} non-polar, or {1 1–2 0} non-polar a-plane. The surface of the free-standing, merged ammonothermal group III nitride boule or wafer may have a (h k i l) semi-polar orientation, where i=−(h+k) and l and at least one of h and k are nonzero. In a specific embodiment, the crystallographic orientation of the free-standing, merged ammonothermal group III nitride boule or wafer is within 10 degrees, within 5 degrees, within 2 degrees, within 1 degree, within 0.5 degree, within 0.2 degree, within 0.1 degree, within 0.05 degree, within 0.02 degree, or within 0.01 degree of {1 1–2±2}, {6 0–6 ±1}, {5 0–5 ±1}, {40–4 ±1}, {3 0–3±1}, {5 0–5 ±2}, {7 0–7 ±3}, {2 0–2±1}, {3 0–3±2}, {4 0–4 ±3}, {5 0–5 ±4}, {1 0–1±1}, {1 0–1±2}, {1 0–1±3}, {2 1–3±1}, or {3 0–3±4}. The free-standing, merged ammonothermal group III nitride boule or wafer has a minimum lateral dimension of at least ten millimeters. In some embodiments, the merged nitride crystal has a minimum lateral dimension of at least two centimeters, at least three centimeters, at least four centimeters, at least five centimeters, at least six centimeters, at least eight centimeters, at least ten centimeters, or at least twenty centimeters.

In some embodiments, the free-standing, merged ammonothermal group III nitride boule or wafer is used as a substrate for epitaxy, forming a semiconductor structure. The free-standing, merged ammonothermal group III nitride boule may be sawed, lapped, polished, dry etched, and/or chemical-mechanically polished by methods that are known in the art. One or more edges of the free-standing, merged ammonothermal group III nitride boule or wafer may be ground. The free-standing, merged ammonothermal group III nitride boule or wafer may be placed in a suitable reactor and an epitaxial layer grown by MOCVD, MBE, HVPE, or the like. In a particular embodiment, the epitaxial layer comprises GaN or $Al_xIn_yGa_{(1-x-y)}N$, where 0≤x, y≤1. The morphology of the epitaxial layer is uniform from one domain to another over the surface because the surface orientation is almost identical.

In some embodiments, the free-standing, merged ammonothermal group III nitride boule or wafer is used as a substrate for further tiling. For example, referring to FIGS. 17A through 19D, the seed crystals 370 themselves may be chosen to be a free-standing, merged ammonothermal group III metal nitride boule or wafer. The tiling, coalescence, and re-tiling operation may be iterated more than twice, more than 4 times, more than 8 times, or more than 16 times. In this way, by successive tiling operations, a merged nitride crystal with excellent crystalline quality and very large diameter may be fabricated.

The free-standing, merged ammonothermal group III nitride boule or wafer may be used as a substrate for fabrication into optoelectronic and electronic devices such as at least one of a light emitting diode, a laser diode, a photodetector, an avalanche photodiode, a transistor, a rectifier, a Schottky rectifier, a thyristor, a p-i-n diode, a metal-semiconductor-metal diode, high-electron-mobility transistor, a metal semiconductor field effect transistor, a metal oxide field effect transistor, a power metal oxide semiconductor field effect transistor, a power metal insulator semiconductor field effect transistor, a bipolar junction transistor, a metal insulator field effect transistor, a heterojunction bipolar transistor, a power insulated gate bipolar transistor, a power vertical junction field effect transistor, a cascode switch, an inner sub-band emitter, a quantum well infrared photodetector, a quantum dot infrared photodetector, a solar cell, or a diode for photoelectrochemical water splitting and hydrogen generation device. In some embodiments, the positions of the devices with respect to the domain structure in the free-standing, merged ammonothermal group III nitride boule or wafer are chosen so that the active regions of individual devices lie within a single domain or grain of the free-standing, merged ammonothermal group III nitride boule or wafer.

The free-standing, merged ammonothermal group III metal nitride boule or wafer may have a large-area crystallographic orientation within 5 degrees, within 2 degrees, within 1 degree, within 0.5 degree, within 0.2 degree, within 0.1 degree, within 0.05 degree, within 0.02 degree, or within 0.01 degree of (0001) +c-plane, (000-1) −c-plane, {10–10} m-plane, {1 1–2 0} a-plane, {11–2±2}, {60–6±1}, {50–5±1}, {40–4±1}, {30–3±1}, {50–5±2}, {70–7±3}, {20–2±1}, {30–3±2}, {40–4±3}, {50–5±4}, {10–1±1}, {1 0–1±2}, {1 0–1±3}, {2 1–3±1}, or {3 0–3±4}. The free-standing ammonothermal group III metal nitride boule or wafer may have an (h k i l) semipolar large-area surface orientation, where i=−(h+k) and l and at least one of h and k are nonzero.

In certain embodiments, a large-area surface of a free-standing ammonothermal group III metal nitride crystal or wafer has a crystallographic orientation that is miscut from {10–10} m-plane by between about −60 degrees and about +60 degrees toward [0001] +c-direction and by up to about 10 degrees toward an orthogonal <1-210> a-direction. In certain embodiments, a large-area surface of the free-standing ammonothermal group III metal nitride crystal or wafer has a crystallographic orientation that is miscut from {10–10} m-plane by between about −30 degrees and about +30 degrees toward [0001] +c-direction and by up to about 5 degrees toward an orthogonal <1-210> a-direction. In certain embodiments, a large-area surface of the free-standing ammonothermal group III metal nitride crystal or wafer has a crystallographic orientation that is miscut from {10–10} m-plane by between about −5 degrees and about +5 degrees toward [0001] +c-direction and by up to about 1 degree toward an orthogonal <1-210> a-direction. The free-standing ammonothermal group III metal nitride crystal or wafer may have a stacking fault concentration below $10^2$ $cm^{-1}$, below 10 $cm^{-1}$, or below 1 $cm^{-1}$, and a very low dislocation density, below about $10^5$ $cm^{-2}$, below about $10^4$ $cm^{-2}$, below about $10^3$ $cm^{-2}$, below about $10^2$ $cm^{-2}$, or below about 10 $cm^{-2}$ on one or both of the two large area surfaces.

The free-standing, merged ammonothermal group III metal nitride boule or wafer may have a symmetric x-ray rocking curve full width at half maximum (FWHM) less than about 200 arcsec, less than about 100 arcsec, less than about 50 arcsec, less than about 35 arcsec, less than about 25 arcsec, or less than about 15 arcsec. The free-standing, merged ammonothermal group III metal nitride boule or wafer may have a crystallographic radius of curvature greater than 0.1 meter, greater than 1 meter, greater than 10 meters, greater than 100 meters, or greater than 1000 meters, in at least one, at least two, or in three independent or orthogonal directions.

In certain embodiments, at least one surface of the free-standing, merged ammonothermal group III metal nitride boule or wafer has atomic impurity concentrations of at least one of oxygen (O), and hydrogen (H) above about $1 \times 10^{16}$ $cm^{-3}$, above about $1 \times 10^{17}$ $cm^{-3}$, or above about $1 \times 10^{18}$ $cm^{-3}$. In certain embodiments, a ratio of the atomic impurity concentration of H to the atomic impurity concentration of O is between about 0.3 and about 1000, between about 0.4 and about 10, or between about 10 and about 100. In certain embodiments, at least one surface of the free-standing, merged ammonothermal group III metal nitride boule or wafer has impurity concentrations of at least one of lithium (Li), sodium (Na), potassium (K), fluorine (F), chlorine (Cl), bromine (Br), or iodine (I) above about $1 \times 10^{15}$ $cm^{-3}$, above about $1 \times 10^{16}$ $cm^{-3}$, or above about $1 \times 10^{17}$ $cm^{-3}$, above about $1 \times 10^{18}$ $cm^{-3}$. In certain embodiments, the top and bottom surfaces of the free-standing, merged ammonothermal group III metal nitride boule or wafer may have impurity concentrations of O, H, carbon (C), Na, and K between about $1 \times 10^{16}$ $cm^{-3}$ and $1 \times 10^{19}$ $cm^{-3}$, between about $1 \times 10^{16}$ $cm^{-3}$ and $2 \times 10^{19}$ $cm^{-3}$, below $1 \times 10^{17}$ $cm^{-3}$, below $1 \times 10^{16}$ $cm^{-3}$, and below $1 \times 10^{16}$ $cm^{-3}$, respectively, as quantified by calibrated secondary ion mass spectrometry (SIMS). In another embodiment, the top and bottom surfaces of the free-standing, merged ammonothermal group III metal nitride boule or wafer may have impurity concentrations of O, H, C, and at least one of Na and K between about $1 \times 10^{16}$ $cm^{-3}$ and $1 \times 10^{19}$ $cm^{-3}$, between about $1 \times 10^{16}$ $cm^{-3}$ and $2 \times 10^{19}$ $cm^{-3}$, below $1 \times 10^{17}$ $cm^{-3}$, and between about $3 \times 10^{15}$ $cm^{-3}$ and $1 \times 10^{11}$ $cm^{-3}$, respectively, as quantified by calibrated secondary ion mass spectrometry (SIMS). In still another embodiment, the top and bottom surfaces of the free-standing, merged ammonothermal group III metal nitride boule or wafer may have impurity concentrations of O, H, C, and at least one of F and Cl between about $1 \times 10^{16}$ $cm^{-3}$ and $1 \times 10^{19}$ $cm^{-3}$, between about $1 \times 10^{16}$ $cm^{-3}$ and $2 \times 10^{19}$ $cm^{-3}$, below $1 \times 10^{17}$ $cm^{-3}$, and between about $1 \times 10^{15}$ $cm^{-3}$ and $1 \times 10^{19}$ $cm^{-3}$ respectively, as quantified by calibrated secondary ion mass spectrometry (SIMS). In some embodiments, the top and bottom surfaces of the free-standing, merged ammonothermal group III metal nitride boule or wafer may have impurity concentrations of H between about $5 \times 10^{17}$ $cm^{-3}$ and $1 \times 10^{19}$ $cm^{-3}$, as quantified by calibrated secondary ion mass spectrometry (SIMS). In certain embodiments, at least one surface of the free-standing, merged ammonothermal group III metal nitride boule or wafer has an impurity concentration of copper (Cu), manganese (Mn), and iron (Fe) between about $1 \times 10^{16}$ $cm^{-3}$ and $1 \times 10^{19}$ $cm^{-3}$. In a specific embodiment, the free-standing, merged ammonothermal group III metal nitride boule or wafer has an infrared absorption peak at about 3175 $cm^{-1}$, with an absorbance per unit thickness of greater than about 0.01 $cm^{-1}$.

The free-standing, merged ammonothermal group III metal nitride crystal or wafer may be characterized by a wurtzite structure substantially free from any cubic entities or other crystal structures, the other structures being less than about 0.1% in volume in reference to the substantially wurtzite structure.

Surprisingly, given the lattice mismatch between HVPE GaN and ammonothermal GaN, results of use of the herein-disclosed techniques show that ammonothermal lateral epitaxial overgrowth is capable of producing thick, large-area GaN layers that are free of cracks. In certain embodiments, the free-standing, merged ammonothermal group III metal nitride crystal or wafer has a diameter larger than about 25 millimeters, larger than about 50 millimeters, larger than about 75 millimeters, larger than about 100 millimeters, larger than about 150 millimeters, larger than about 200 millimeters, larger than about 300 millimeters, or larger than about 600 millimeters, and a thickness greater than about 0.1 millimeter, greater than about 0.2 millimeter, greater than about 0.3 millimeter, greater than about 0.5 millimeter, greater than about 1 millimeter, greater than about 2 millimeters, greater than about 3 millimeters, greater than about 5 millimeters, greater than about 10 millimeters, or greater than about 20 millimeters, and is substantially free of cracks. By contrast, we find that ammonothermal growth on large-area, un-patterned HVPE GaN seed crystals leads to cracking if the layers are thicker than a few hundred microns, even if a patterning process had been used to form the HVPE GaN seed crystal.

A free-standing, merged ammonothermal group III metal nitride wafer may be characterized by a total thickness variation (TTV) of less than about 25 micrometers, less than about 10 micrometers, less than about 5 micrometers, less than about 2 micrometers, or less than about 1 micrometer, and by a macroscopic bow that is less than about 200 micrometers, less than about 100 micrometers, less than about 50 micrometers, less than about 25 micrometers, or less than about 10 micrometers. A large-area surface of the free-standing, merged ammonothermal group III metal nitride wafer may have a concentration of macro defects, with a diameter or characteristic dimension greater than about 100 micrometers, of less than about 2 $cm^{-2}$, less than about 1 $cm^{-2}$, less than about 0.5 $cm^{-2}$, less than about 0.25 $cm^{-2}$, or less than about 0.1 $cm^{-2}$. The variation in miscut angle across a large-area surface of the free-standing ammonothermal group III metal nitride crystal or wafer may be less than about 1 degree, less than about 0.5 degree, less than about 0.2 degree, less than about 0.1 degree, less than about 0.05 degree, or less than about 0.025 degree in each of two orthogonal crystallographic directions. The root-mean-square surface roughness of a large-area surface of the free-standing, merged ammonothermal group III metal nitride wafer, as measured over an area of at least 10 μm×10 μm, may be less than about 0.5 nanometer, less than about 0.2 nanometer, less than about 0.15 nanometer, less than about 0.1 nanometer, or less than about 0.10 nanometer. The free-standing, merged ammonothermal group III metal nitride wafer may be characterized by n-type electrical conductivity, with a carrier concentration between about $1 \times 10^{17}$ $cm^{-3}$ and about $3 \times 10^{19}$ $cm^{-3}$ and a carrier mobility greater than about $10^0$ $cm^2/V\text{-}s$. In alternative embodiments, the free-standing, merged ammonothermal group III metal nitride wafer is characterized by p-type electrical conductivity, with a carrier concentration between about $1 \times 10^{15}$ $cm^{-3}$ and about $1 \times 10^{19}$ $cm^{-3}$. In still other embodiments, the free-standing, merged ammonothermal group III metal nitride wafer is characterized by semi-insulating electrical behavior, with a room-temperature resistivity greater than about $10^7$ ohm-centimeter, greater than about $10^8$ ohm-centimeter, greater than about $10^9$ ohm-centimeter, greater than about $10^{10}$ ohm-centimeter, or greater than about $10^{11}$ ohm-centimeter. In certain embodiments, the free-standing, merged ammonothermal group III metal nitride wafer is highly transparent, with an optical absorption coefficient at a wavelength of 400 nanometers that is less than about 10 $cm^{-1}$, less than about 5 $cm^{-1}$, less than about 2 $cm^{-1}$, less than about 1 $cm^{-1}$, less than about 0.5 $cm^{-1}$, less than about 0.2 $cm^{-1}$, or less than about 0.1 $cm^{-1}$.

In some embodiments, the free-standing, merged ammonothermal group III metal nitride crystal or wafer is used as a seed crystal for further bulk growth. In one specific embodiment, the further bulk growth comprises, merged ammonothermal bulk crystal growth. In another specific embodiment, the further bulk growth comprises high temperature solution crystal growth, also known as flux crystal growth. In yet another specific embodiment, the further bulk growth comprises HVPE. The further-grown crystal may be sliced, lapped, polished, etched, and/or chemically-mechanically polished into wafers by methods that are known in the art. The surface of the wafers may be characterized by a root-mean-square surface roughness measured over a 10-micrometer by 10-micrometer area that is less than about 1 nanometer or less than about 0.2 nanometers.

A wafer may be incorporated into a semiconductor structure. The semiconductor structure may comprise at least one $Al_xIn_yGa_{(1-x-y)}N$ epitaxial layer, where $0 \leq x$, y, $x+y \leq 1$. The epitaxial layer may be deposited on the wafer, for example, by metalorganic chemical vapor deposition (MOCVD) or by molecular beam epitaxy (MBE), according to methods that are known in the art. At least a portion of the semiconductor structure may form a portion of a gallium-nitride-based electronic device or optoelectronic device, such as a light emitting diode, a laser diode, a power-conversion photodiode, a photodetector, an avalanche photodiode, a photovoltaic, a solar cell, a cell for photoelectrochemical splitting of water, a transistor, a rectifier, and a thyristor; one of a transistor, a rectifier, a Schottky rectifier, a thyristor, a p-i-n diode, a metal-semiconductor-metal diode, high-electron mobility transistor, a metal semiconductor field effect transistor, a metal oxide field effect transistor, a power metal oxide semiconductor field effect transistor, a power metal insulator semiconductor field effect transistor, a bipolar junction transistor, a metal insulator field effect transistor, a heterojunction bipolar transistor, a power insulated gate bipolar transistor, a power vertical junction field effect transistor, a cascode switch, an inner sub-band emitter, a quantum well infrared photodetector, a quantum dot infrared photodetector, and combinations thereof. The gallium-nitride-based electronic device or optoelectronic device may be incorporated into a lamp or a fixture, such as a luminaire. The gallium-nitride-based electronic device or optoelectronic device, after singulation, may have lateral dimensions of at least 0.1 millimeter by 0.1 millimeter. The gallium-nitride-based electronic or optoelectronic device may have a maximum dimension of at least 8 millimeters and, for example, may comprise a laser diode. The gallium-nitride-based electronic or optoelectronic device may be entirely free of dislocations throughout its volume. For example, at a dislocation density of $10^4$ $cm^{-2}$, a substantial fraction of $0.1 \times 0.1$ $mm^2$ devices could be expected to be free of dislocations. At a dislocation density of $10^2$ $cm^{-2}$, a substantial fraction of $1 \times 1$ $mm^2$ devices could be expected to be free of dislocations. The gallium-nitride-based electronic or optoelectronic device may be entirely free of stacking faults throughout its volume. For example, at a stacking fault density of 1 $cm^{-1}$, a substantial fraction of $10 \times 1$ $mm^2$ stripe-shaped devices, such as laser diodes with nonpolar or semipolar large area surfaces and c-plane facets, could be expected to be free of stacking faults.

Figure 7A:
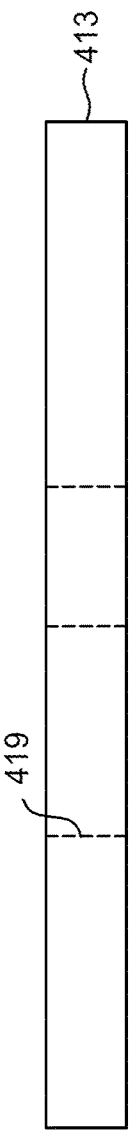
FIGS. 7A-7D are cross-sectional diagrams illustrating methods and resulting optical and electronic devices, according to embodiments of the present disclosure.
Figure 7B:
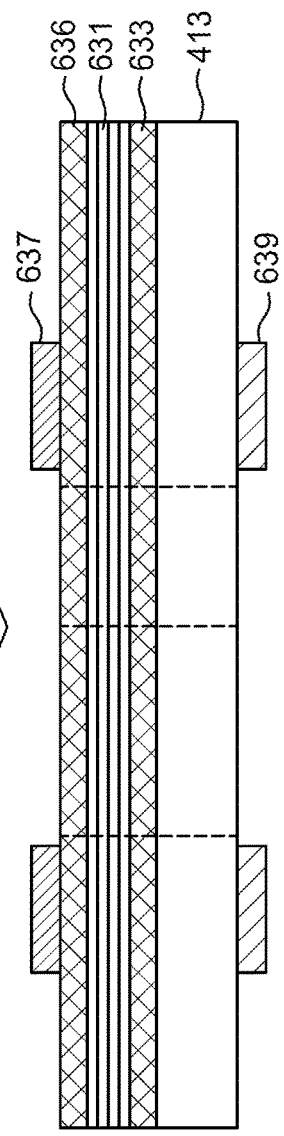

FIGS. 7A-7D are cross-sectional diagrams illustrating methods and resulting opto-electronic and electronic devices according to embodiments of the present disclosure. A two- or three-terminal device, such as an opto-electronic or electronic device, may be formed by a sequence of steps, including the step of epitaxial layer deposition on a free-standing, merged ammonothermal group III metal nitride wafer 431 or substrate having a pattern of locally-approximately-linear arrays 419 of threading dislocations and comprising at least one AlInGaN active layer or GaN drift layer 631, e.g., by MOCVD, as shown in FIG. 7B. In certain embodiments, the deposited layers include an n-type or n+ layer 633, a doped or unintentionally doped single quantum well (SQW), a multiple quantum well (MQW) structure, a double-heterostructure (DH structure), or an n− drift layer, and a p-type layer 636, as shown. The device structures may be vertical, as illustrated schematically in FIGS. 7B and 7D, or lateral, as illustrated schematically in FIG. 7C. The device may be electrically connected to an external circuit to provide a potential between an n-type contact 639 and a p-type contact 637. Additional layers may be deposited, such as separate confinement heterostructure (SCH) layers, claddings layers, an AlGaN electron-blocking layer, and a p+ contact layer, among others. In many cases, threading dislocations in the substrates, such as pattern of locally-approximately-linear arrays 419, will propagate into the deposited layers and potentially impact device performance.

Figure 7C:
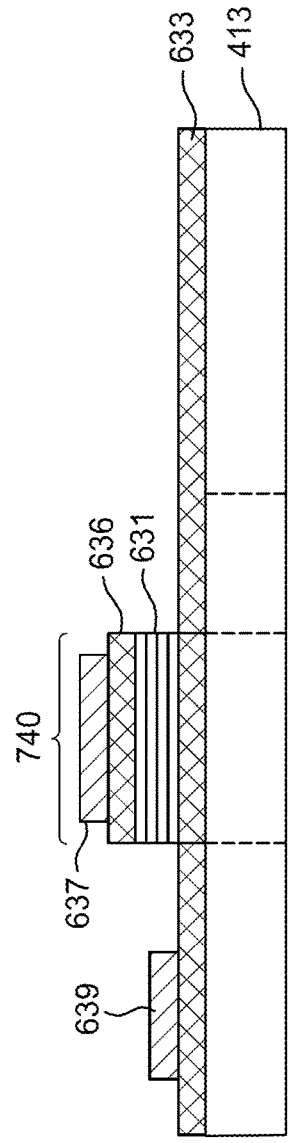

In a specific embodiment, the method also deposits an n-type contact 639, and a p-type contact 637 as shown in FIGS. 7B and 7C. In some embodiments, at least one of the set of n-type and p-type contacts is placed in specific registry respect to the coalescence fronts, wing regions, and/or window regions. A light emission portion may be centered over the coalescence front, or between coalescence fronts. In one specific embodiment, transparent p-type contacts are deposited and are placed in such a way that they avoid contact with coalescence fronts, which may have an elevated concentration of threading dislocations. In this way a light-emitting structure or photodiode structure may be formed has a relatively low concentration of threading dislocations. In this way a light-emitting structure, PN diode, photodiode, or Schottky barrier diode may be formed has a relatively low concentration of threading dislocations. In preferred embodiments, regions of light emission and/or maximum electric fields are designed to overlie wing regions 417 and to avoid the pattern of locally-approximately-linear arrays 419. In certain embodiments, a defective region associated with a coalescence front or a window region is utilized as a shunt path for reducing series resistance. In certain embodiments, n-type contacts are placed above coalescence fronts or window regions, with an edge dislocation density above $10^3$ $cm^{-1}$ and/or a threading dislocation density greater than about $10^5$ $cm^{-2}$.

Referring now to FIG. 7C, in some embodiments, e.g., a laser diode, a PN diode, a photodiode, or a Schottky barrier diode, the p-contact may be placed in a region substantially free of coalescence fronts. In certain embodiments, such as a laser diode, a laser ridge or stripe structure 740 may be place in a region substantially free of coalescence fronts. A mesa may be formed by conventional lithography and an n-type contact placed in electrical contact with the n-type layer and/or the substrate. Additional structures may be placed in registry with the coalescence fronts, such as sidewall passivation, an ion implanted region, field plates, and the like.

Figure 7D:
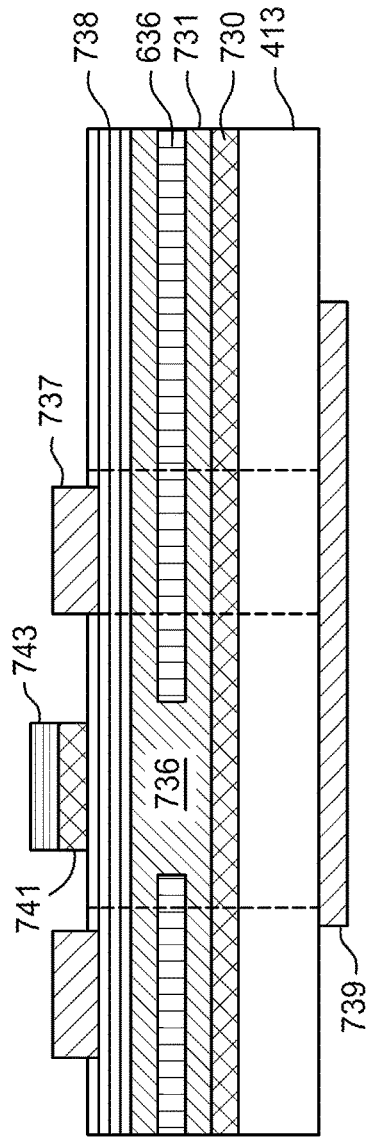

Referring now to FIG. 7D, in some embodiments, for example, a current aperture vertical electron transistor (CAVET), an n− drift layer 731 is deposited over an n+ contact layer 730, which in turn is deposited on free-standing, merged ammonothermal group III metal nitride boule 413. P-type layer 636 is formed above n− layer 731 with aperture 736. Following regrowth of the balance of n− layer 731, an AlGaN 2D electron gas layer 738 is deposited. Finally, source contacts 737, drain contact 739, dielectric layer 741, and gate contact 743 are deposited. In preferred embodiments, aperture 736 is positioned away from first coalescence fronts 419 and second coalescence fronts 435. In preferred embodiments, aperture 736 is positioned away from window regions 415. In preferred embodiments, aperture 736 is positioned over wing regions 417. Other types of three-terminal devices, such as trench CAVETs, MOSFETs, and the like are positioned so that the regions of maximum electric fields are located within wing regions 417.

Figure 8:
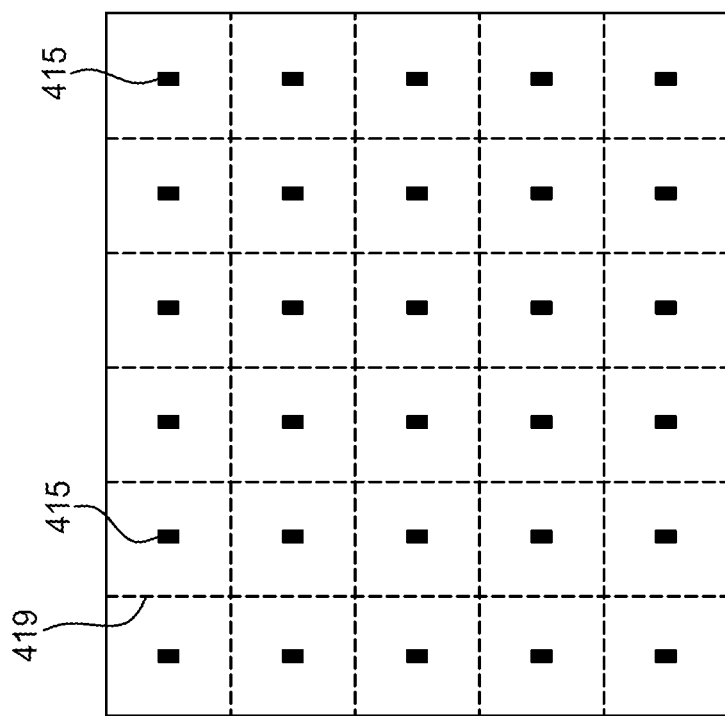
FIG. 8 is a top view (plan view) of a free-standing laterally-grown GaN boule or wafer formed by ammonothermal lateral epitaxial growth using a mask layer having openings arranged in a two-dimensional square array.

FIG. 8 shows a top view (plan view) of a free-standing GaN substrate formed by ammonothermal lateral epitaxial growth using a mask in the form of a two-dimensional array. The GaN layer grew through the two-dimensional array of openings in the original mask layer to form window regions 415. Coalescence of the GaN layer may form a two-dimensional grid of the pattern of locally-approximately-linear arrays 419 of threading dislocations.

Figure 9A:
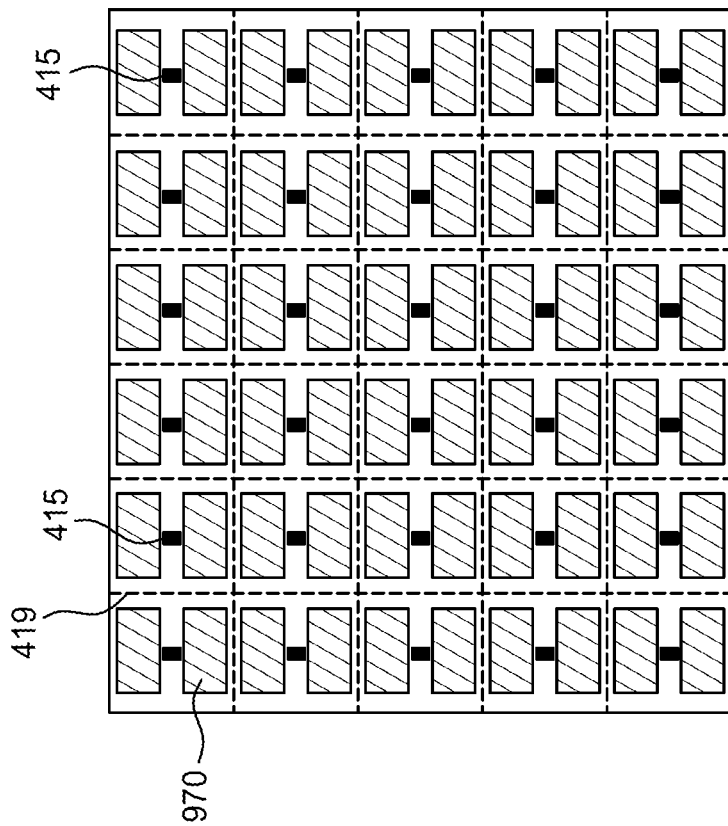
FIGS. 9A, 9B, and 9C are top views of a device structure, for example, of LEDs, according to embodiments of the present disclosure.
Figure 9C:
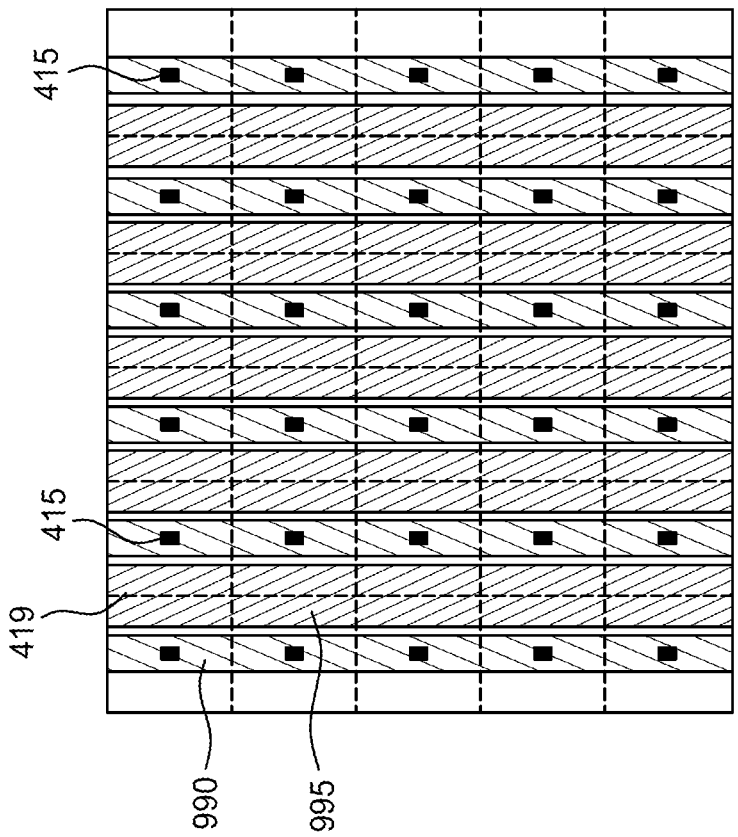
Figure 9B:
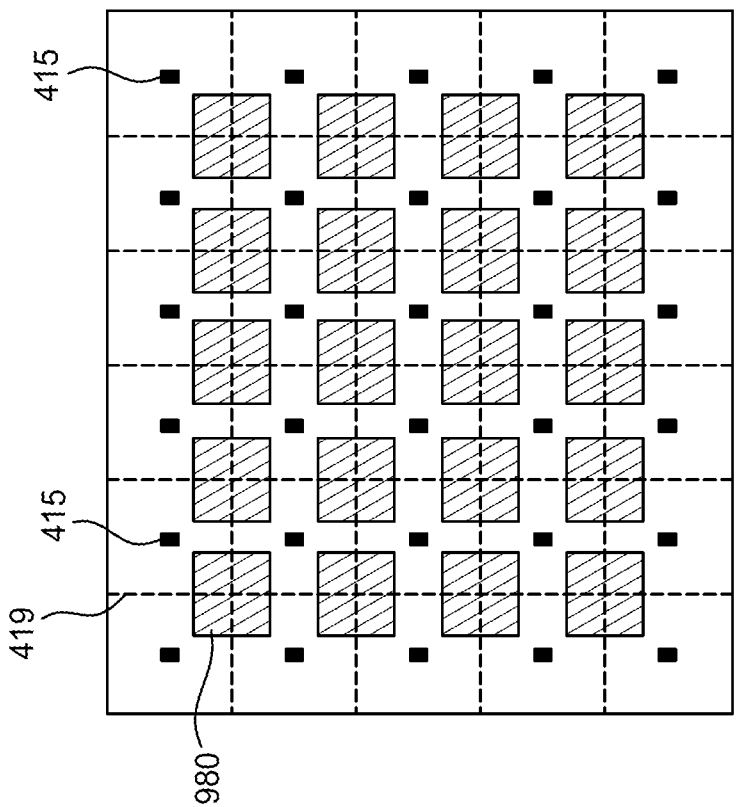

FIG. 9A shows a top view of a device structure, for example, of LEDs, where transparent p-contacts 970 have been aligned with respect and placed so as not to be in contact with either the window regions 415 or the pattern of locally-approximately-linear arrays 419 of threading dislocations. FIG. 9B shows a top view of an alternative embodiment of a device structure, for example, of LEDs, where electrical contacts 980 are again aligned with respect to window regions 415 and pattern of locally-approximately-linear arrays 419 of threading dislocations but now are positioned above pattern of locally-approximately-linear arrays 419 of threading dislocations. FIG. 9C shows a top view of an alternative embodiment of a device structure, for example, of a flip-chip LED, where n-type electrical contacts 990 are aligned with respect to window regions 415 and p-type electrical contacts 995 are aligned between window regions 415.

Individual die, for example, light emitting diodes or laser diodes, may be formed by sawing, cleaving, slicing, singulating, or the like, between adjacent sets of electrical contacts. Referring again to FIG. 9A, slicing may be performed along the pattern of locally-approximately-linear arrays 419 of threading dislocations. Slicing may also be performed through window regions 415. Referring now to FIG. 9B, in certain embodiments, slicing may be performed through window regions 415 but not along the pattern of locally-approximately-linear arrays 419 of threading dislocations. Referring again to FIG. 9C, in certain embodiments slicing is performed neither through the seed regions nor along all coalescence fronts. Depending on the arrangement of the one- or two-dimensional array of seed regions, the singulated die may have three corners, four corners, or six corners.

The methods described herein provide means for fabricating large-area group III metal nitride substrates, albeit having some potentially defective regions. The methods described herein provide means for fabricating high-performance light emitting diodes and/or laser diodes that avoid potential issues associated with defective regions in the large-area group III metal nitride substrates.

Tiled Crystal Array Substrate Example(s)

Referring again to FIG. 19D and also to FIG. 19G, in certain embodiments, rather than using tiled composite structure 1960 as a seed crystal for further bulk crystal growth, tiled composite structure 1960 is processed further to form tiled composite substrate 1980 and used directly as a substrate for optical or electronic device fabrication. The formed tiled composite substrate 1980, includes an array of seed crystals 370 that are bonded together by a polycrystalline GaN layer 1950, which may also be referred to as a matrix member. The matrix member has a diameter that is greater than 40 mm. In some embodiments, the array of seed crystals 370 are positioned such that a surface 1975 of each seed crystal is parallel to a first plane, such as the X-Y plane shown in FIG. 19G. The array of seed crystals 370 may be positioned such that a gap 1986 (FIG. 19G) is formed between adjacent edges of the seed crystals 370. In one example, the gap 1986 is less than 2 millimeters (mm), such as between 0.1 micrometer (μm) and 1 millimeters (mm), or between 0.1 micrometer and 200 micrometers, between 0.1 micrometer and 50 micrometers, or between 0.2 micrometer and 50 micrometers. In certain embodiments, gaps 1986 are completely filled with matrix member material 1950. In certain embodiments, the top surface of matrix member material 1950 lies below that of seed crystal surfaces 1975, as illustrated in FIG. 19D. In certain embodiments, no matrix member material 1950 is present within gaps 1986, so that seed crystals 370 are held in place only by a bond from their back sides to matrix member 1950. In certain embodiments, the surfaces 1975 of seed crystals 370 within the array are planarized by grinding, lapping, polishing, or the like. In certain embodiments, surfaces 1975 are chemically-mechanically-polished and subjected to a final-clean operation in a clean room environment. In certain embodiments, during a process used to form the tiled composite substrate 1980 the backside of a tiled composite structure 1960 is thinned and planarized, for example, by grinding, lapping, and/or polishing. In certain embodiments, the thickness of tiled composite substrate 1980 is the same as the thickness of seed crystals 370, so that matrix member 1950 is present only within gaps 1986. In other embodiments, the thickness of tiled composite substrate 1980 is greater than the thickness of seed crystals 370, in which case matrix member 1950 is bonded to the back sides of seed crystals 370. The perimeter 1985 of tiled composite structure 1960 may be ground to form outer edge 1990 of tiled composite substrate 1980. In certain embodiments, a chamfer, bevel, or rounded edge is ground into edge 1990 of tiled composite substrate 1980. In some embodiments, the outer edge 1990, which surrounds the array of seed crystals 370, is circular is shape. In certain embodiments, one or more orientation flats 1995 may be ground into the edge 1990 of tiled composite substrate 1980. In certain embodiments, tiled composite substrate 1980 has a diameter between 20 millimeters and 210 millimeters, between 20 millimeters and 30 millimeters, between 45 millimeters and 55 millimeters, between 90 millimeters and 110 millimeters, between 140 millimeters and 160 millimeters, or between 190 millimeters and 210 millimeters and a thickness between 150 micrometers and about 5 millimeters, between about 200 micrometers and about 2 millimeters, or between about 250 micrometers and about 1.5 millimeters.

In certain embodiments, the thicknesses of each of seed crystals 370 within tiled composite substrate 1980 are equal, to within 50 micrometers, to within 25 micrometers, to within 10 micrometers, to within 5 micrometers, to within 2 micrometers, or to within 1 micrometer. In certain embodiments, the surfaces 1975 of each of seed crystals 370 are co-planar, to within 10 micrometers, to within 5 micrometers, to within 2 micrometers, or to within 1 micrometer.

The crystallographic miscut of each of the surfaces 1975 of seed crystals 370 have magnitudes that may be equal, within 0.5 degree, within 0.3 degree, within 0.2 degree, within 0.1 degree, within 0.05 degree, within 0.02 degree, or within 0.01 degree. In preferred embodiments, the directions of the crystallographic miscuts of each of the seed crystals 370 are aligned to within 10 degrees, within 5 degrees, within 2 degrees, within 1 degree, within 0.5 degree, within 0.2 degree, or within 0.1 degree. In a specific embodiment, each of surfaces 1975 of seed crystals 370 have an orientation that is within 5 degrees, within 2 degrees, within 1 degree, or within 0.5 degree of an orientation selected from $\{20\text{–}2\pm1\}$, $\{30\text{–}3\pm1\}$, and $\{10\text{–}10\}$ and a miscut in the a-direction that is less than 0.5 degree, less than 0.2 degree, less than 0.1 degree, or less than 0.05 degree.

Tiled composite substrate 1980 may be characterized by a total thickness variation (TTV) of less than about 25 micrometers, less than about 10 micrometers, less than about 5 micrometers, less than about 2 micrometers, or less than about 1 micrometer, and by a macroscopic bow that is less than about 200 micrometers, less than about 100 micrometers, less than about 50 micrometers, less than about 25 micrometers, or less than about 10 micrometers. Small values of the TTV and of the macroscopic bow are useful for electronic device fabrication, as they enable deposition of epitaxial layers with uniform properties and high device yields. At least one surface 1975 (FIG. 19D) of the tiled composite substrate 1980 may have a concentration of macro defects, with a diameter or characteristic dimension greater than about 100 micrometers, of less than about 2 $cm^{-2}$, less than about 1 $cm^{-2}$, less than about 0.5 $cm^{-2}$, less than about 0.25 $cm^{-2}$ or less than about 0.1 $cm^{-2}$. The variation in miscut angle across the ensemble of surfaces 1975 of seed crystals 370 may be less than about 1 degree, less than about 0.5 degree, less than about 0.2 degree, less than about 0.1 degree, less than about 0.05 degree, or less than about 0.025 degree in each of two orthogonal crystallographic directions. The average root-mean-square surface roughness of least one surface 1975 of tiled composite substrate 1980, as measured over an area of at least 10 m×10 m, may be less than about 0.5 nanometer, less than about 0.2 nanometer, less than about 0.15 nanometer, less than about 0.1 nanometer, or less than about 0.10 nanometer. At least one seed crystal 370 in tiled composite substrate 1980 may be characterized by n-type electrical conductivity, with a carrier concentration between about $1\times10^{17}$ $cm^{-3}$ and about $3\times10^{19}$ $cm^{-3}$ and a carrier mobility greater than about $10^0$ $cm^2$N-s. In alternative embodiments, at least one seed crystal 370 in tiled composite substrate 1980 is characterized by p-type electrical conductivity, with a carrier concentration between about $1\times10^{15}$ $cm^{-3}$ and about $1\times10^{19}$ $cm^{-3}$. In still other embodiments, at least one seed crystal 370 in tiled composite substrate 1980 wafer is characterized by semi-insulating electrical behavior, with a room-temperature resistivity greater than about 107 ohm-centimeter, greater than about $10^8$ ohm-centimeter, greater than about 109 ohm-centimeter, greater than about $10^{10}$ ohm-centimeter, or greater than about $10^{11}$ ohm-centimeter.

One or more device structures may be grown or deposited on one or more of seed crystals 370 within tiled composite substrate 1980, as shown schematically in FIG. 23A. In certain embodiments, following deposition of first layer 2310, for example, by MOCVD, MBE, or HVPE, a release layer 2320 may be deposited thereon. In some embodiments, the first layer 2310 may include a layer that is doped with an n-type dopant. The release layer 2320 can include or consist of InGaN. The release layer 2320 may include or consist of a multiple quantum well or a strained-layer superlattice.

In certain embodiments, device layers 2340 are then deposited, overlying release layer 2320. Device layers 2340 may include one or more of a low-n GaN drift layer, one or more AlInGaN active layers, one or more AlInGaN cladding layers, a p-type layer, and a p-type electrical contact. Other layers may also be present in device layers 2340, as may be suitable for fabrication of devices such as light emitting diodes, laser diodes, photodiodes, diodes, transistors, or the like. In certain embodiments, adhesion layer 2350 may be deposited overlying device layers 2340. In some embodiments, trenches 2355 are formed through adhesion layer 2350, device layers 2340, and into or through release layer 2320. As shown schematically in FIG. 23B, the handle substrate 2360 is then bonded to the adhesion layer 2350. The process of bonding of handle substrate 2360 to adhesion layer 2350 can be accomplished by one or more of thermocompression bonding, soldering, sinterless silver bonding, or adhesive bonding. In some embodiments, release layer 2320 is then removed, causing separation of one or more device layers 2340, bonded to handle substrate 2360, from one or more seed crystals 370, as shown schematically in FIG. 23C. In certain embodiments, release layer 2320 is removed by photoelectrochemical etching. In certain embodiments, the order of these operations is changed. In one specific embodiment, some or all of release layer 2320 is removed prior to bonding of handle substrate 2360 to adhesion layer 2350.

In certain embodiments, surfaces 2370 of seed crystals 370, which may also have portions of first layer 2310 or other layers present, may be re-planarized by one or more of grinding, lapping, and polishing. The surfaces 2370 may be further prepared by chemical-mechanical polishing and final cleaning in a clean room environment. After removal of device layers 2340 from tiled composite substrate 1980 and re-preparation of surfaces 2370 of seed crystals 370 within tiled composite substrate 1980, tiled composite substrate is again used directly as a substrate for optical or electronic device fabrication. The tiled composite substrate 1980 can be re-used at least once, at least twice, at least three times, at least five times, or at least ten times as a substrate used in the formation of an optical or electronic device. While FIGS. 19A-19E and FIGS. 23A-23C illustrate a configuration in which the polycrystalline GaN layer 1950 of the tiled composite substrate 1980 extends over a surface of the seed crystals 370 (e.g., lower surface in FIGS. 23A-23C) this configuration is not intended to be limiting as to scope of the disclosure herein, since in some configurations the polycrystalline GaN layer 1950 is only positioned between the edges of the seed crystals 370 and not over either of the major surfaces (e.g., upper and lower surfaces in FIGS. 23A-23B) of the seed crystals 370.

The above sequence of steps provides a method according to an embodiment of the present disclosure. In a specific embodiment, the present disclosure provides a method and resulting crystalline material provided by a high pressure apparatus having structured support members. Other alternatives can also be provided where steps are added, one or more steps are removed, or one or more steps are provided in a different sequence without departing from the scope of the claims herein.

EXAMPLES

Embodiments provided by the present disclosure are further illustrated by reference to the following examples. It will be apparent to those skilled in the art that many modifications, both to materials, and methods, may be practiced without departing from the scope of the disclosure.

Example 1

Figure 10:
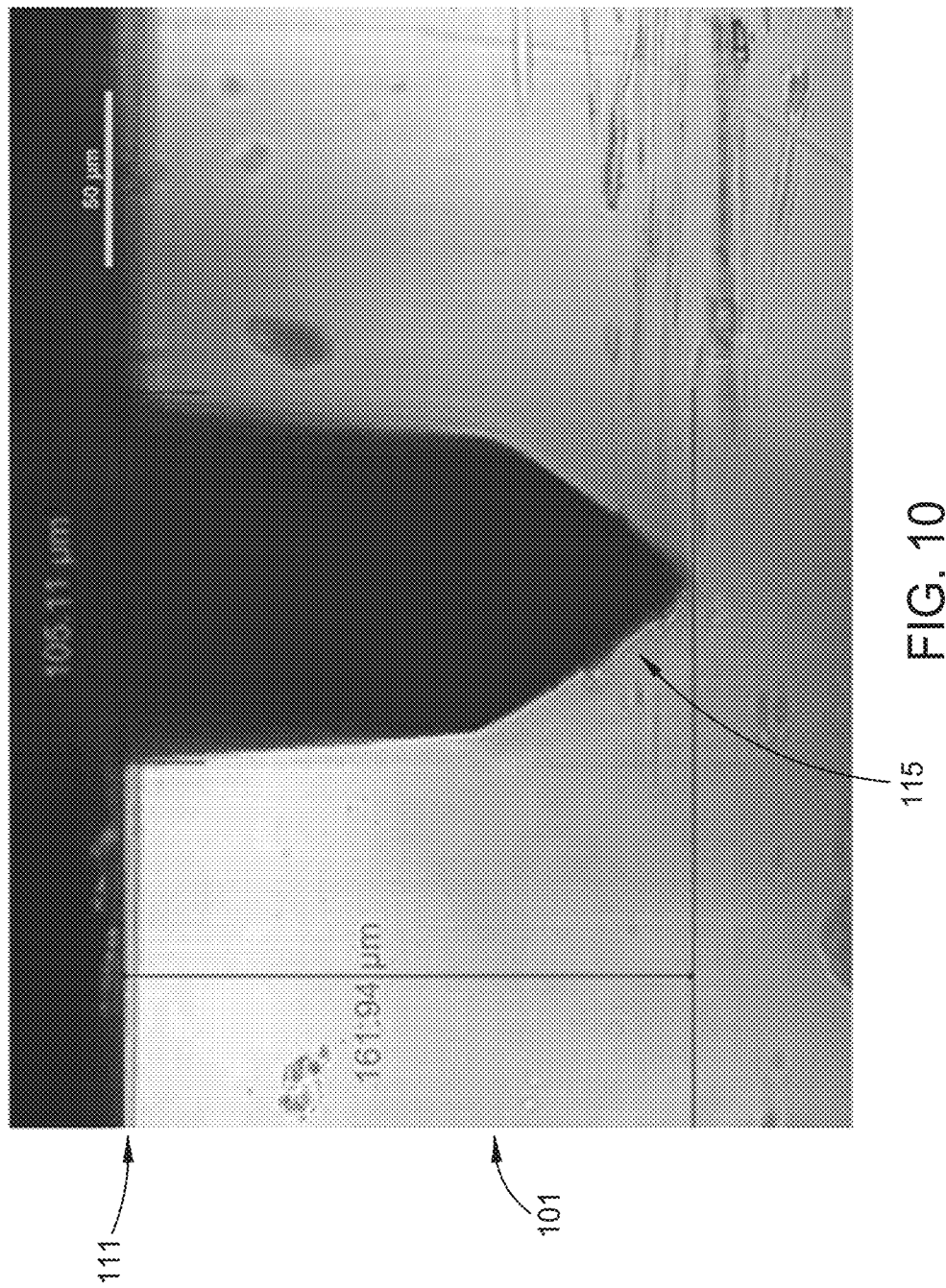
FIG. 10 is an optical micrograph of a polished cross section of a trench in a c-plane GaN substrate that has been prepared, according to an embodiment of the present disclosure.

A c-plane oriented bulk GaN crystal grown by HVPE, approximately 0.3 millimeters thick, was provided for use as a substrate 101 for patterning and ammonothermal crystal growth. A 100-nanometer-thick layer of TiW was sputter-deposited as an adhesion layer on the (000-1) N-face of the substrate, followed by a 780-nanometer-thick inert layer comprising Au. A 6-micrometer-thick Au layer was then electroplated on the sputtered layer, increasing the thickness of the inert layer (e.g., blanket mask 116). Using AZ-4300 as a photoresist (e.g., photoresist layer 103), a pattern comprising linear arrays of 3-micrometer-wide by 1-centimeter-long slits (e.g., openings 112), with a pitch diameter of 1200 micrometers was defined. A wet-etch process was performed, using a commercial TFA gold etching solution at room temperature, as shown schematically in FIGS. 1M-1P, to obtain a substrate with patterned mask layer 111. The mask pattern comprised domains of m-stripes, with linear openings oriented approximately 30-40 micrometers wide and parallel to <10-10>. The substrate with patterned mask layer 111 was then placed in a stirred beaker with concentrated $H_3PO_4$. The beaker was heated to approximately 280 degrees Celsius over approximately 30 minutes, held at this temperature for approximately 90 minutes, and cooled. A cross section of a trench 115 formed by this procedure, having a depth of approximately 162 micrometers and a width at the top of approximately 105 micrometers, is shown in FIG. 10. The sidewalls of the trench 115, remarkably, are nearly vertical.

Example 2

Figure 11B:
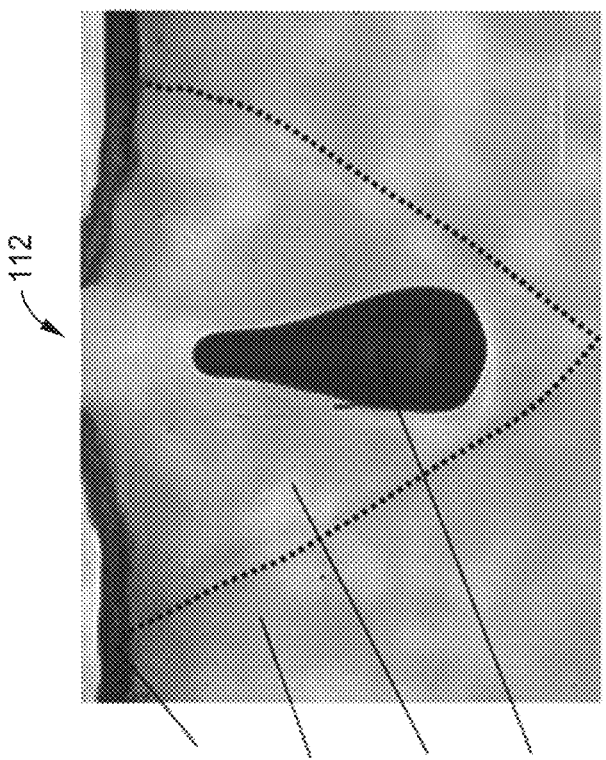
FIGS. 11A and 11B are optical micrographs of a cross section of a c-plane ammonothermal GaN layer that has formed according to an embodiment of the present disclosure, together with a close-up image from the same cross section.
Figure 11A:
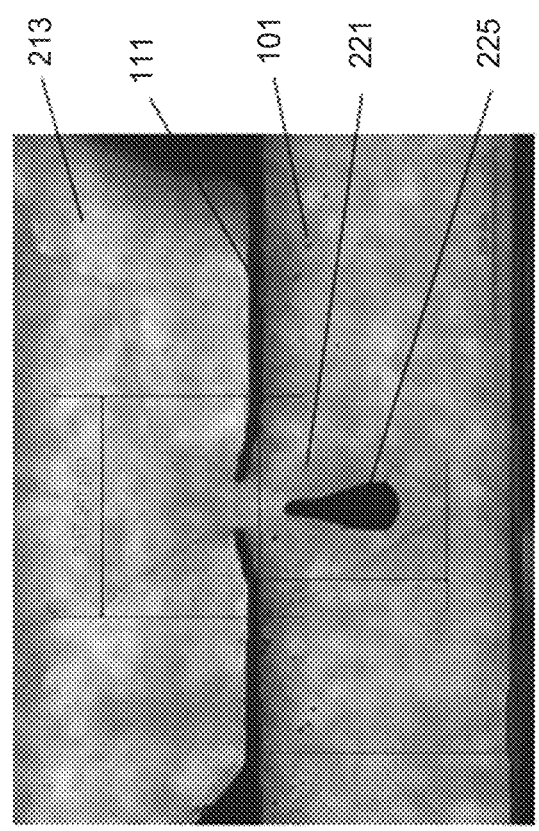

A patterned, trenched c-plane-oriented bulk GaN substrate 101 was prepared by a similar procedure as that described in Example 1. The patterned substrate was placed in a silver capsule along with a 15%-open-area baffle, polycrystalline GaN nutrient, $NH_4F$ mineralizer, and ammonia, and the capsule was sealed. The ratios of GaN nutrient and $NH_4F$ mineralizer to ammonia were approximately 1.69 and 0.099 respectively, by weight. The capsule was placed in an internally-heated high pressure apparatus and heated to temperatures of approximately 666 degrees Celsius for the upper, nutrient zone and approximately 681 degrees Celsius for the lower, crystal growth zone, maintained at these temperatures for approximately 215 hours, and then cooled and removed. Ammonothermal GaN filled in most of the volume in the trenches, grew through the linear openings in the patterned mask on the HVPE GaN substrate, grew laterally, and coalesced fully, forming an ammonothermal GaN layer approximately 1200 micrometers thick with a smooth top surface. Two parallel cuts were made in the ammonothermal GaN layer, perpendicular to both the surface and the patterns, resulting in a bar-shaped test specimen with m-plane surfaces. One m-plane surface of the test specimen was polished and examined by optical microscopy, as shown in FIGS. 11A and 11B. An interface is visible between the substrate 101 and laterally-grown group III metal nitride material 221, as illustrated by the dotted line in the expanded view on the right side of FIG. 11B. Patterned mask layer 111 and void 225 both appear as black in the images and underlie ammonothermal group III metal nitride layer 213.

Example 3

Figure 12B:
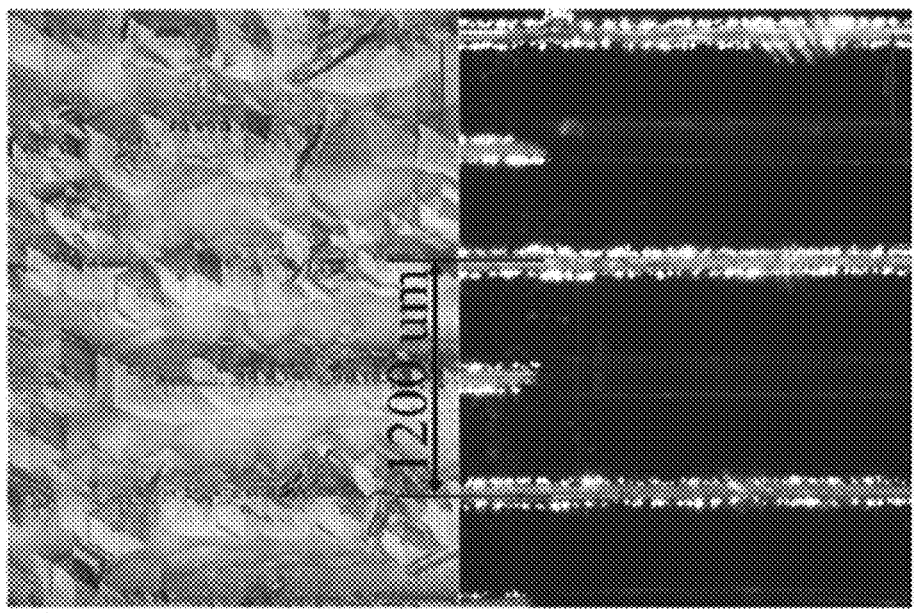
FIGS. 12A and 12B are plan-view optical micrographs of c-plane ammonothermal GaN layers that have been subjected to defect-selective etching, showing a low concentration of etch pits in the window region above slit-shaped mask openings oriented along a <10-10> direction and a linear array of etch pits (threading dislocations) at coalescence fronts formed approximately midway between two window regions, according to two embodiments of the present disclosure.
Figure 12A:
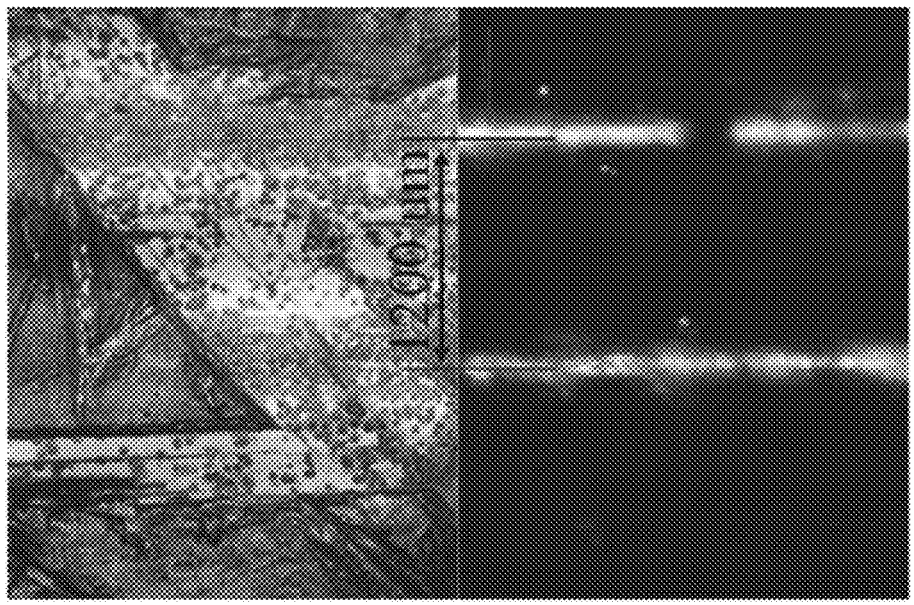

A patterned, trenched c-plane-oriented bulk GaN substrate was prepared by a similar procedure as that described in Examples 1 and 2, and the final group III metal nitride layer 213 is shown in FIG. 12B (i.e., right side figures). A second patterned substrate was prepared by a similar procedure except that no trenches were prepared below the mask openings, and the final group III metal nitride layer is shown in FIG. 12A (i.e., left side figures). The patterned substrates were placed in a silver capsule along with a 15%-open-area baffle, polycrystalline GaN nutrient, $NH_4F$ mineralizer, and ammonia, and the capsule was sealed. The ratios of GaN nutrient and $NH_4F$ mineralizer to ammonia were approximately 2.05 and 0.099 respectively, by weight. The capsule was placed in an internally-heated high pressure apparatus and heated to temperatures of approximately 666 degrees Celsius for the upper, nutrient zone and approximately 678 degrees Celsius for the lower, crystal growth zone, maintained at these temperatures for approximately 427 hours, and then cooled and removed. Ammonothermal GaN filled in most of the volume in the trenches of the trenched substrate (FIG. 12B), grew through the linear openings in the patterned mask on the HVPE GaN substrate, grew laterally, and coalesced fully, forming an ammonothermal GaN layer approximately 2100 micrometers thick with a smooth top surface. Ammonothermal GaN layer similarly grew through the linear openings in the patterned mask on the patterned, untrenched HVPE GaN substrate (FIG. 12A), grew laterally, and coalesced fully, forming an ammonothermal GaN layer approximately 2100 micrometers thick with a smooth top surface. The surface of both ammonothermal GaN layers were lightly etched and were examined by optical microscopy. Differential interference contrast (Nomarski) micrographs and transmission micrographs of both layers are shown in FIGS. 12A-12B. The average etch pit density, which is believed to accurately represent the threading dislocation density, of the ammonothermal GaN layer grown on the patterned substrate without trenches (FIG. 12A), was approximately $1.0 \times 10^5$ $cm^{-2}$. The average etch pit density of the ammonothermal GaN layer grown on the patterned, trenched substrate (FIG. 12B), was approximately $1.0 \times 10^4$ $cm^{-2}$, a full order-of-magnitude improvement.

Example 4

Figure 14:
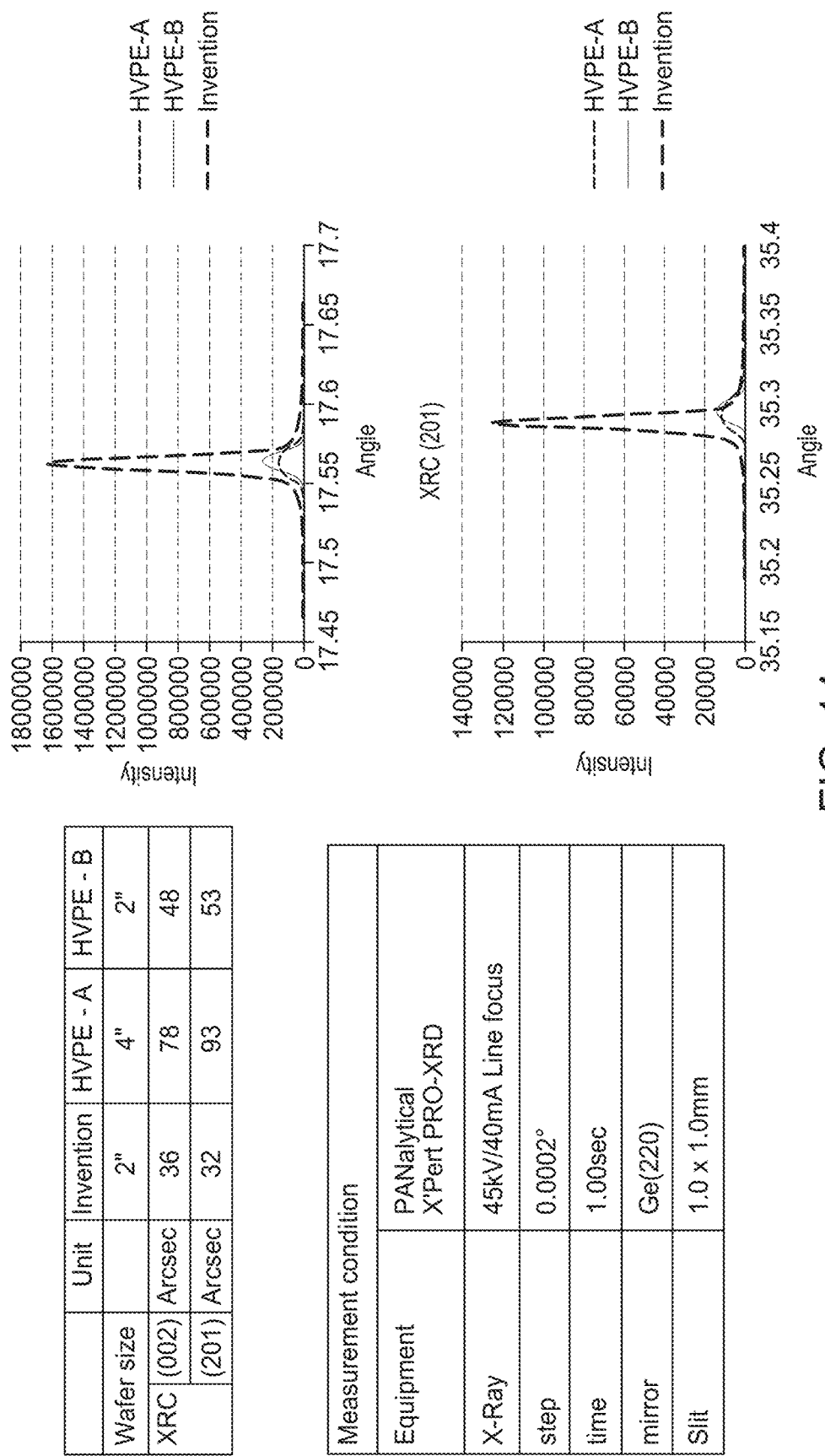
FIG. 14 is a summary of x-ray rocking-curve measurements comparing the full-width-at-half-maximum values of two reflections from a 50 mm wafer fabricated according to one embodiment of the present disclosure with that of a commercially-available 50 mm wafer.

A patterned, trenched c-plane-oriented bulk GaN substrate was prepared by a similar procedure as that described in Examples 1 and 2 but with a pitch of 800 micrometers. The patterned, trenched substrate was placed in a silver capsule along with a 15%-open-area baffle, polycrystalline GaN nutrient, $NH_4F$ mineralizer, and ammonia, and the capsule was sealed. The ratios of GaN nutrient and $NH_4F$ mineralizer to ammonia were approximately 1.71 and 0.099 respectively, by weight. The capsule was placed in an internally-heated high pressure apparatus and heated to temperatures of approximately 668 degrees Celsius for the upper, nutrient zone and approximately 678 degrees Celsius for the lower, crystal growth zone, maintained at these temperatures for approximately 485 hours, and then cooled and removed. Ammonothermal GaN filled in most of the volume in the trenches of the trenched substrate, grew through the linear openings in the patterned mask on the HVPE GaN substrate, grew laterally, and coalesced fully, forming an ammonothermal GaN layer approximately 980 micrometers thick with a smooth top surface. The HVPE GaN substrate was removed by grinding, and the resulting free-standing ammonothermal GaN substrate was polished and chemical-mechanical polished. The free-standing ammonothermal GaN substrate was then characterized by x-ray diffraction, using a PANalytical X'Pert PRO diffractometer using an electron energy of 45 kV with a 40 mA line focus, a 0.0002 degree step, a 1 sec dwell time, an Ge(220) mirror, a slit height of 1.0 mm and a slit width of 1.0 mm, at nine different locations across the substrate. The results of an analysis of the formed GaN substrate are summarized in FIG. 13. The range of miscut along [1-100] was measured to be 0.078 degrees over the central 80% of the large area surface of the crystal, and the range of miscut along [11-20] was measured to be 0.063 degrees over the central 80% of the large area surface of the crystal. Thus, in some embodiments, a free standing crystal having a miscut angle that varies by 0.1 degree or less in the central 80% of the large area surface of the crystal along a first direction and a miscut angle that varies by 0.1 degree or less in the central 80% of the large area surface of the crystal along a second direction orthogonal to the first direction. By contrast, an identical measurement on a commercial HVPE wafer resulted in a range of miscut along [1-100] of 0.224 degrees and a range of miscut along [11-20] of 0.236 degrees. The full width at half maximum of the rocking-curve for the (002) reflection was measured as 36 arc seconds, while that of the (201) reflection was measured as 32 arc seconds, as summarized in the tables and graphs shown FIG. 14. By contrast, identical measurements on a 50 mm diameter, commercial HVPE substrate produced values of 48 and 53 arc seconds, respectively, and identical measurements on a 100 mm diameter, commercial HVPE substrate produced values of 78 and 93 arc seconds, respectively.

Example 5

Figure 15:
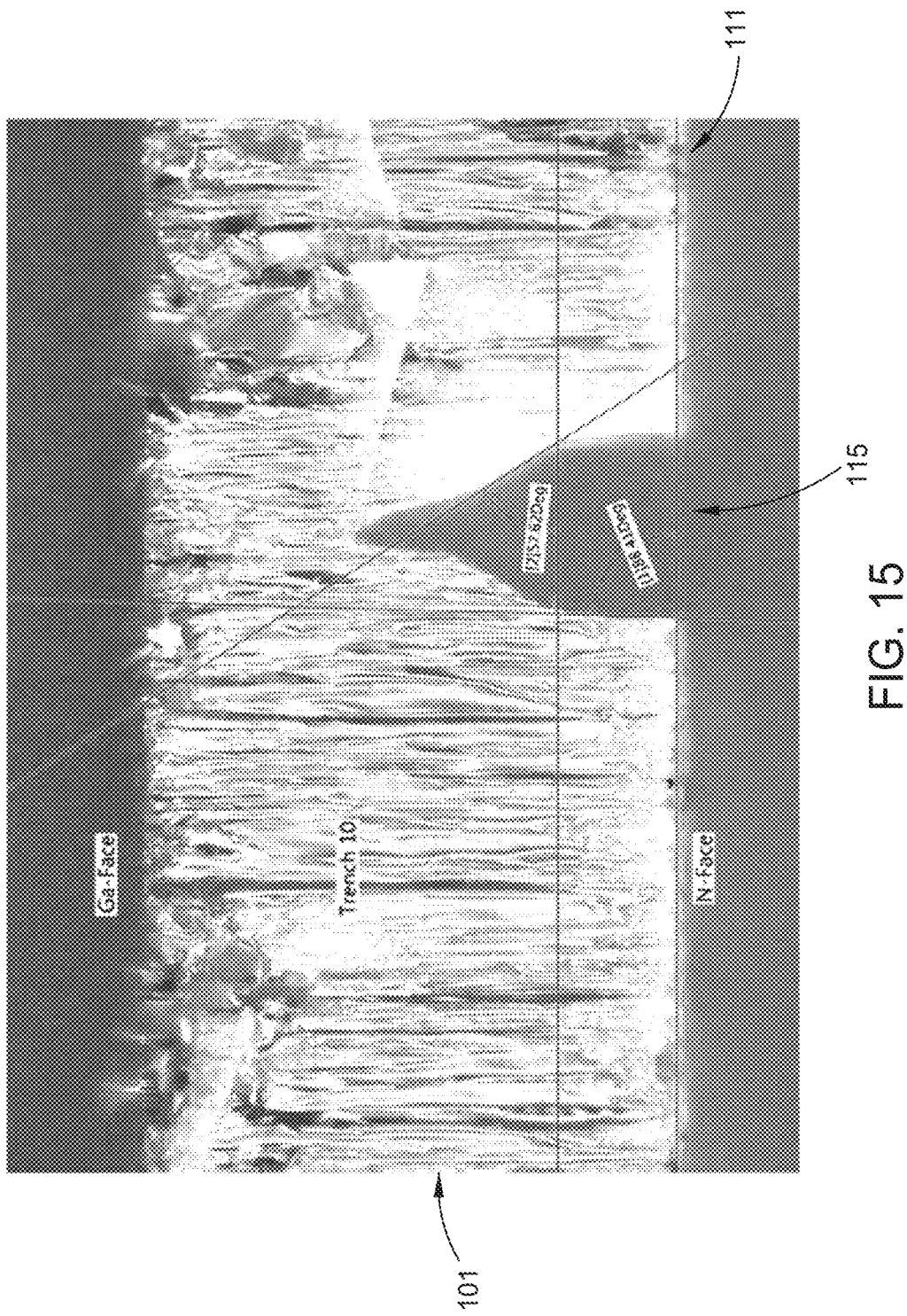
FIG. 15 is an optical micrograph of a laser-cut cross section of a trench in a c-plane GaN substrate that has been prepared, according to an embodiment of the present disclosure.

A c-plane oriented bulk GaN crystal grown by HVPE, approximately 0.3 millimeters thick, was provided for use as a substrate for patterning and ammonothermal crystal growth. A 100-nanometer-thick layer of TiW was sputter-deposited as an adhesion layer on the (000-1) N-face of the substrate, followed by a 780-nanometer-thick inert layer comprising Au. A 6-micrometer-thick Au layer was then electroplated on the sputtered layer, increasing the thickness of the inert layer. A pattern was formed on the N-face of the substrate using a frequency-doubled YAG laser with nano-second pulses. The pattern comprised domains of m-trenches, with linear openings oriented approximately 50-60 micrometers wide and parallel to <10-10>, with a pitch of 1200 micrometers. The patterned substrate was then placed in a stirred beaker with concentrated $H_3PO_4$. The beaker was heated to approximately 280 degrees Celsius over approximately 30 minutes, held at this temperature for approximately 60 minutes, and cooled. A cross section of a trench formed by this procedure, having a depth of approximately 200 micrometers and a width at the top of approximately 80 micrometers, is shown in FIG. 15. The sidewalls of the trench, remarkably, are nearly vertical.

Example 6

Figure 16:
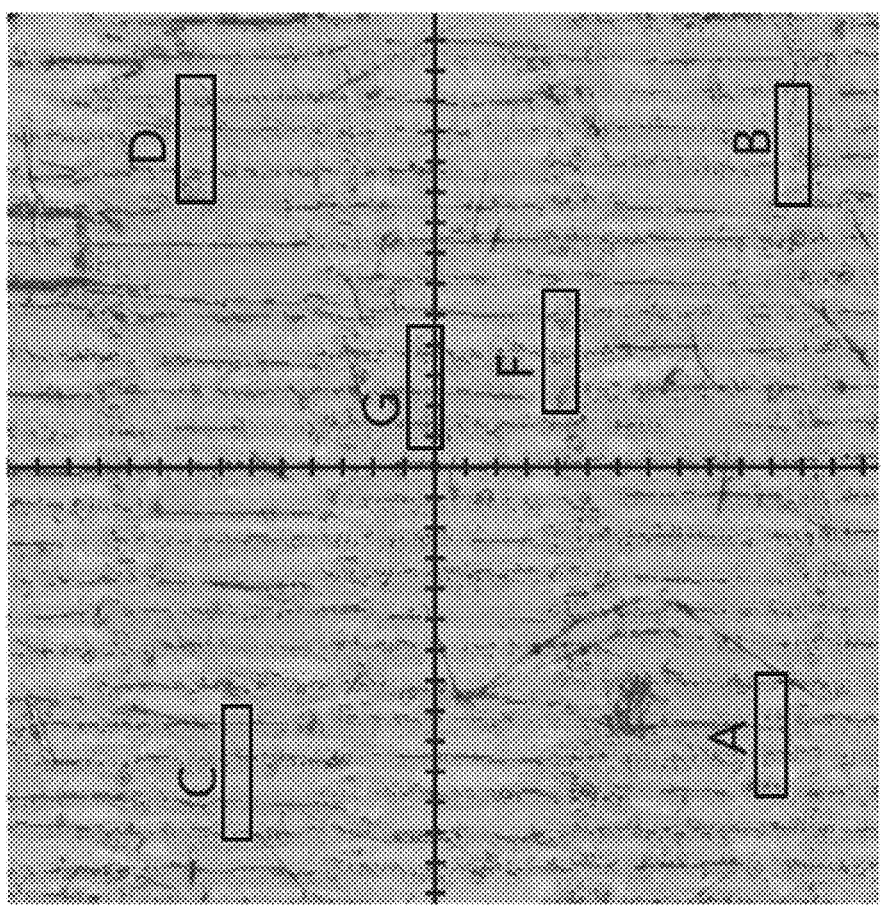
FIG. 16 is a plan-view optical micrograph of a c-plane ammonothermal GaN layer that has been subjected to defect-selective etching, showing a low concentration of etch pits in the window region above slit-shaped mask openings oriented along a <10-10> direction and a linear array of etch pits (threading dislocations) at coalescence fronts formed approximately midway between two window regions, according to an embodiment of the present disclosure.

A patterned, trenched c-plane-oriented bulk GaN substrate was prepared by a similar procedure as that described in Example 5, except that a higher power was used for the laser so that slots were formed that fully penetrated the substrate. After etching with concentrated $H_3PO_4$ at approximately 280 degrees Celsius for approximately 30 minutes, the width of the slots was approximately 115 micrometers. The patterned substrates were placed in a silver capsule along with a 15%-open-area baffle, polycrystalline GaN nutrient, $NH_4F$ mineralizer, and ammonia, and the capsule was sealed. The ratios of GaN nutrient and $NH_4F$ mineralizer to ammonia were approximately 1.74 and 0.099 respectively, by weight. The capsule was placed in an internally-heated high pressure apparatus and heated to temperatures of approximately 667 degrees Celsius for the upper, nutrient zone and approximately 681 degrees Celsius for the lower, crystal growth zone, maintained at these temperatures for approximately 500 hours, and then cooled and removed. Ammonothermal GaN filled in most of the volume in the trenches of the trenched substrate, grew through the linear openings in the patterned mask on the HVPE GaN substrate, grew laterally, and coalesced fully, forming an ammonothermal GaN layer approximately 2010 micrometers thick with a smooth top surface. The surface of the ammonothermal GaN layer was lightly etched and was examined by optical microscopy. An optical micrograph of the layer is shown in FIG. 16. The etch pits in the rectangles A, B, C, D, E, F, and G shown in FIG. 16 were counted, leading to a determination that the average etch pit density, which is believed to accurately represent the threading dislocation density, of the ammonothermal GaN layer grown on the patterned, laser-trenched substrate, was approximately $6.0 \times 10^3$ $cm^{-2}$.

Example 7

Four c-plane-oriented bulk GaN seed crystals were laser-cut from three 100 mm diameter bulk GaN wafers such that linear cut edges were approximately a-planes, similar to the configuration shown in FIG. 17E. A 100-nanometer-thick layer of TiW was sputter-deposited as an adhesion layer on the (000-1) N-face of the seed crystals, followed by a 2.6-micrometer-thick layer comprising Ag. A pattern was formed on the N-face of the seed crystals using a frequency-doubled YAG laser with nano-second pulses. The pattern comprised domains of m-trenches, with linear openings oriented parallel to <10-10>, forming a triangular pattern. The four tiles were placed on a flat Mo backing plate within a Mo alignment ring such that the linear tile edges and the offcut directions were aligned. An Ag circular ring gasket and a Mo circular ring clamp were placed over the seed crystals and clamped to the backing plate using four Mo bolts, securing the seed crystals, similar to the configuration shown in FIG. 18D. Four additional Mo bolts were installed through holes in the two larger seed crystals to secure the latter to the backing plate and reduce tile bow. The assembled fixture had an exposed circular tile area with a diameter of approximately 5.3 inches. The assembled fixture was placed in a silver capsule along with a 7%-open-area baffle, polycrystalline GaN nutrient, $NH_4F$ mineralizer, and ammonia, and the capsule was sealed. The ratios of GaN nutrient and $NH_4F$ mineralizer to ammonia were approximately 2.53 and 0.094 respectively, by weight. The capsule was placed in an internally-heated high pressure apparatus and heated to temperatures of approximately 667 degrees Celsius for the upper, nutrient zone and approximately 680 degrees Celsius for the lower, crystal growth zone, maintained at these temperatures for approximately 500 hours, and then cooled and removed. Ammonothermal GaN grew through the linear openings in the patterned mask on the seed crystals, grew laterally, and coalesced between patterned trenches and between seed crystals, forming an ammonothermal GaN layer approximately 2600 micrometers thick with a circular diameter of approximately 5.3 inches and comprising four domains. X-ray diffraction measurements performed across tiled interfaces after growth indicated approximately 0.2 degree crystallographic misorientation between adjacent tiled domains.

Example 8

Four c-plane-oriented bulk GaN seed crystals are laser cut from three 100 mm diameter bulk GaN wafers such that linear cut edges are approximately a-planes, similar to the configuration shown in FIG. 17E. A 200-nanometer-thick layer of AlN is sputtered on the (0001) Ga-face of the seed crystals. A Mo susceptor, comprising a backing plate and an alignment ring, is sprayed with very fine BN particles suspected in a volatile organic carrier, forming a release layer. The four seed crystals are placed (000-1) N-face down on the flat Mo susceptor within the Mo alignment ring such that the linear tile edges and the offcut directions are aligned accurately. The susceptor is placed horizontally in a poly-GaN reactor and a conformal polycrystalline GaN layer with a thickness of approximately 1 mm is grown, forming a continuous polycrystalline GaN handle on the (0001) Ga-faces of the four seed crystals. After the polycrystalline GaN growth is completed and the reactor cooled, the susceptor is removed from the poly-GaN reactor with the seed crystals and polycrystalline GaN intact. The seed crystals, embedded in the polycrystalline GaN matrix, are then separated from the Mo backing plate by separation at the release layer. A frequency-doubled YAG laser with nano-second pulses trims the edges of the tiled composite structure, forming a circular tiled composite with a diameter of approximately 5.3 inches. The large area exposed polycrystalline GaN handle and (000-1) N-face surfaces undergo grinding, polishing, and chemical mechanical polishing. A 100-nanometer-thick layer of TiW is sputter-deposited as an adhesion layer on the (000-1) N-face of the seed crystals, followed by a 1.3-micrometer-thick layer comprising Ag. Six-micrometer-thick Au layers are then electroplated on the (000-1) N-face of the seed crystals and the exposed polycrystalline GaN handle surface. A pattern is formed on the N-face of the tile pieces using a frequency-doubled YAG laser with nano-second pulses. The pattern comprises domains of m-trenches, with linear openings oriented parallel to <10-10>, forming a triangular pattern. The patterned, tiled composited structure is then placed in a silver capsule along with a 15%-open-area baffle, polycrystalline GaN nutrient, $NH_4F$ mineralizer, and ammonia, and the capsule is sealed. The ratios of GaN nutrient and $NH_4F$ mineralizer to ammonia are approximately 1.74 and 0.099 respectively, by weight. The capsule is placed in an internally-heated high pressure apparatus and heated to temperatures of approximately 667 degrees Celsius for the upper, nutrient zone and approximately 681 degrees Celsius for the lower, crystal growth zone, maintained at these temperatures for approximately 500 hours, and then cooled and removed. Ammonothermal GaN grows through the linear openings in the patterned mask on the seed crystals, grows laterally, and coalesces between patterned trenches and between tile pieces, forming an ammonothermal GaN layer approximately 3000 micrometers thick.

Example 9

A tiled composite structure similar to that described in Example 8 is prepared, except that 38 seed crystals having a (30-3-1) orientation, dimensions of 10 millimeters in a direction parallel to a c-axis projection by 20 millimeters in an m-direction, and a thickness of 300 micrometers, are used. The edges of the seed crystals comprising the perimeter of the array are laser-trimmed to a 95-millimeter-diameter circle prior to placing the seed crystals, (30-3-1) side down, on the Mo susceptor. After deposition of a 1-millimeter thick polycrystalline GaN matrix on the (30-31) sides of the seed crystals and the susceptor, the tiled composite structure is removed from the susceptor by separation at the release layer. The perimeter of the tiled composite structure is ground to a diameter of 100 millimeters, and a flat parallel to a m-plane of the seed crystals is ground on one edge. The back side of the tiled composite structure is then ground, using a 1000-grit grind wheel followed by a 4800-grit grind wheel, to form a flat surface that is accurately parallel to the front surface. The front side of the tiled composite structure is then chemical-mechanically polished, removing approximately 15 micrometers of material, producing a tiled composite substrate with a thickness of 600 micrometers that resembles the substrate shown in FIG. 19G.

The tiled composite substrate is then placed on a susceptor in a commercial MOCVD reactor. An n-type GaN layer is deposited, followed by an InGaN strained-layer-superlattice release layer, followed by another n-type GaN layer, followed by an n-type InGaN cladding layer, followed by an undoped InGaN multiple quantum well, followed by a p-type cladding layer, followed by a p-type layer and a p-contact layer. Trenches are then formed by conventional lithography, forming mesas approximately 1200 micrometers long along a projection of the c-direction in the (30-3-1) surface and 100 micrometers wide along an orthogonal m direction. Approximately 95% of the release layers are etched away by a photoelectrochemical process, using a KOH solution and 405 nanometer illumination. A gold-containing adhesion layer is then deposited on the p-contact layers and the mesa structures are transferred by a sequential process to a silicon carbide handle substrate by means of a thermocompression bond, followed by fracture of the unremoved release layer. After removal of the mesa structures, the surface of the tiled composite substrate is re-prepared by chemical-mechanical polishing.

While the foregoing is directed to embodiments of the present disclosure, other and further embodiments of the disclosure may be devised without departing from the basic scope thereof, and the scope thereof is determined by the claims that follow.

What is claimed is:

1. A free-standing group III metal nitride substrate comprising at least two crystals, each of the at least two crystals comprising:
   a group III metal selected from gallium, aluminum, and indium, or combinations thereof, and nitrogen, wherein:
   each of the at least two crystals having a wurtzite crystal structure comprises a first surface having a maximum dimension greater than 10 millimeters in a first direction and a maximum dimension greater than 4 millimeters in a second direction orthogonal to the first direction, an average concentration of threading dislocations between $10^2$ cm$^{-2}$ and $1\times10^6$ cm$^{-2}$, an average concentration of stacking faults below $10^3$ cm$^{-1}$, a symmetric x-ray rocking curve full width at half maximum less than 200 arcsec,
   the magnitudes of a crystallographic miscut of the first surfaces of each of the at least two crystals are equal, to within 0.5 degree, the directions of crystallographic miscuts of the first surfaces of each of the at least two crystals are equal, to within 10 degrees, each of the at least two crystals is bonded to a matrix member comprising polycrystalline GaN that is textured in a c-direction, and a polar misorientation angle γ between a first surface of a first crystal of the at least two crystals and a first surface of a second crystal of the at least two crystals is greater than about 0.005 degrees and less than about 0.2 degrees and misorientation angles α and β are greater than about 0.01 degrees and less than about 1 degree.

2. The free-standing group III metal nitride substrate of claim 1, wherein the free-standing group III metal nitride substrate has a maximum dimension in the first direction greater than 40 millimeters.

3. The free-standing group III metal nitride substrate of claim 2, wherein the magnitude of the crystallographic miscut of the first surfaces of each of the at least two crystals is equal, to within 0.2 degree and the directions of the crystallographic miscuts of the first surfaces of each of the at least two crystals is equal, to within 2 degrees.

4. The free-standing group III metal nitride substrate of claim 2, wherein each of the first surfaces has a crystallographic orientation that is within 5 degrees of an orientation selected from {20-2±1}, {30-3±1}, and {10-10} and a miscut in the a-direction that is less than 0.5 degree.

5. The free-standing group III metal nitride substrate of claim 4, wherein each of the first surfaces has a crystallographic orientation that is within 1 degree of an orientation selected from {20-2±1}, {30-3±1}, and {10-10} and a miscut in the a-direction that is less than 0.1 degree.

6. The free-standing group III metal nitride substrate of claim 2, wherein the maximum dimension in the first direction is between 45 and 110 millimeters.

7. The free-standing group III metal nitride substrate of claim 2, wherein the free-standing group III metal nitride substrate further comprises:
a thickness is between about 150 micrometers and about 2 millimeters,
a total thickness variation is less than about 25 micrometers, and
a macroscopic bow is less than about 50 micrometers.

8. The free-standing group III metal nitride crystal of claim 1, wherein a gap is formed between adjacent edges of each of the at least two crystals, the gap being at least partially filled by the matrix member.

9. The free-standing group III metal nitride crystal of claim 1, wherein the first surface of each of the crystals of the at least two crystals has a crystallographic orientation within 5 degrees of a semipolar orientation selected from {6 0-6 ±1}, {5 0-5 ±1}, {4 0-4 ±1}, {3 0-3±1}, {5 0-5 ±2}, {7 0-7 ±3}, {2 0-2±1}, {3 0-3±2}, {4 0-4 ±3}, {5 0-5 ±4}, {1 0-1±1}, {1 0-1±2}, {1 0-1±3}, {2 1-3±1}, and {3 0-3±4}.

10. The free-standing group III metal nitride crystal of claim 1, wherein the first surface has impurity concentrations of:
oxygen (O) between $1 \times 10^{16}$ cm$^{-3}$ and $1 \times 10^{19}$ cm$^{-3}$,
hydrogen (H) between $1 \times 10^{16}$ cm$^{-3}$ and $2 \times 10^{19}$ cm$^{-3}$, and
at least one of fluorine (F) and chlorine (Cl) between $1 \times 10^{15}$ cm$^{-3}$ and $1 \times 10^{19}$ cm$^{-3}$.

11. The free-standing group III metal nitride crystal of claim 1, further comprising an interfacial layer at an interface between at least one crystal of the at least two crystals and the matrix member.

12. The free-standing group III metal nitride crystal of claim 11, wherein the interfacial layer comprises at least one of graphite, boron nitride, molybdenum disulfide, and tungsten disulfide.

13. The free-standing group III metal nitride crystal of claim 1, wherein the first surfaces of each of the crystals of the at least two crystals are substantially parallel to a first plane.

14. The free-standing group III metal nitride crystal of claim 1, wherein the matrix member has a diameter that is greater than 40 mm.

15. The free-standing group III metal nitride crystal of claim 1, wherein the matrix member further comprises a porous member.

16. The free-standing group III metal nitride crystal of claim 15, wherein the porous member comprises at least one of graphite, carbon fiber, silica fiber, aluminosilicate fiber, borosilicate fiber, a silicon carbide coating, a pyrolytic boron nitride coating, or a pyrolytic graphite coating.

17. A free-standing group III metal nitride substrate comprising at least two crystals, each of the at least two crystals comprising:
a group III metal selected from gallium, aluminum, and indium, or combinations thereof, and nitrogen, wherein:
each of the at least two crystals having a wurtzite crystal structure comprises a first surface, an average concentration of threading dislocations between $10^2$ cm$^{-2}$ and $1 \times 10^6$ cm$^{-2}$, an average concentration of stacking faults below $10^3$ cm$^{-1}$, a symmetric x-ray rocking curve full width at half maximum less than 200 arcsec,
each of the first surfaces has a crystallographic orientation that is within 5 degrees of an orientation selected from {20-2±1}, {30-3±1}, and {10-10} and a miscut in the a-direction that is less than 0.5 degree;
the magnitudes of a crystallographic miscut of the first surfaces of each of the at least two crystals are equal, to within 0.2 degree,
the directions of crystallographic miscuts of the first surfaces of each of the at least two crystals are equal, to within 2 degrees,
each of the at least two crystals is bonded to a matrix member comprising polycrystalline GaN, and
a polar misorientation angle γ between a first surface of a first crystal of the at least two crystals and a first surface of a second crystal of the at least two crystals is greater than about 0.005 degrees and less than about 0.2 degrees and misorientation angles α and β are greater than about 0.01 degrees and less than about 1 degree.

18. The free-standing group III metal nitride substrate of claim 17, wherein each of the first surfaces has a crystallographic orientation that is within 1 degree of an orientation selected from {20-2±1}, {30-3±1}, and {10-10} and a miscut in the a-direction that is less than 0.1 degree.

* * * * *